(12) United States Patent
Lee et al.

(10) Patent No.: US 12,349,418 B2
(45) Date of Patent: Jul. 1, 2025

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Wei-Ju Lee, Kaohsiung (TW); Chun-Fu Cheng, Hsinchu County (TW); Chung-Wei Wu, Hsinchu County (TW); Zhiqiang Wu, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 354 days.

(21) Appl. No.: 17/962,327

(22) Filed: Oct. 7, 2022

(65) Prior Publication Data

US 2023/0030571 A1 Feb. 2, 2023

Related U.S. Application Data

(62) Division of application No. 16/667,615, filed on Oct. 29, 2019, now Pat. No. 11,469,332.

(51) Int. Cl.
| | |
|---|---|
| *H10D 62/83* | (2025.01) |
| *H10D 30/01* | (2025.01) |
| *H10D 30/67* | (2025.01) |
| *H10D 62/10* | (2025.01) |
| *H10D 62/17* | (2025.01) |

(52) U.S. Cl.
CPC ....... *H10D 30/6757* (2025.01); *H10D 30/031* (2025.01); *H10D 30/6729* (2025.01); *H10D 30/6735* (2025.01); *H10D 62/121* (2025.01); *H10D 62/235* (2025.01)

(58) Field of Classification Search
None
See application file for complete search history.

(56) References Cited

U.S. PATENT DOCUMENTS

| | | | |
|---|---|---|---|
| 2012/0091528 A1* | 4/2012 | Chang | H01L 29/0642 257/E21.409 |
| 2014/0231872 A1 | 8/2014 | Colinge et al. | |
| 2015/0028426 A1 | 1/2015 | Ching et al. | |

(Continued)

*Primary Examiner* — Joseph C. Nicely
*Assistant Examiner* — Lamont B Koo
(74) *Attorney, Agent, or Firm* — Maschoff Brennan

(57) ABSTRACT

A method includes forming a plurality of first semiconductor layers and a plurality of second semiconductor layers in an alternate manner over a substrate; patterning the first and second semiconductor layers and the substrate to form a fin structure, in which the fin structure includes a base portion protruding from the substrate and remaining portions of the first and second semiconductor layers; etching the fin structure to form a first recess extending through the remaining portions of the first and second semiconductor layers and into the base portion; epitaxially growing a first epitaxy layer in the first recess; epitaxially growing a second epitaxy layer over the first epitaxy layer; oxidizing the first epitaxy layer, wherein the second epitaxy layer remains unoxidized after the first epitaxy layer is oxidized; and after oxidizing the first epitaxy layer, forming a source/drain epitaxy structure on the second epitaxy layer.

20 Claims, 73 Drawing Sheets

(56) References Cited

U.S. PATENT DOCUMENTS

| | | |
|---|---|---|
| 2016/0035849 A1 | 2/2016 | Ching et al. |
| 2017/0338322 A1* | 11/2017 | Cheng ................ H10D 84/0167 |
| 2020/0212038 A1 | 7/2020 | Rachmady et al. |
| 2020/0294969 A1 | 9/2020 | Rachmady et al. |

* cited by examiner

SEMICONDUCTOR DEVICE AND MANUFACTURING METHOD THEREOF

CROSS-REFERENCE TO RELATED APPLICATION

The present application is a Divisional application of U.S. application Ser. No. 16/667,615, filed on Oct. 29, 2019, now U.S. Pat. No. 11,469,332, issued on Oct. 11, 2022, which is herein incorporated by reference.

BACKGROUND

The electronics industry has experienced an ever increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far, these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
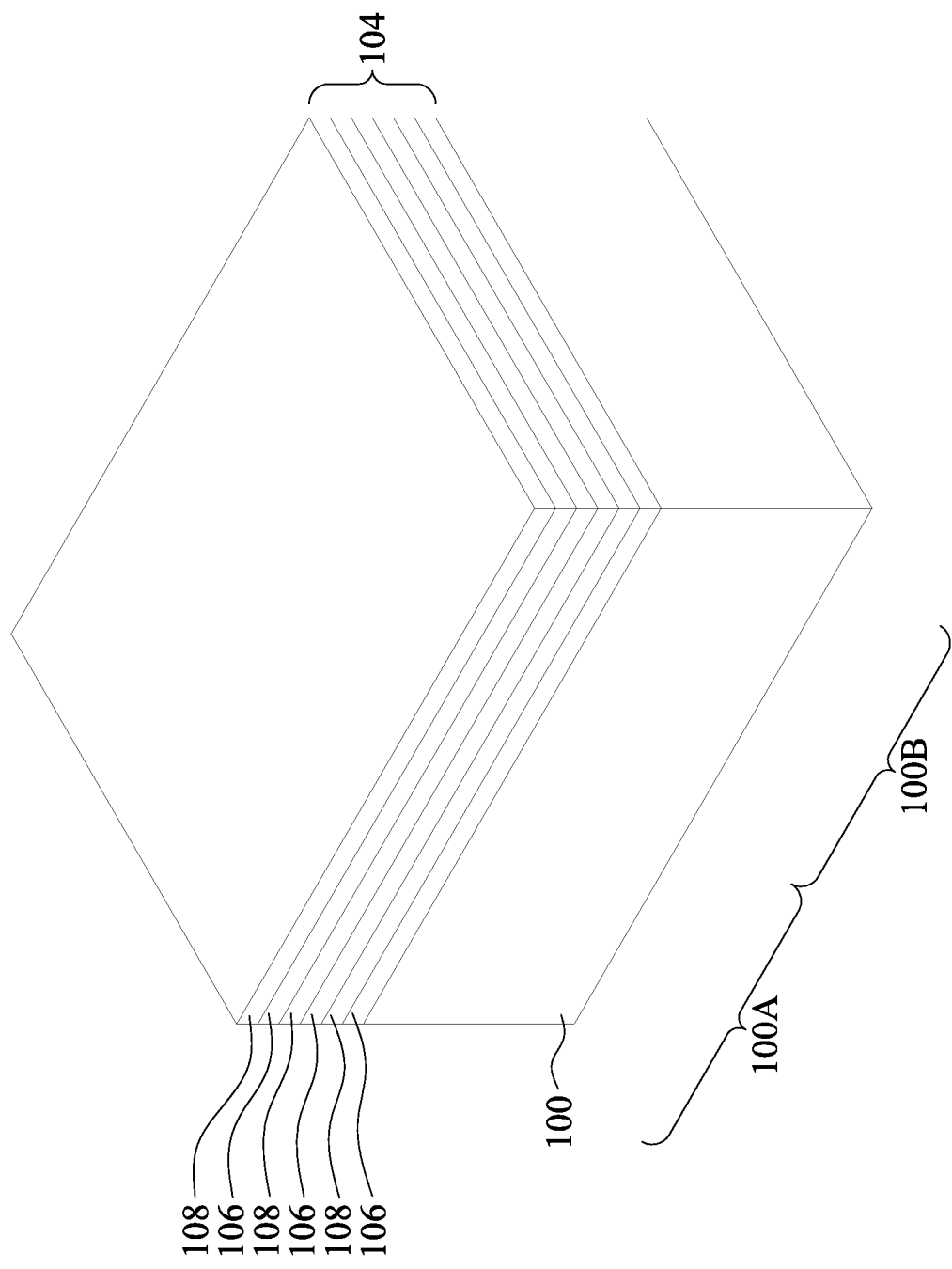
FIGS. 1 to 37C illustrate a semiconductor device at various stages of manufacturing in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA transistor structures.

FIGS. 1 to 37C illustrate a semiconductor device at various stages of manufacturing in accordance with some embodiments of the present disclosure. As with the other exemplary methods and exemplary devices discussed herein, it is understood that parts of the semiconductor device may be fabricated by a CMOS technology process flow, and thus some processes are only briefly described herein. Further, the exemplary semiconductor devices may include various other devices and features, such as other types of devices such as additional transistors, bipolar junction transistors, resistors, capacitors, inductors, diodes, fuses, static random access memory (SRAM) and/or other logic circuits, etc., but is simplified for a better understanding of the inventive concepts of the present disclosure. In some embodiments, the exemplary devices include a plurality of semiconductor devices (e.g., transistors), including p-type field effect transistors (PFETs), n-type field effect transistors (NFETs), etc., which may be interconnected.

Reference is made to FIG. 1. A semiconductor stack 104 is formed over a substrate 100. The substrate 100 includes a first region 100A and a second region 100B. In some embodiments, devices having different conductivity types will be formed respectively on the first region 100A and the second region 100B. For example, an N-type transistor will be formed within the first region 100A, and a P-type transistor will be formed within the second region 100B, which will be discussed in detail later.

In some embodiments, the substrate 100 may be a semiconductor substrate such as a silicon substrate. In some embodiments, the substrate 100 may include various layers, including conductive or insulating layers formed on a semiconductor substrate. The suitable doping may include ion implantation of dopants and/or diffusion processes. In some embodiments, the substrate 100 may also include other semiconductors such as germanium, silicon carbide (SiC), silicon germanium (SiGe), or diamond. In some embodiments, the substrate 100 may include a compound semiconductor and/or an alloy semiconductor. In some embodiments, the substrate 100 may optionally include an epitaxial layer (epi-layer), may be strained for performance enhancement, may include a silicon-on-insulator (SOI) structure, and/or have other suitable enhancement features.

The semiconductor stack 104 includes first semiconductor layers 106 of a first composition interposed by second semiconductor layers 108 of a second composition different than the first composition. That is, the first semiconductor layers 106 and the second semiconductor layers 108 are arranged in an alternate manner. In some embodiments, the first semiconductor layers 106 are silicon germanium (SiGe) and the second semiconductor layers 108 are silicon (Si). In some embodiments, the first semiconductor layers 106 and the second semiconductor layers 108 have different oxidation rates and/or etch selectivity. For example, the first semiconductor layers 106 include SiGe and the second semiconductor layers 108 include Si, and the Si oxidation rate of the second semiconductor layers 108 is less than the SiGe oxidation rate of the first semiconductor layers 106. In some embodiments, the first semiconductor layers 106 are $Si_xGe_{1-x}$ and the second semiconductor layers 108 are $Si_yGe_{1-y}$, in which y>x.

The second semiconductor layers 108 or portions thereof may form a channel region of a semiconductor device. In some embodiments, the second semiconductor layers 108 may be referred to as "nanosheets" or "nanowires" used to form a channel region of a semiconductor device such as a GAA transistor. The use of the second semiconductor layers 108 to define a channel or channels of the semiconductor device is further provided below.

It is noted that three first semiconductor layers 106 and three second semiconductor layers 108 are illustrated in FIG. 1, and this is for illustrative purpose and not intended to be limiting. It can be appreciated that any number of semiconductor layers can be formed in the semiconductor stack 104, depending on the desired number of channels regions for the GAA transistor. In some embodiments, the number of second semiconductor layers 108 is in a range from about 2 to about 10.

In some embodiments, the first semiconductor layers 106 are substantially uniform in thickness. In some embodiments, the second semiconductor layers 108 are substantially uniform in thickness. As described in more detail below, the second semiconductor layers 108 may serve as one or more channel region(s) for a subsequently-formed GAA transistor and their thicknesses are chosen based on device performance considerations. The first semiconductor layers 106 may be used to define spacing between neighboring second semiconductor layers 108, which will be filled up with a high-k metal gate (HKMG) structure. Therefore, the thicknesses of the second semiconductor layers 108 may depend on the gap-fill ability of deposition techniques for depositing materials of the HKMG structure (e.g., high-k dielectric material, work function metal and so on).

In some embodiments, epitaxial growth of the layers of the semiconductor stack 104 may be performed by a molecular beam epitaxy (MBE) process, a metalorganic chemical vapor deposition (MOCVD) process, and/or other suitable epitaxial growth processes. In some embodiments, the epitaxially grown layers (e.g., the first semiconductor layers 106 and the second semiconductor layers 108) include the same material as the substrate 100. In some embodiments, the epitaxially grown layers (e.g., the first semiconductor layers 106 and the second semiconductor layers 108) include a different material than the substrate 100. As stated above, in some examples, the first semiconductor layers 106 include at least one epitaxially grown silicon germanium (SiGe) layer and the second semiconductor layers 108 include at least one epitaxially grown silicon (Si) layer. In some embodiments, either of the first semiconductor layers 106 and the second semiconductor layers 108 may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. As discussed, the materials of the first semiconductor layers 106 and the second semiconductor layers 108 may be chosen to provide differing oxidation and/or different etch selectivity properties. In some embodiments, the first semiconductor layers 106 and the second semiconductor layers 108 are substantially dopant-free where, for example, no intentional doping is performed during the epitaxial growth process.

Figure 2:
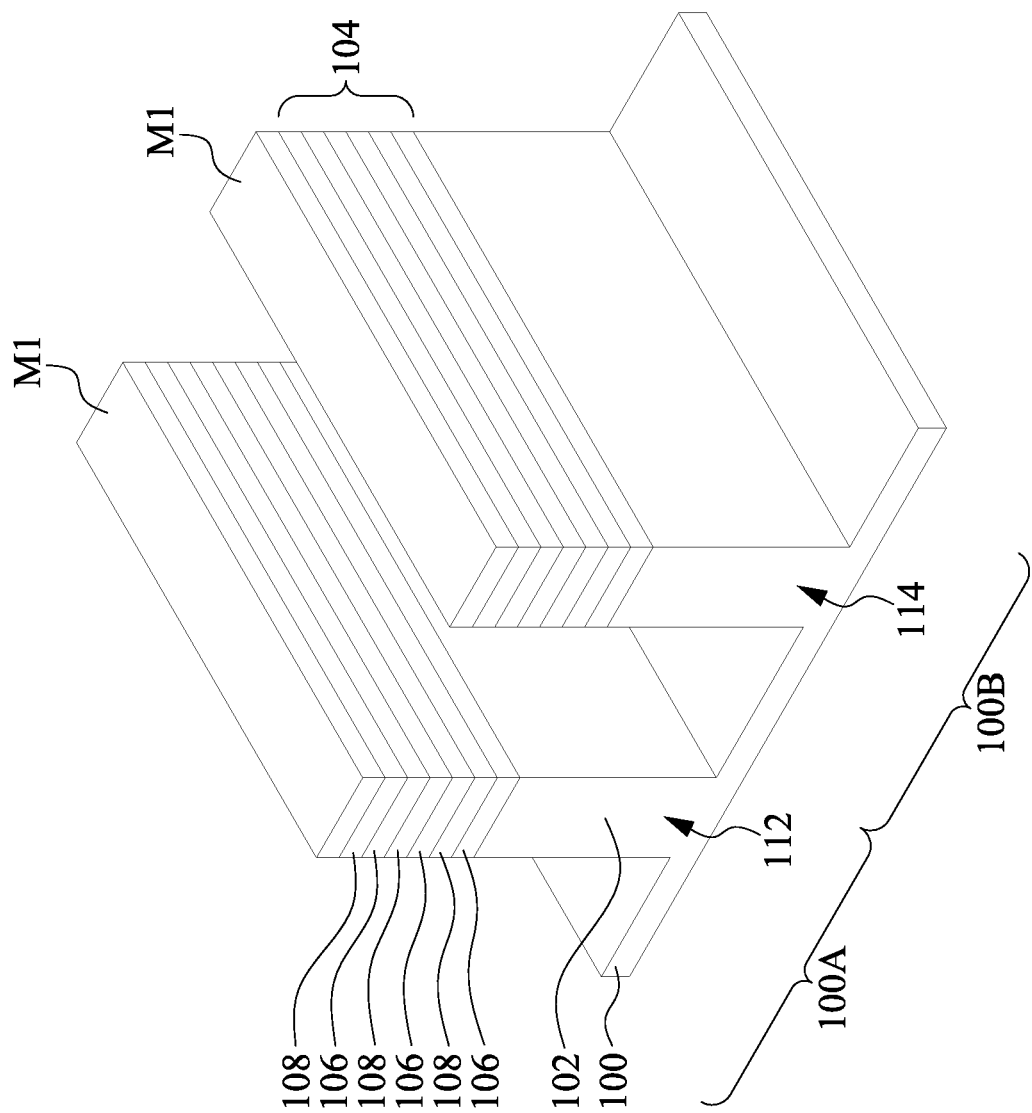

Reference is made to FIG. 2. The semiconductor stack 104 and the substrate 100 are patterned to form a first fin structure 112 and a second fin structure 114. The first fin structure 112 is within the first region 100A of the substrate 100, and the second fin structure 114 is within the first region 100A of the substrate 100. In some embodiments, each of the first fin structure 112 and the second fin structure 114 includes a base portion 102 protruding from the substrate 100, and the first, second semiconductor layers 106, 108 arranged above the base portion 102 in an alternate manner. In some embodiments, the thickness of the base portion 102 is greater than thicknesses of the first semiconductor layers 106 and the second semiconductor layers 108. In some embodiments, the base portion 102 is a protrusion portion of the substrate 100 and thus forms no interface with the substrate 100.

In some embodiments, the first fin structure 112 and the second fin structure 114 may be fabricated using suitable processes including photolithography and etch processes. The photolithography process may include forming a plurality of patterned masks M1 over the substrate 100 that define the positions of the first fin structure 112 and the second fin structure 114. The patterned masks M1 can be formed by, for example, depositing a mask layer over the substrate 100, and patterning the mask layer by suitable photolithography process to form the patterned masks M1. Then, the semiconductor stack 104 and the substrate 100 are etched by using the patterned masks M1 as an etching mask to form the first fin structure 112 and the second fin structure 114. The patterned masks M1 is used to protect regions of the semiconductor stack 104, while an etch process forms trenches in unprotected regions through the mask, thereby leaving the first fin structure 112 and the second fin structure 114. In some embodiments, the trenches may be etched using a dry etch (e.g., reactive ion etching), a wet etch, and/or other suitable processes.

Figure 3:
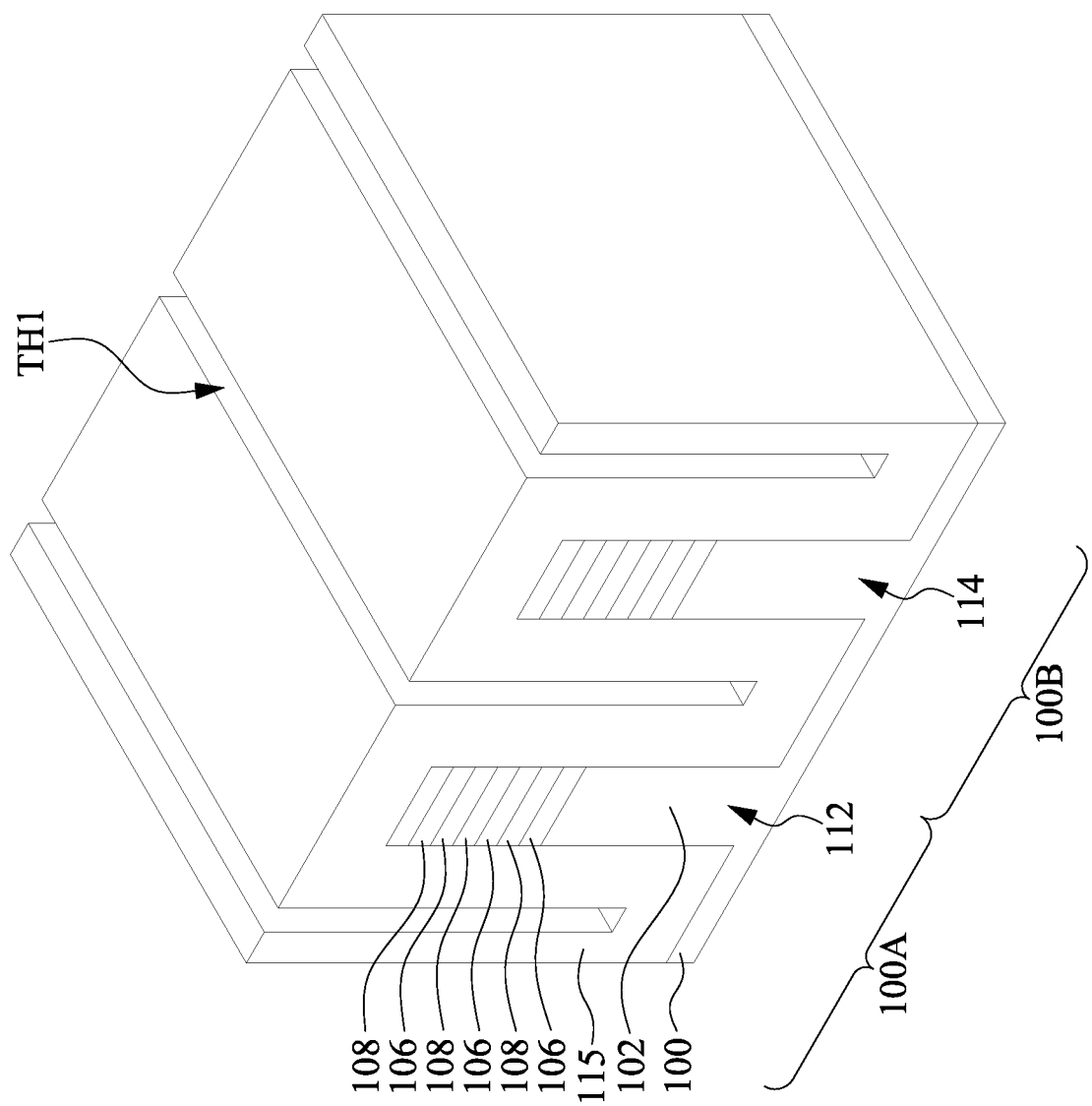

Reference is made to FIG. 3. An isolation layer 115 is deposited over the top surface of the substrate 100 and over top surfaces and sidewalls of the first and second fin structures 112 and 114. In some embodiments, the isolation layer 115 is deposited by an ALD method and its thickness (along the y direction) is controlled so as to provide trenches TH1 between the first and second fin structures 112 and 114. The trenches TH1 will be filled with the dielectric fins 118 (e.g., FIG. 5) in a later fabrication step. The isolation layer 115 can be referred to as shallow trench isolation (STI) features interposing the fin structures 112 and 114. In some embodiments, the isolation layer 115 may include $SiO_2$, $Si_3N_4$, $SiO_xN_y$, fluorine-doped silicate glass (FSG), a low-k dielectric, combinations thereof, and/or other suitable materials.

Figure 4:
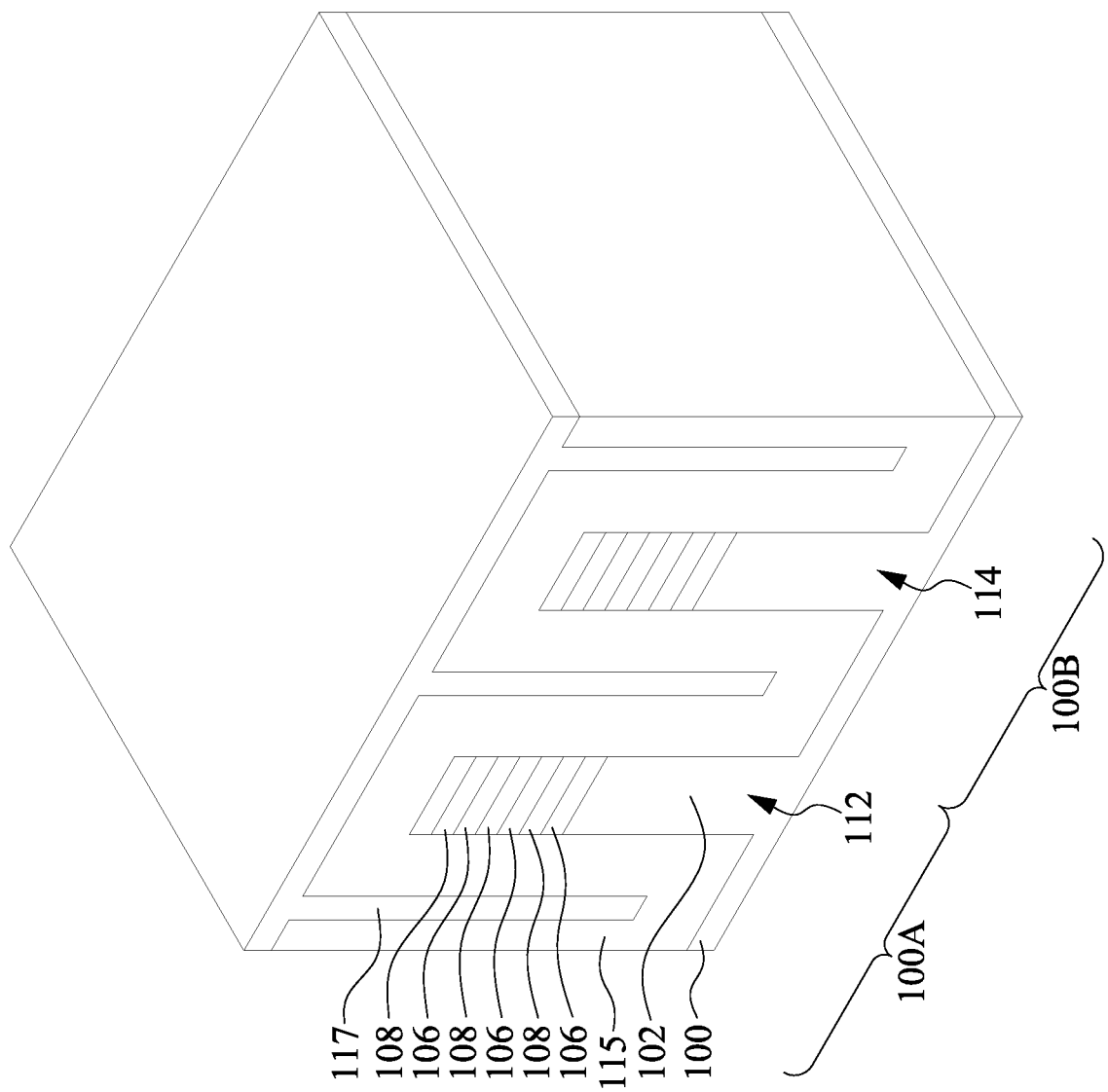

Reference is made to FIG. 4. A dielectric material 117 is deposited over the substrate 100 and the first and second fin structures 112 and 114, and fills the trenches TH1 (FIG. 3). The dielectric material 117 may include silicon carbide nitride (SiCN), silicon oxycarbide nitride (SiOCN), silicon oxycarbide (SiOC), a metal oxide such as hafnium oxide (HfO$_2$) or zirconium oxide (ZrO$_2$), or a combination thereof; and may be deposited using CVD, PVD, or other suitable methods. In some embodiments, the dielectric material 117 and the isolation layer 115 are made of different materials.

Figure 5:
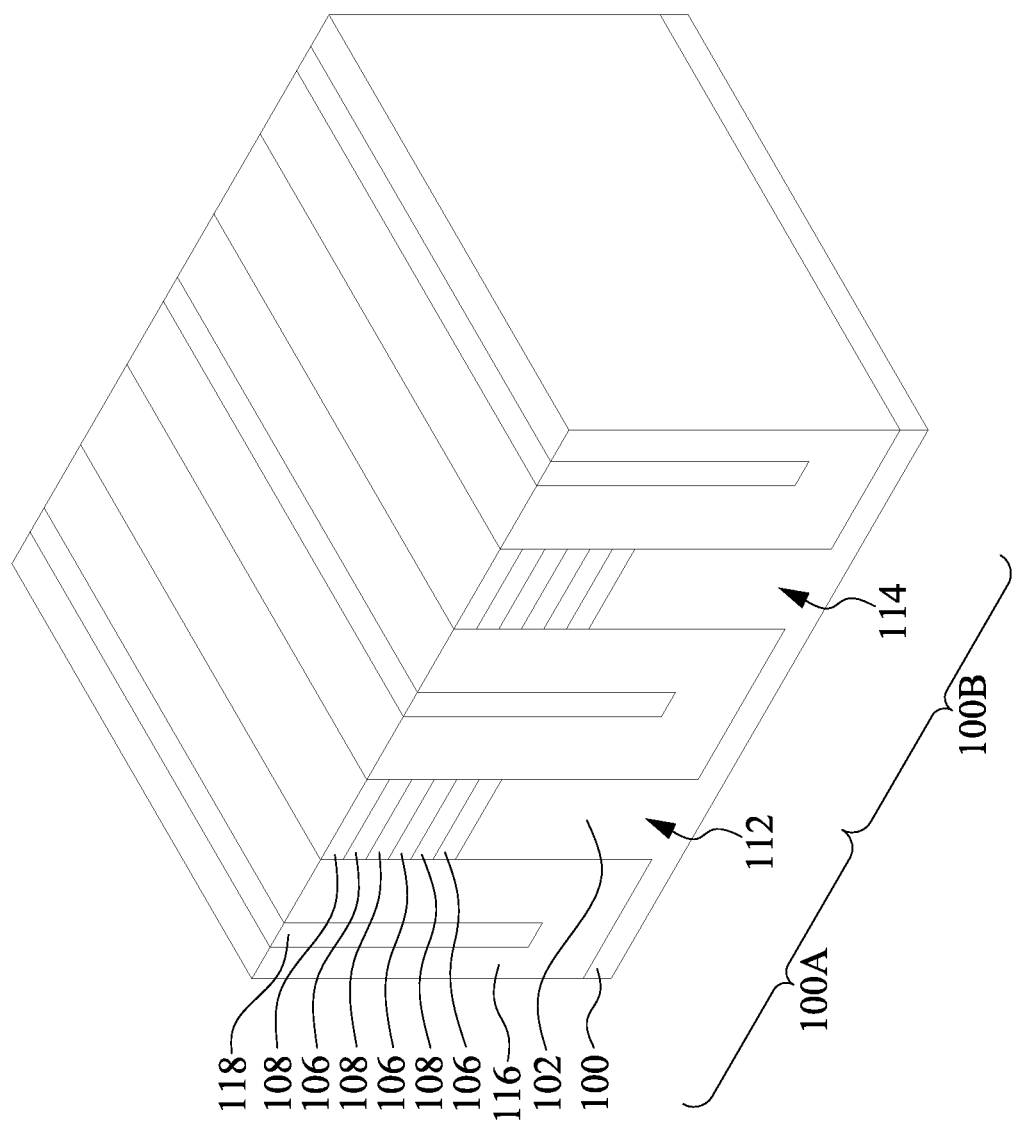

Reference is made to FIG. 5. A chemical mechanical planarization (CMP) process is performed to the isolation layer 115 (FIG. 4) and the dielectric material 117 (FIG. 4) until the top surfaces of the first and second fin structures 112 and 114 are exposed, so as to form a plurality of isolation structures 116 each extending between neighboring fin structures 112 and 114, and a plurality of dielectric fins 118 extending within the respective isolation structures 160. The CMP process is performed to remove excessive isolation layer 115 and excessive dielectric material 117, and the remaining isolation layer 115 and dielectric material 117 are referred to as the isolation structures 116 and dielectric fins 118, respectively. During the CMP process, the patterned masks M1 are removed.

Figure 6:
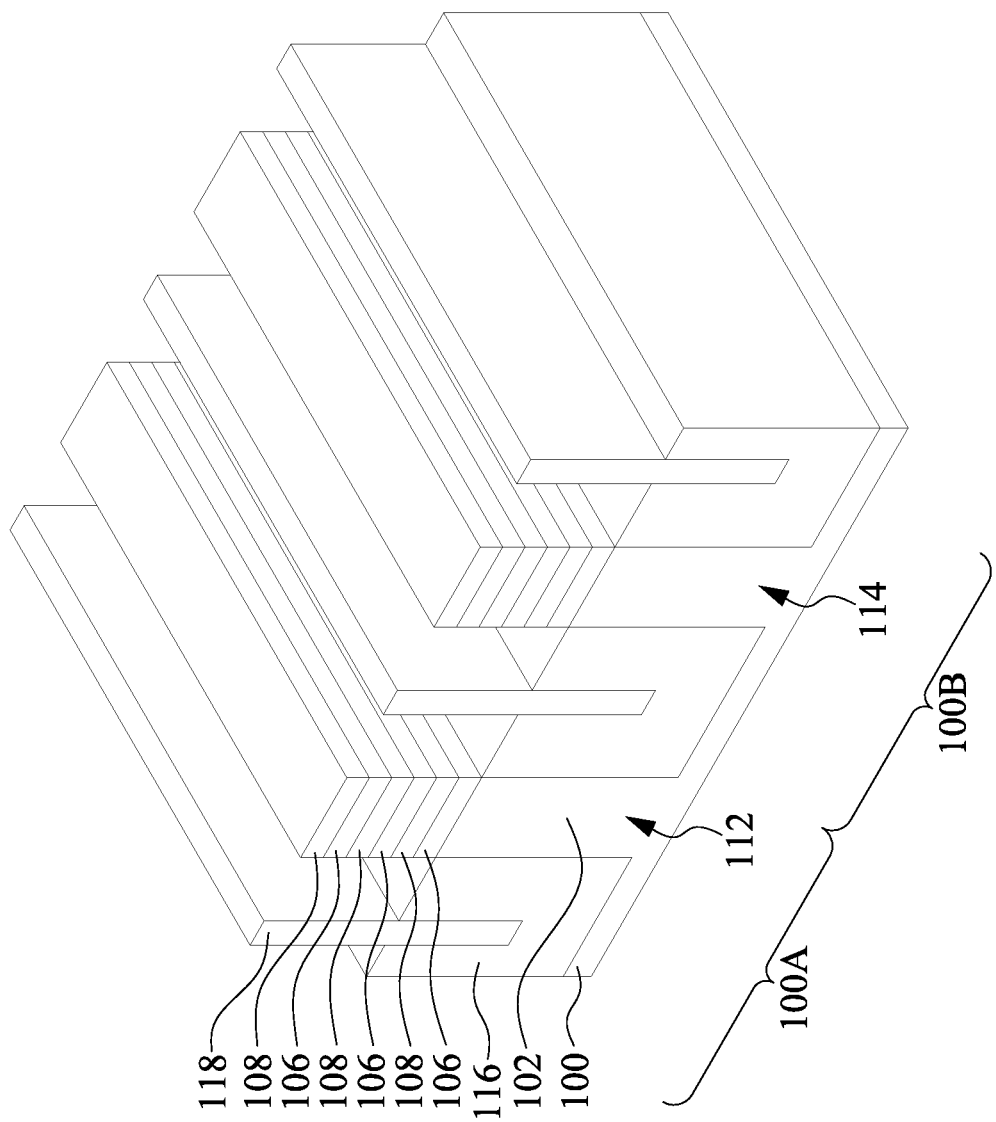

Reference is made to FIG. 6. The isolation structures 116 are etched back. In some embodiments, isolation structures 116 may be etched back by suitable process, such as dry etching, wet etching, or combinations thereof. The etching process is selective to the material of the isolation structures 116 and does not substantially etch the first and second fin structures 112 and 114, and the dielectric fins 118. Stated another way, the etching process uses an etchant that etches the isolation structures 116 at a faster rate than it etches the fin structures 112, 114, and dielectric fins 118. As a result, after the isolation structures 116 are recessed, upper parts of the dielectric fins 118 are protruded from the isolation structures 116.

Figure 7:
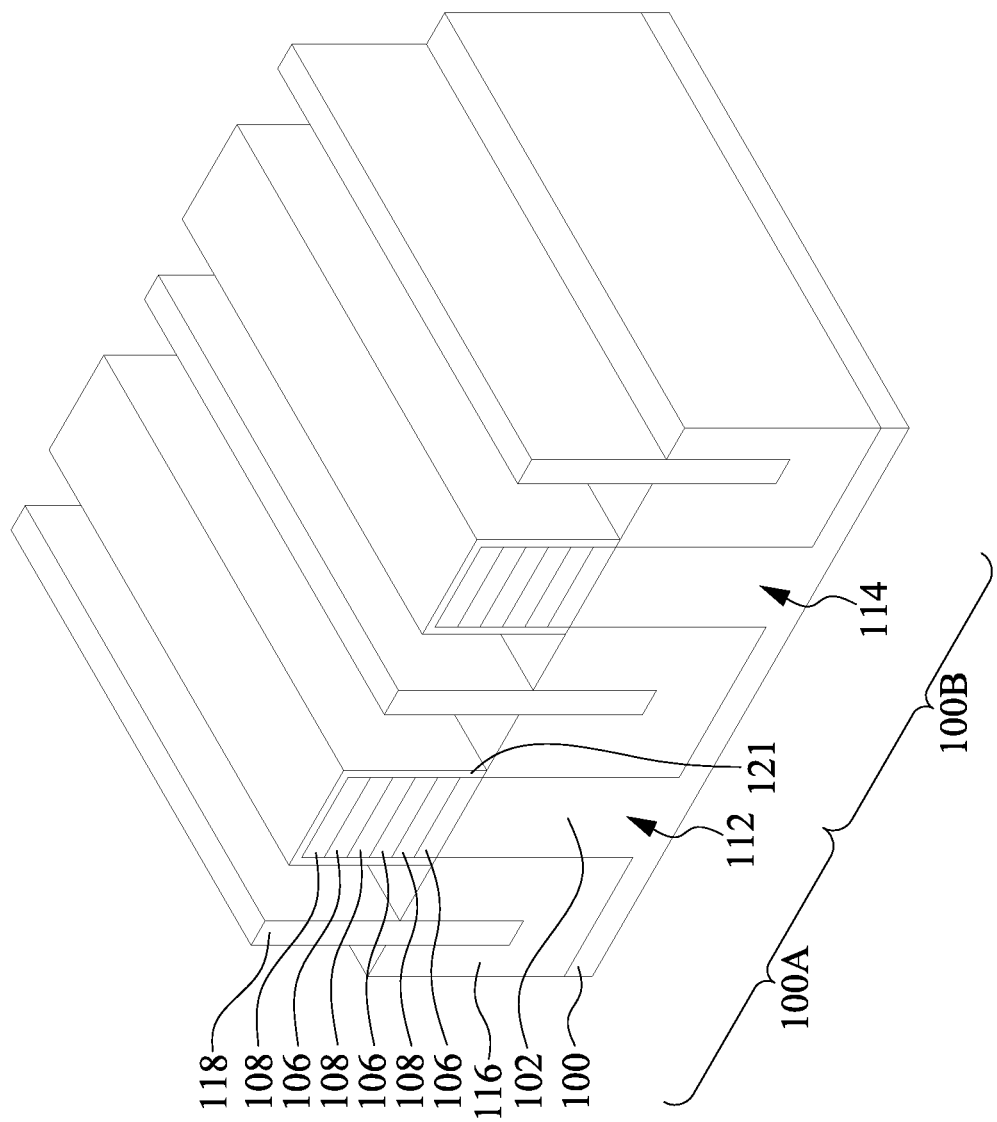

Reference is made to FIG. 7. A gate dielectric layer 121 is formed over the first and second fin structures 112 and 114. In some embodiments, the gate dielectric layer 121 may include SiO$_2$, silicon nitride, a high-K dielectric material or other suitable material. In some embodiments, the gate dielectric layer 121 is formed selectively formed on the first and second fin structures 112 and 114 by using suitable process, such as thermal oxidation. In some other embodiments, the gate dielectric layer 121 may be deposited blanket over the substrate 100 by, for example, a CVD process, a SACVD process, a flowable CVD process, an ALD process, a PVD process, or other suitable process. In the embodiments where the gate dielectric layer 121 is formed using deposition techniques instead of oxidation, the gate dielectric layer 121 will be formed on all exposed surfaces of the fin structure 112, the isolation structures 116, and the dielectric fins 118.

Figure 8:
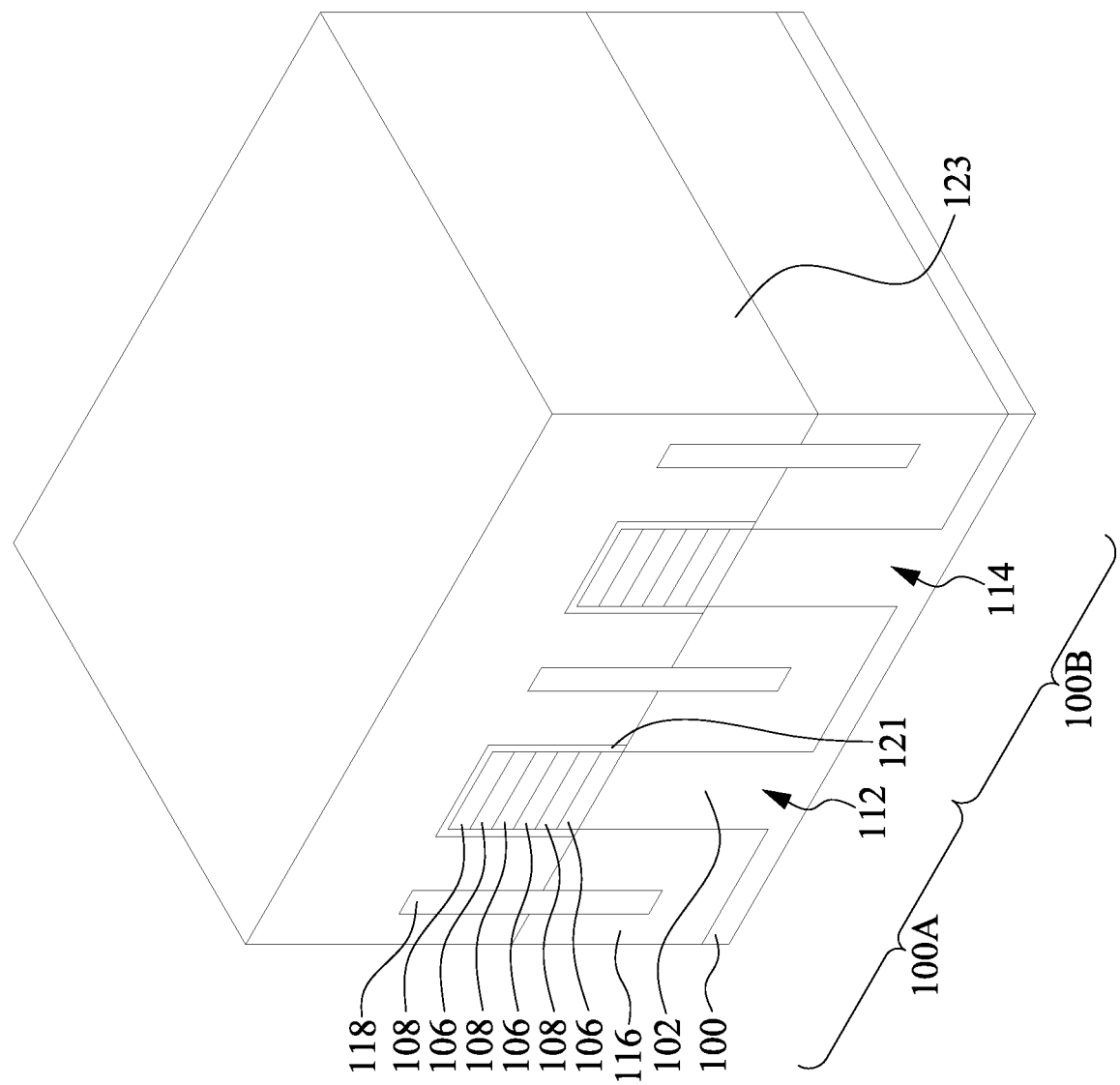

Reference is made to FIG. 8. A dummy gate layer 123 is formed over the gate dielectric layer 121. In some embodiments, the dummy gate layer 123 may include polycrystalline silicon (polysilicon). In some other embodiments, the dummy gate layer 123 may be deposited by, for example, a CVD process, an ALD process, a PVD process, or other suitable process.

Figure 9A:
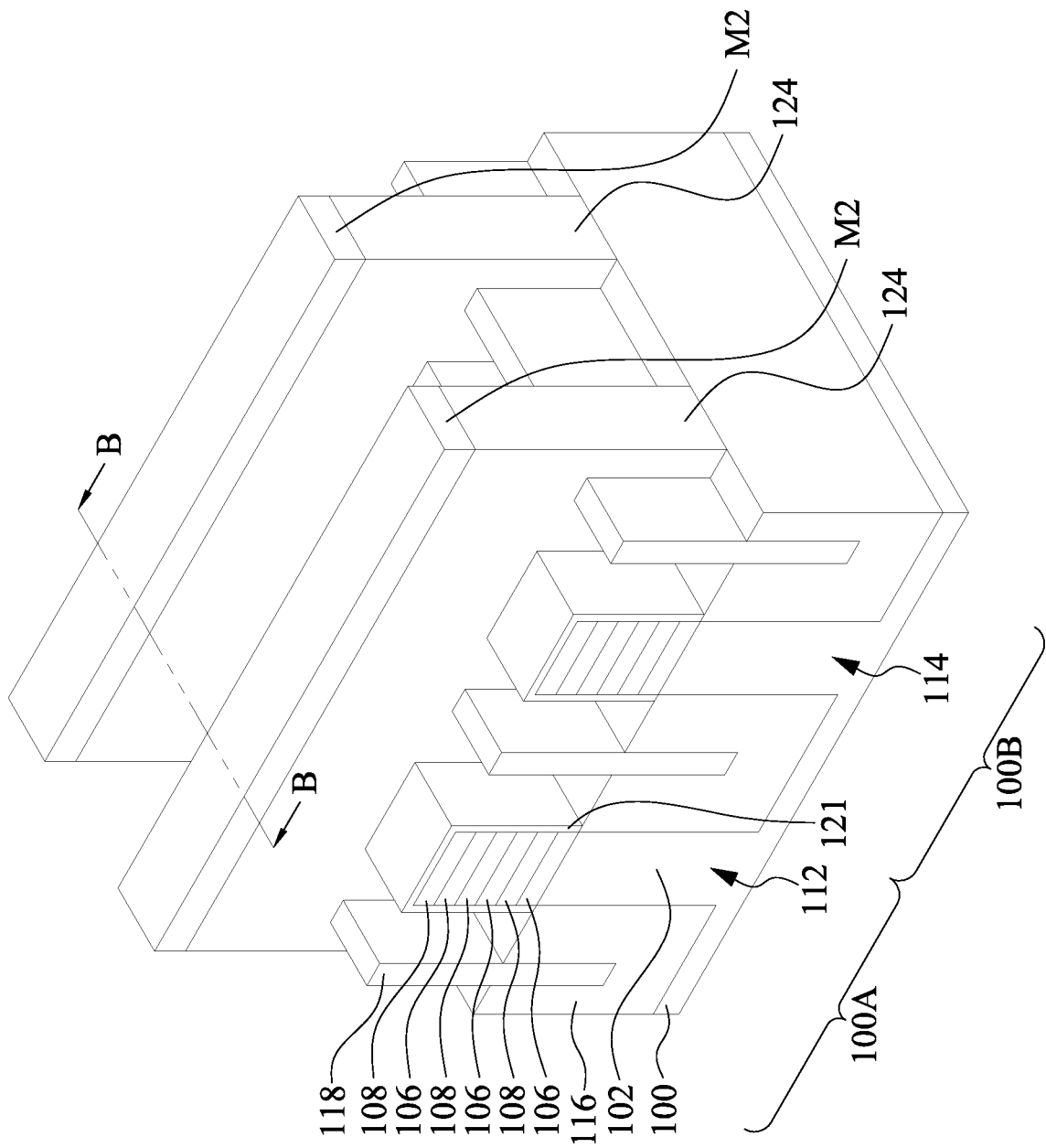
Figure 9B:
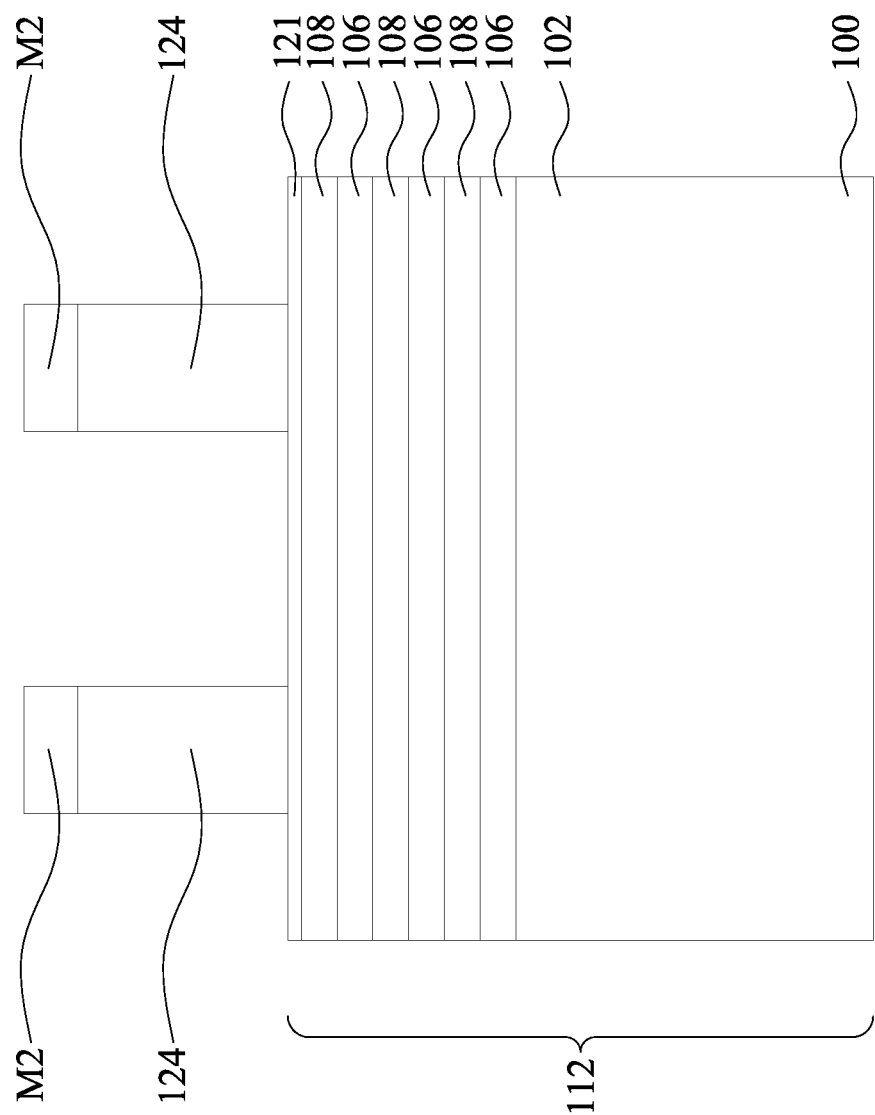

Reference is made to FIGS. 9A and 9B, in which FIG. 9B is a cross-sectional view along line B-B of FIG. 9A. The dummy gate layer 123 (see FIG. 8) is patterned to form a plurality of dummy gate structures 124. In some embodiments, the dummy gate layer 123 may be patterned by, for example, forming a plurality of hard masks M2 over the dummy gate layer 123 that defines the positions of the dummy gate structures 124, followed by an etching process to remove portions of the dummy gate layer 123 exposed by the hard masks M2, and the remaining portions of the dummy gate layer 123 are referred to as dummy gate structures 124. In some embodiments, the etching process has etching selectivity between the gate dielectric layer 121 and the dummy gate layer 123, such that the gate dielectric layer 121 is not substantially etched during the etching process. Stated another way, the gate dielectric layer 121 has higher etching resistance to the etching process than the dummy gate layer 123. While in some other embodiments, the gate dielectric layer 121 and the dummy gate layer 123 does not have significant selectivity to the etching process, and thus the gate dielectric layer 121 and the dummy gate layer 123 are patterned together during the etching process, which in turn results in exposing the fin structures 112 and 114.

Figure 10A:
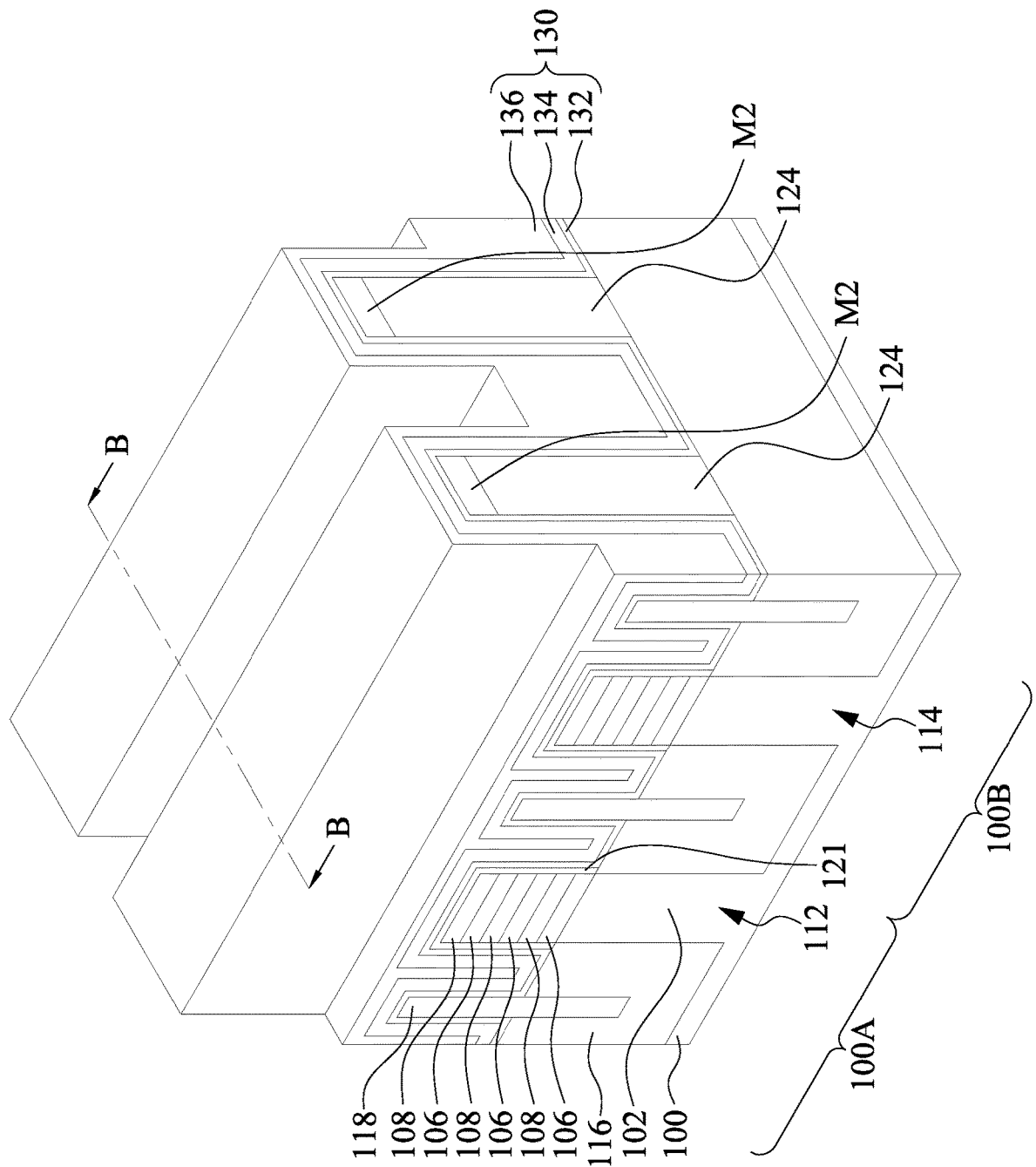
Figure 10B:
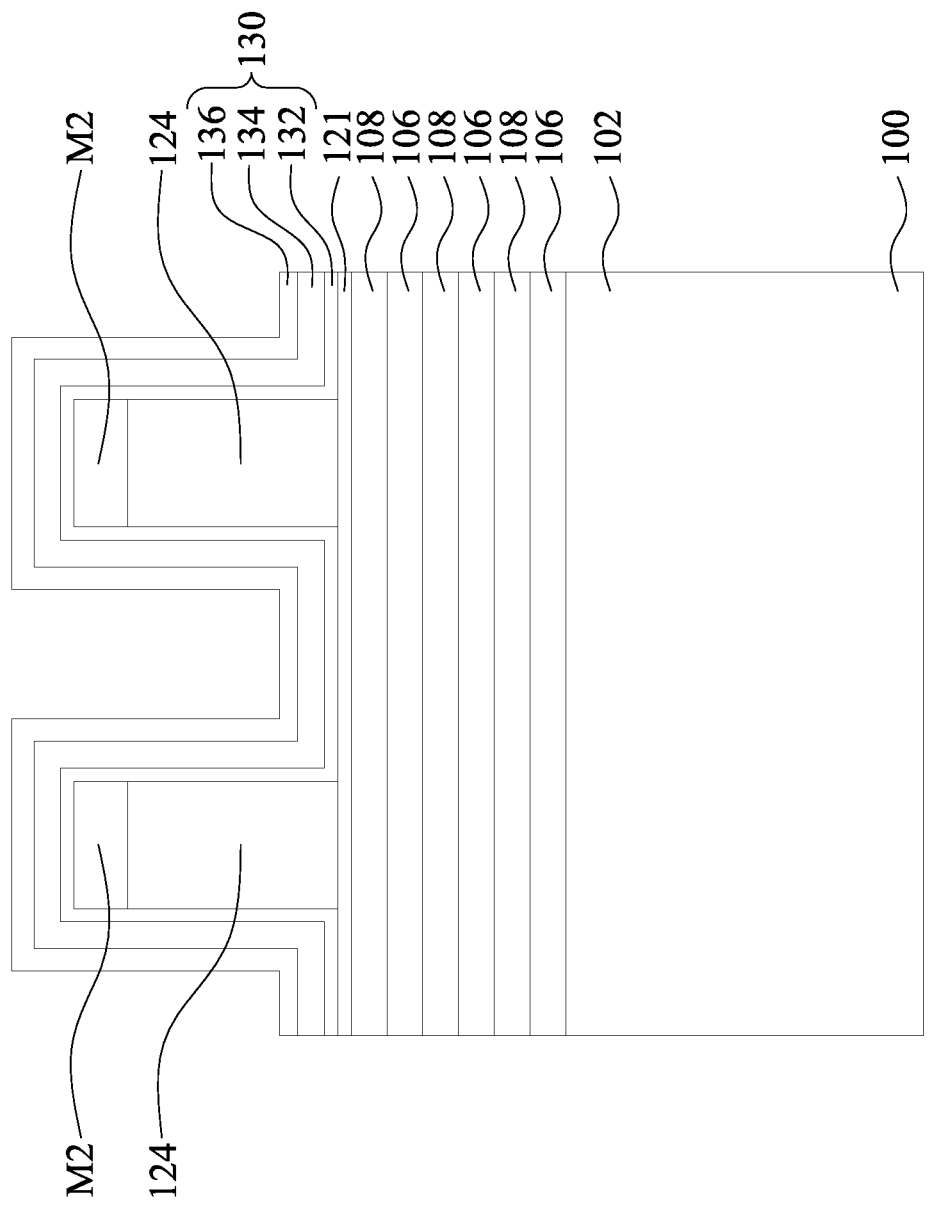

Reference is made to FIGS. 10A and 10B, in which FIG. 10B is a cross-sectional view along line B-B of FIG. 10A. A spacer layer 130 is deposited over the substrate 100 and along sidewalls of the dummy gate structures 124. Any suitable methods of forming the spacer layer 130 may be used. In some embodiments, a deposition (such as CVD, ALD, or the like) may be used form the spacer layer 130. In some embodiments, the spacer layer 130 may include one or more layers of, for example, silicon oxide, silicon nitride (SiN), silicon oxynitride (SiON), silicon carbonitride (SiCN), silicon carbonoxide (SiOC), silicon oxycarbonitride (SiOCN), combinations thereof, or the like. In some embodiments, the spacer layer 130 may include a first spacer layer 132, a second spacer layer 134 over the first spacer layer 132, and a third spacer layer 136 over the second spacer layer 134. In some embodiments, the first spacer layer 132 may include silicon oxide, the second spacer layer 134 includes silicon nitride, and the third spacer layer 136 includes silicon oxide.

Figure 11A:
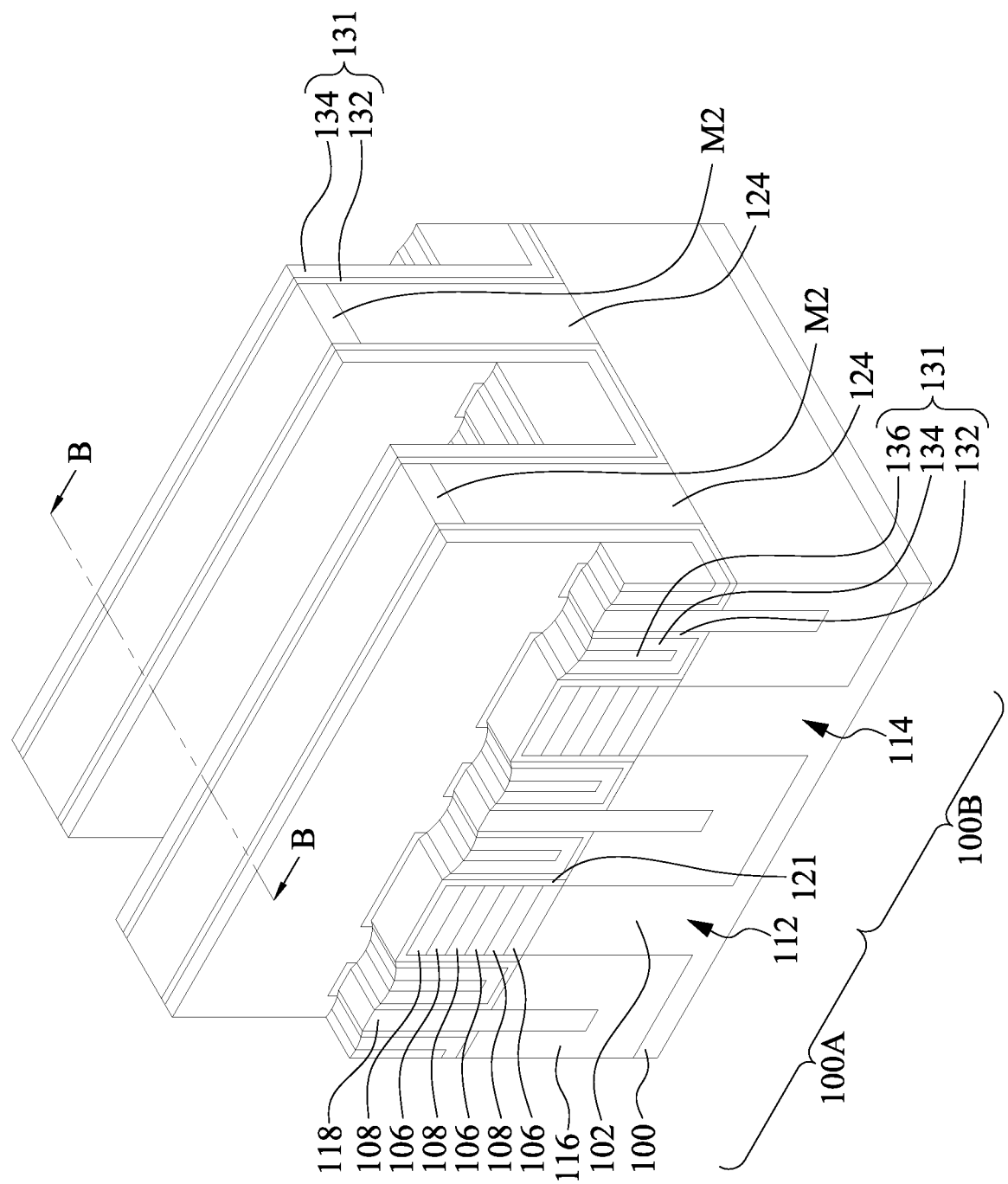
Figure 11B:
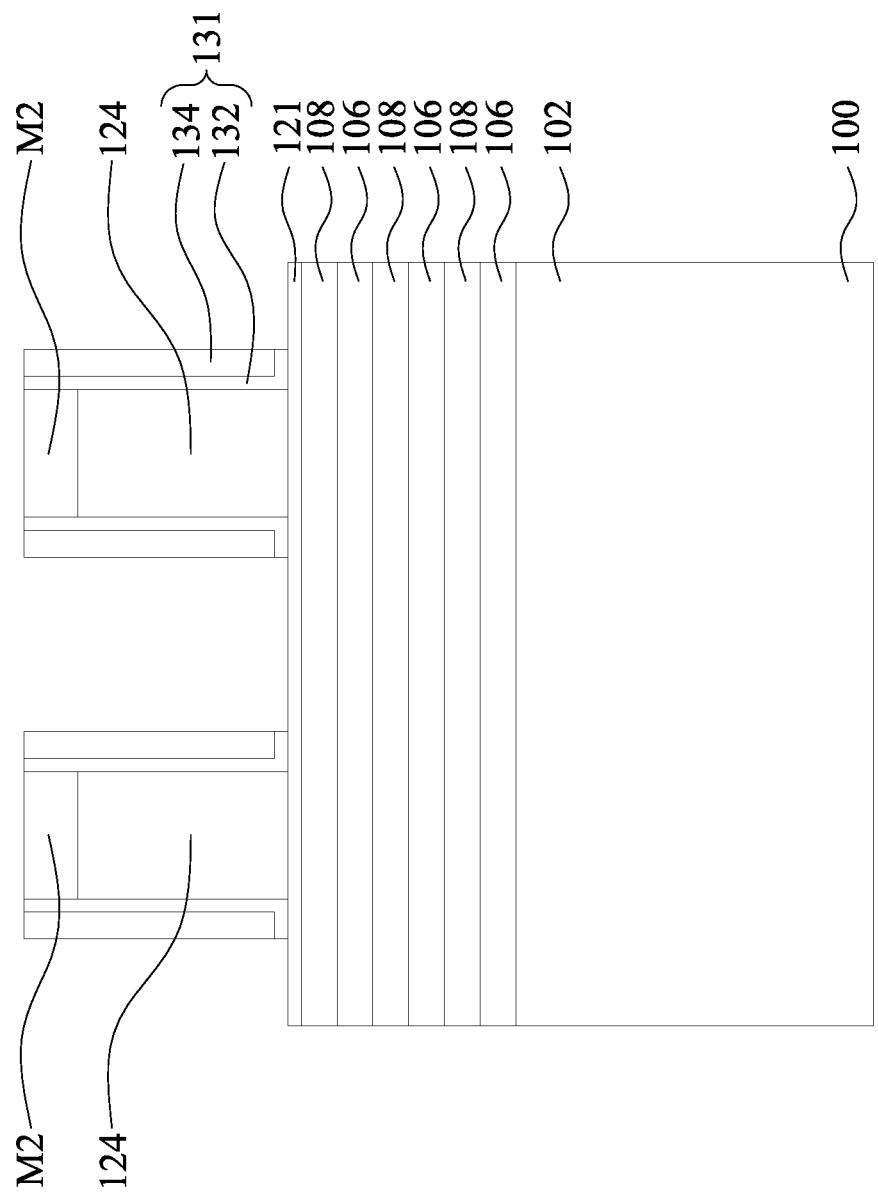

Reference is made to FIGS. 11A and 11B, in which FIG. 11B is a cross-sectional view along line B-B of FIG. 11A. The spacer layer 130 is patterned to form a plurality of spacers 131. In some embodiments, the spacer layer 130 may be patterned by suitable process, such as etching. The etching process may be anisotropic. After preforming the etching process, lateral portions of the spacer layer 130 may be removed to expose top surfaces of the hard masks M2 over the dummy gate structures 124. Portions of the spacer layer 130 along sidewalls of the dummy gates structures 124 and the fin structures 112 and 114, and the dielectric fins 118 may remain after the etching process, and the remaining portions of the spacer layer 130 are referred to as spacers 131. In some embodiments as shown in FIGS. 11A and 11B, the third spacer layer 136 along the sidewalls of the dummy gate structures 124 may be removed during the etching process, such that each of the spacers 131 along the dummy gate structures 124 only includes the first spacer layer 132 and the second spacer layer 134. While in some other embodiments, the third spacer layer 136 along the sidewalls of the dummy gate structures 124 may remain after the etching process, such that each of the spacers 131 along the dummy gate structures 124 includes the first spacer layer 132, the second spacer layer 134, and the third spacer layer 136. On the other hand, as shown in FIG. 11A, each of the spacers 131 remains on opposite sides of the fin structures 112 and 114 has the first spacer layer 132, the second spacer layer 134, and the third spacer layer 136. That is, the portion of the spacers 131 on opposite sides of the fin structures 112 and 114 is thicker than the portion of the spacers 131 on opposite sides of the dummy gate structure 124. In some embodiments, the spacers 131 on opposite sides of the dummy gate structure 124 have a thickness in a range from about 2 nm to about 8 nm.

Figure 12A:
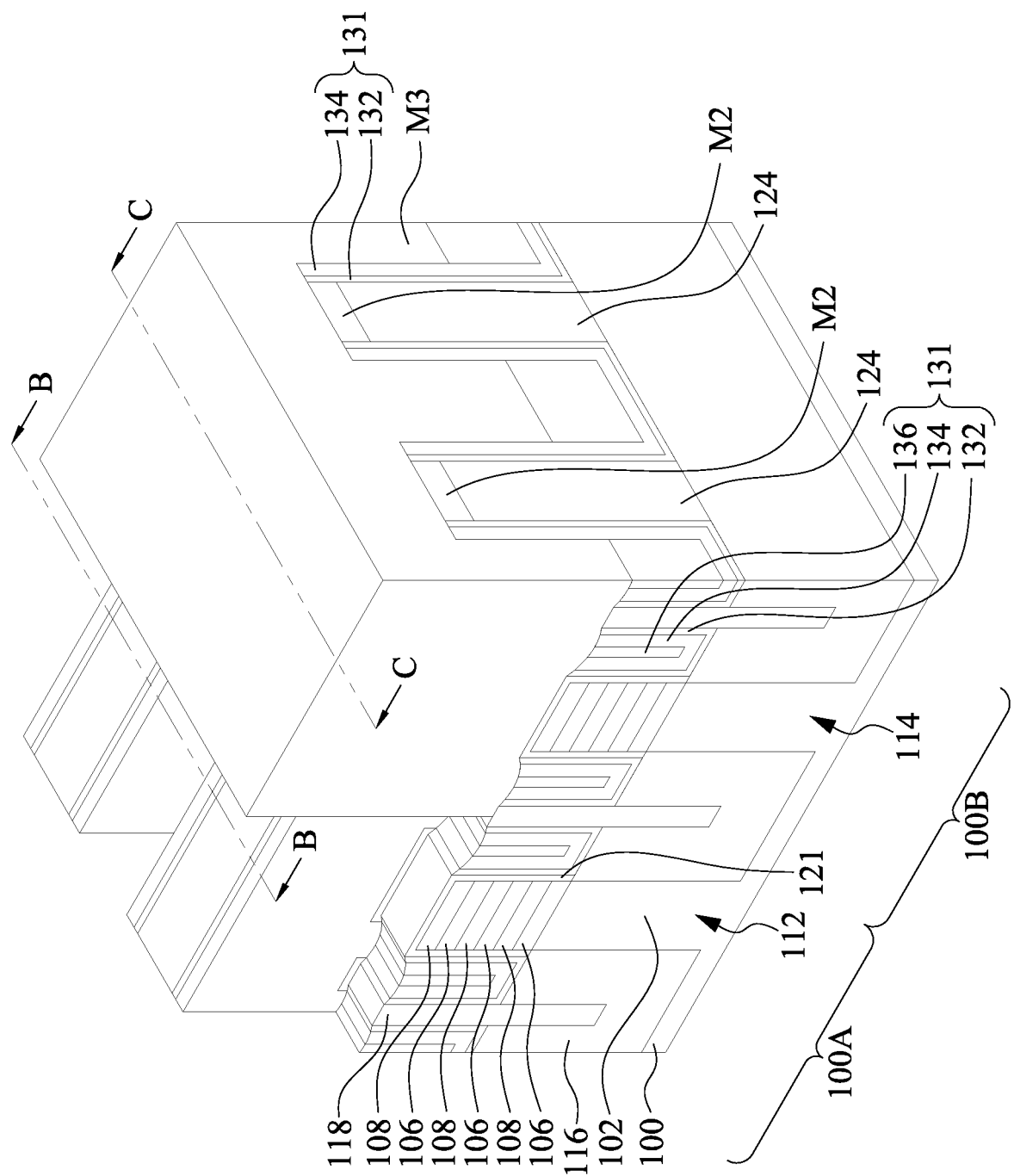
Figure 12B:
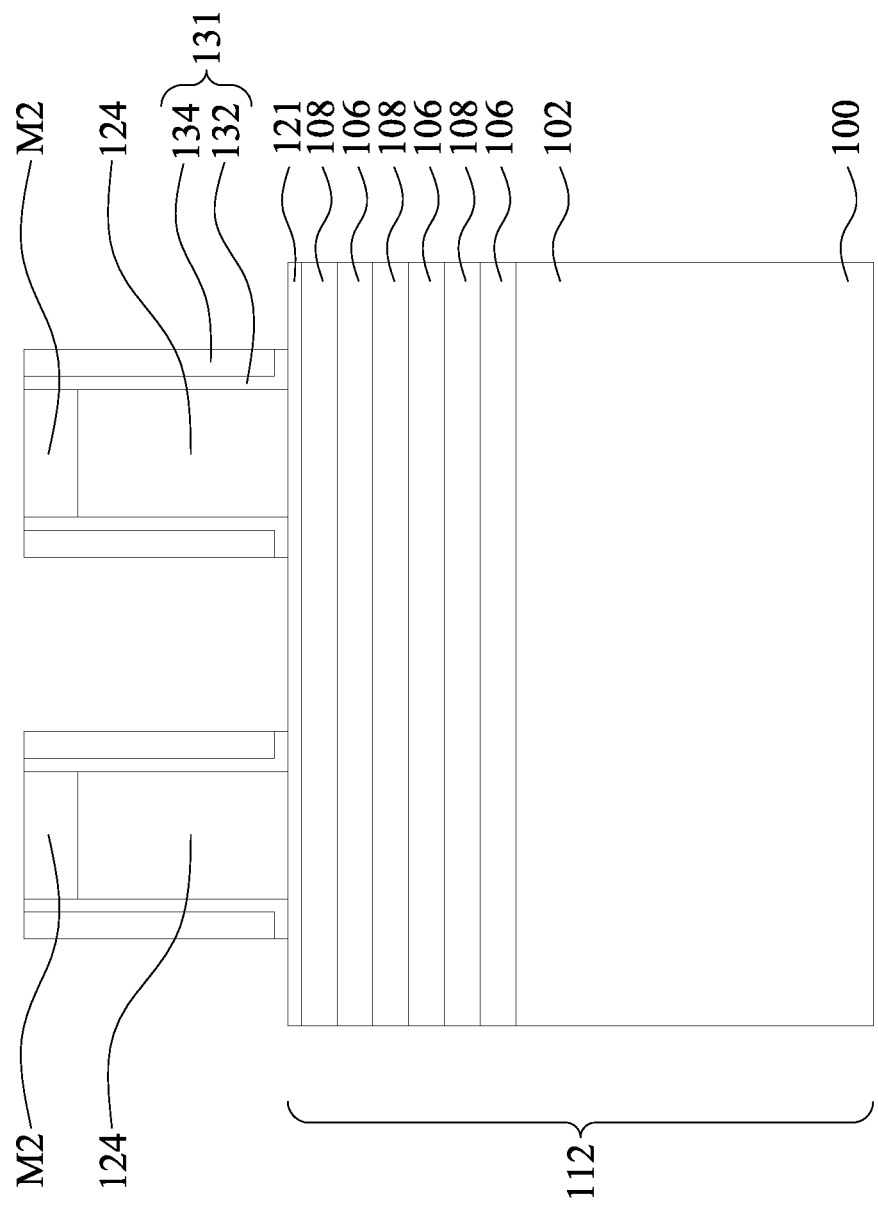
Figure 12C:
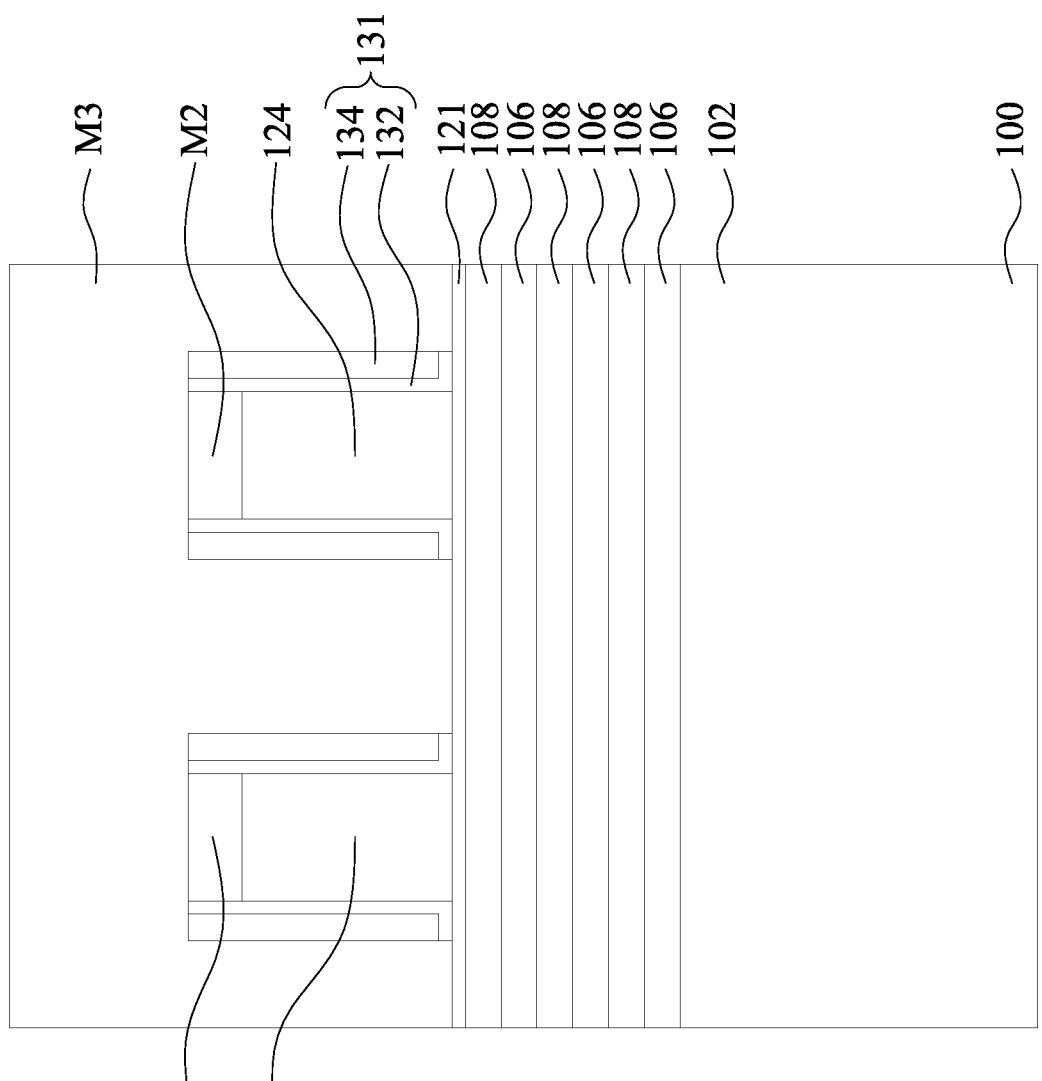

Reference is made to FIGS. 12A to 12C, in which FIG. 12B is a cross-sectional view along line B-B of FIG. 12A, and FIG. 12C is a cross-sectional view along line C-C of FIG. 12A. A patterned mask M3 is formed covering the second fin structure 114. In greater detail, the patterned mask M3 is formed over the second region 100B of the substrate 100, while leaving the first region 100A of the substrate 100 exposed from the patterned mask M3. That is, the first fin structure 112 is uncovered by the patterned mask M3. In some embodiments, the patterned mask M3 may be a photoresist layer.

Figure 13A:
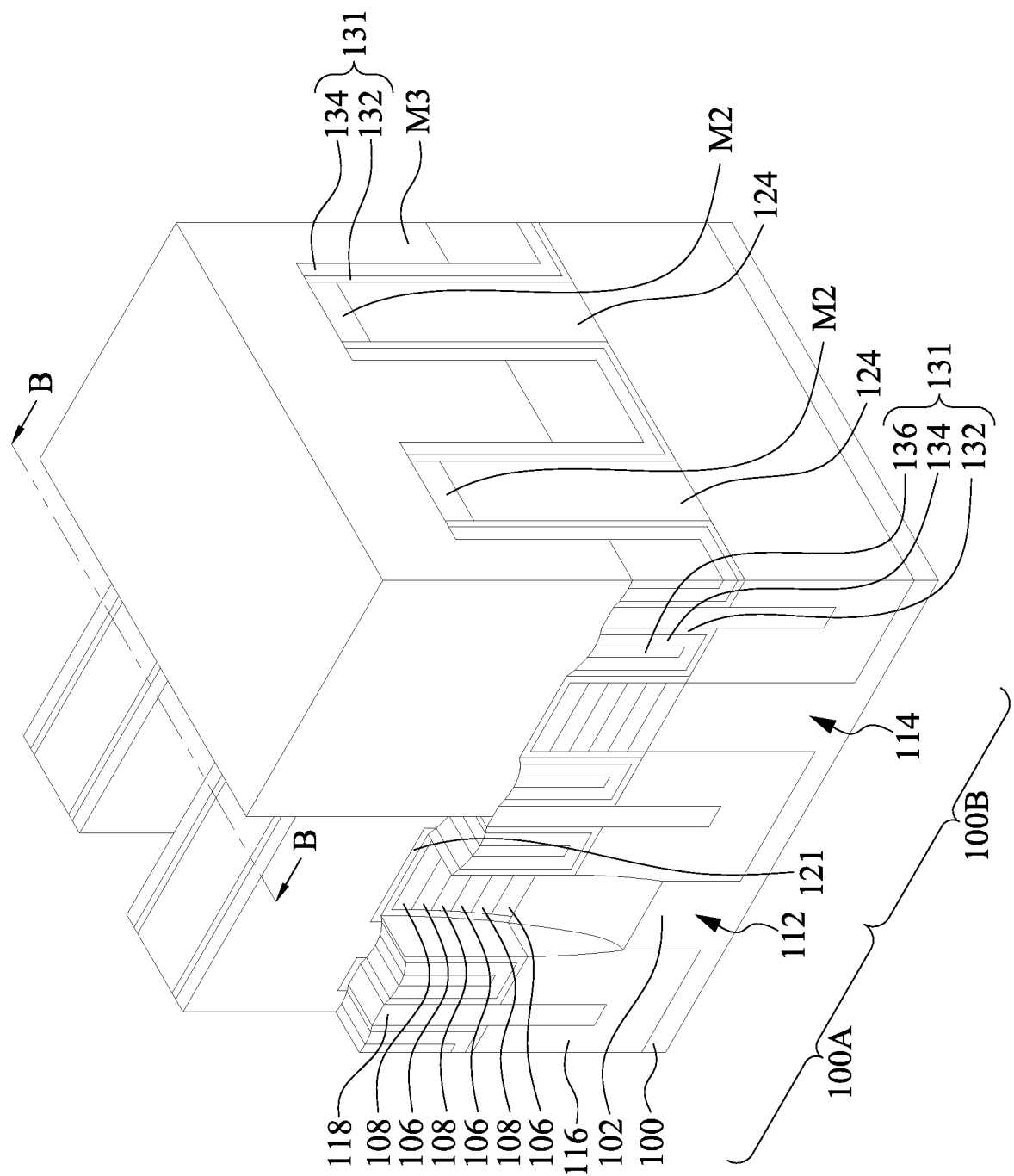
Figure 13B:
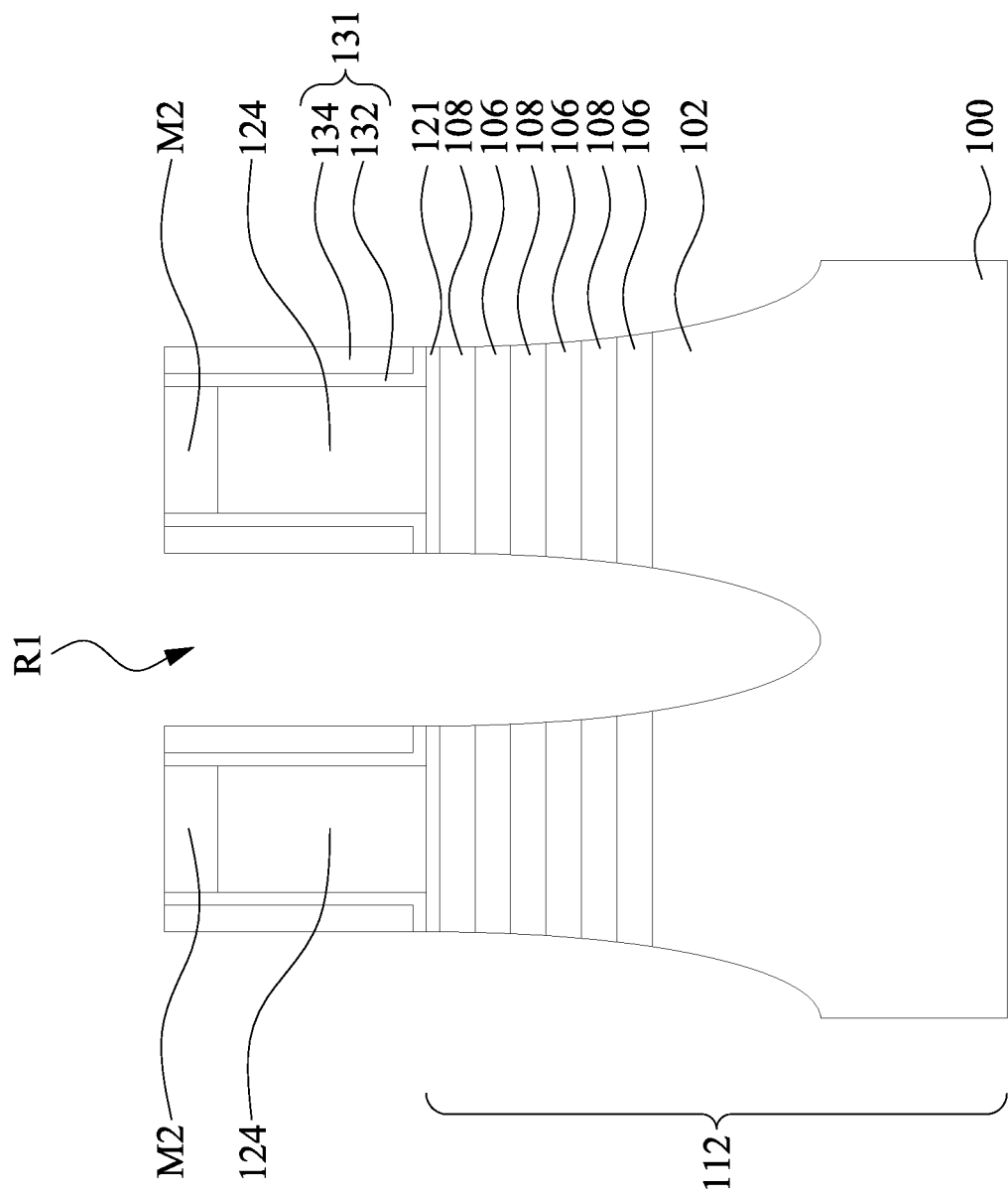

Reference is made to FIGS. 13A and 13B, in which FIG. 13B is a cross-sectional view along line B-B of FIG. 13A. The first fin structure 112 is recessed to form a plurality of first recesses R1 in the first fin structure 112. In greater detail, an etching process is performed to remove the gate dielectric layer 121 over the first fin structure 112, and the first fin structure 112 is then etched to form the recesses R1 therein. In some embodiments, the bottommost tip of each of the recesses R1 is in the base portion 102 of the first fin structure 112. That is, the etching process is performed such that the bottommost tip of each of the recesses R1 is lower than the bottommost semiconductor layer 106. If the etching process stops prior to the recesses R1 reach the base portion 102 of the first fin structure 112, the sidewalls of the recesses R1 along the semiconductor layers 106 and 108 may be excessively curved, which will cause excessive variation in the widths of the semiconductor layers 106 and 108, thus deteriorating the device performance. In some embodiments, the etching process is an anisotropic etching process, such as dry etching. In some embodiments, the etchants for etching the semiconductor layers 106 and 108 may include a hydro fluoride (HF), fluoride ($F_2$), or ammorium hydroxide ($NH_4OH$).

Figure 14A:
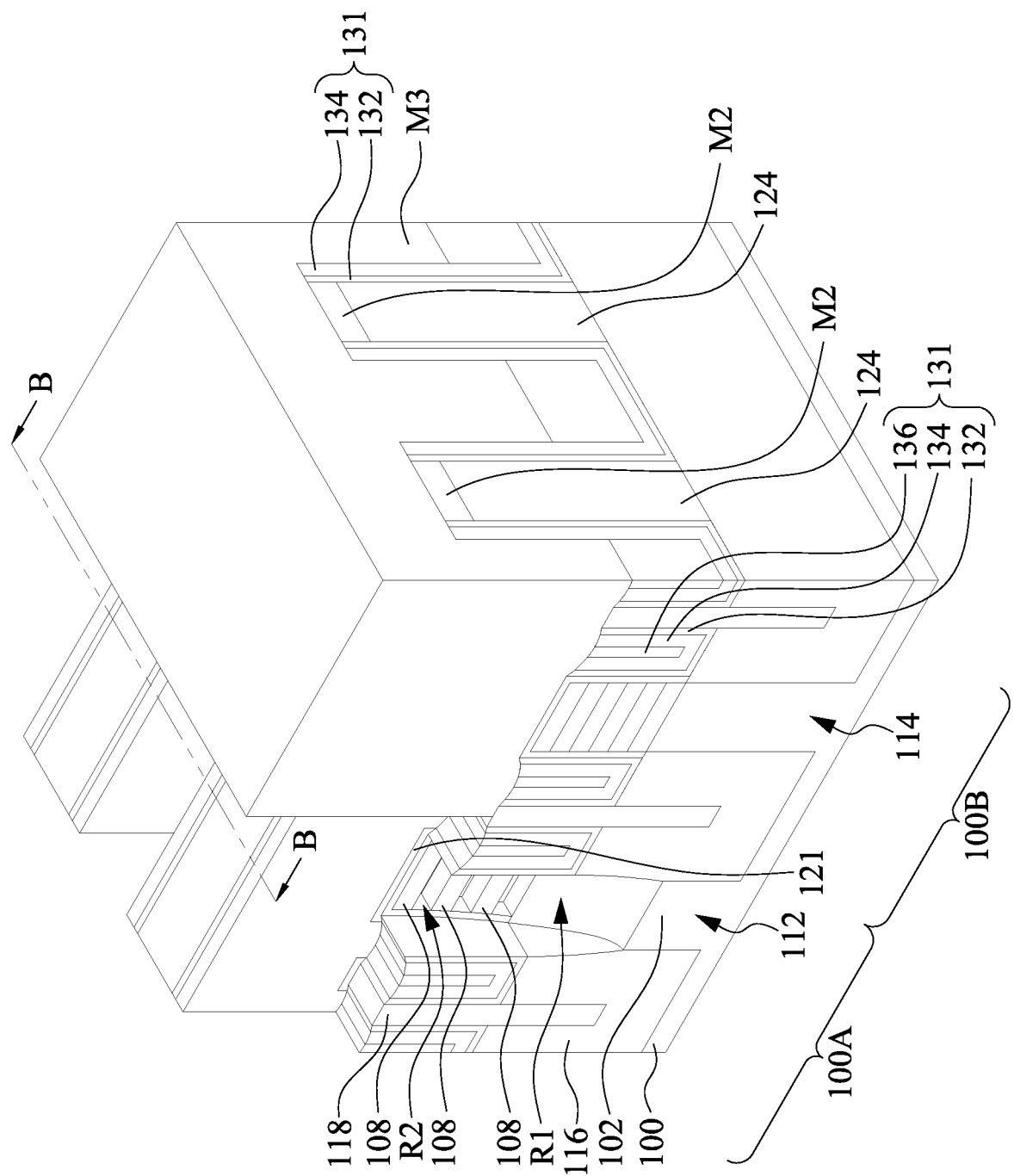
Figure 14B:
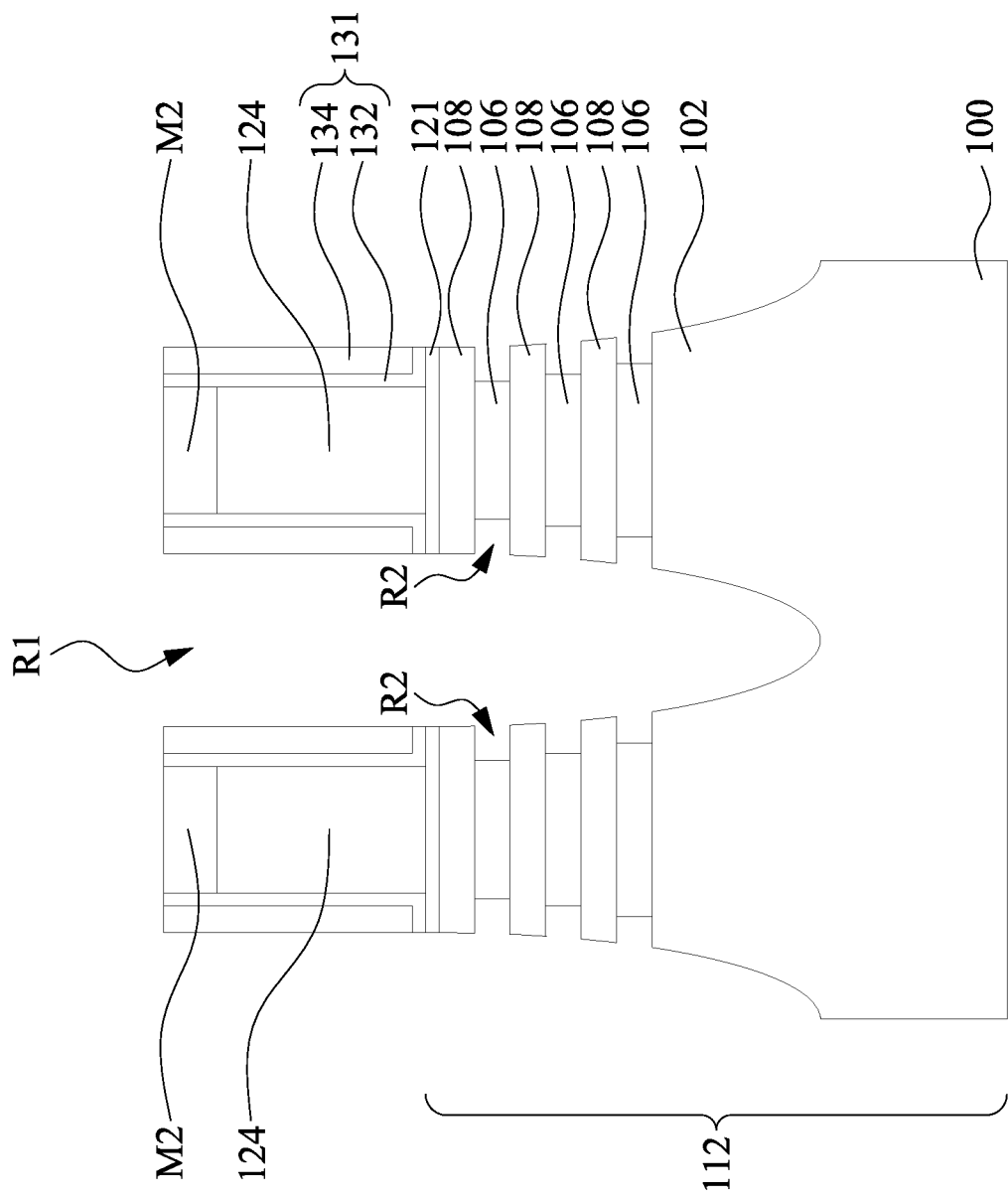

Reference is made to FIGS. 14A and 14B, in which FIG. 14B is a cross-sectional view along line B-B of FIG. 14A. The first semiconductor layers 106 of the first fin structure 112 are horizontally recessed to form a plurality of second recesses R2 between the second semiconductor layers 108. In some embodiments, the first semiconductor layers 106 are etched so that edges of the first semiconductor layers 106 are located substantially below the spacers 131. In some embodiments, the etching process has etching selectivity to the semiconductor layers 106 and 108. For example, the second semiconductor layers 108 have higher etching resistance to the etching process than the first semiconductor layers 106. Stated another way, the etching process etches the first semiconductor layers 106 at a faster rate than etching the second semiconductor layers 108.

In some embodiments, the etching process described in FIGS. 14A and 14B has higher etching selectivity between the first and second semiconductor layers 106 and 108 than the etching process described in FIGS. 13A and 13B. In this way, the etchant(s) of the etching process described in FIGS. 14A and 14B are different from the etchant(s) of the etching process described in FIGS. 13A and 13B. When the first semiconductor layers 106 are Ge or SiGe and the second semiconductor layers 108 are Si, the first semiconductor layers 106 can be selectively etched by using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions.

Figure 15A:
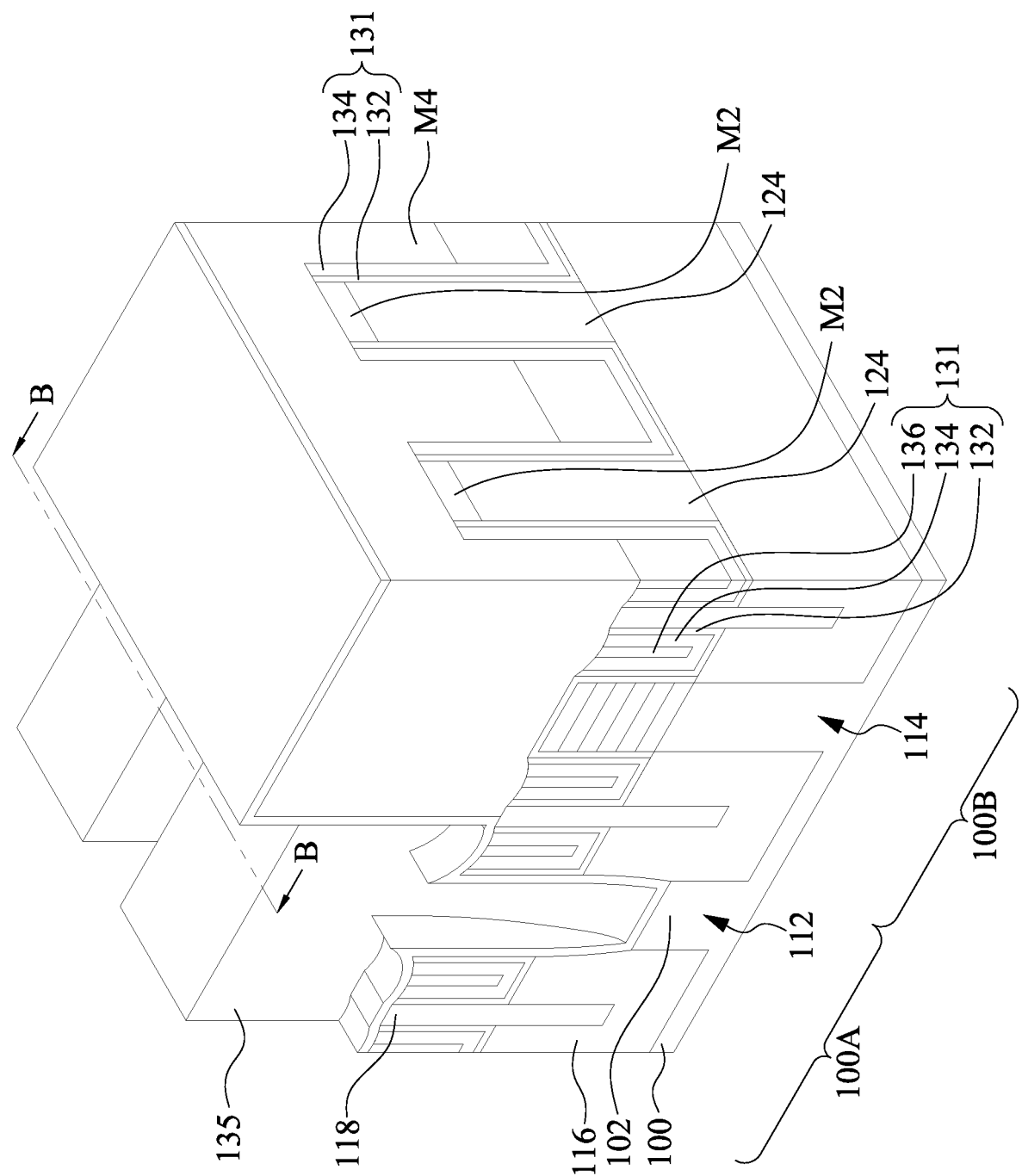
Figure 15B:
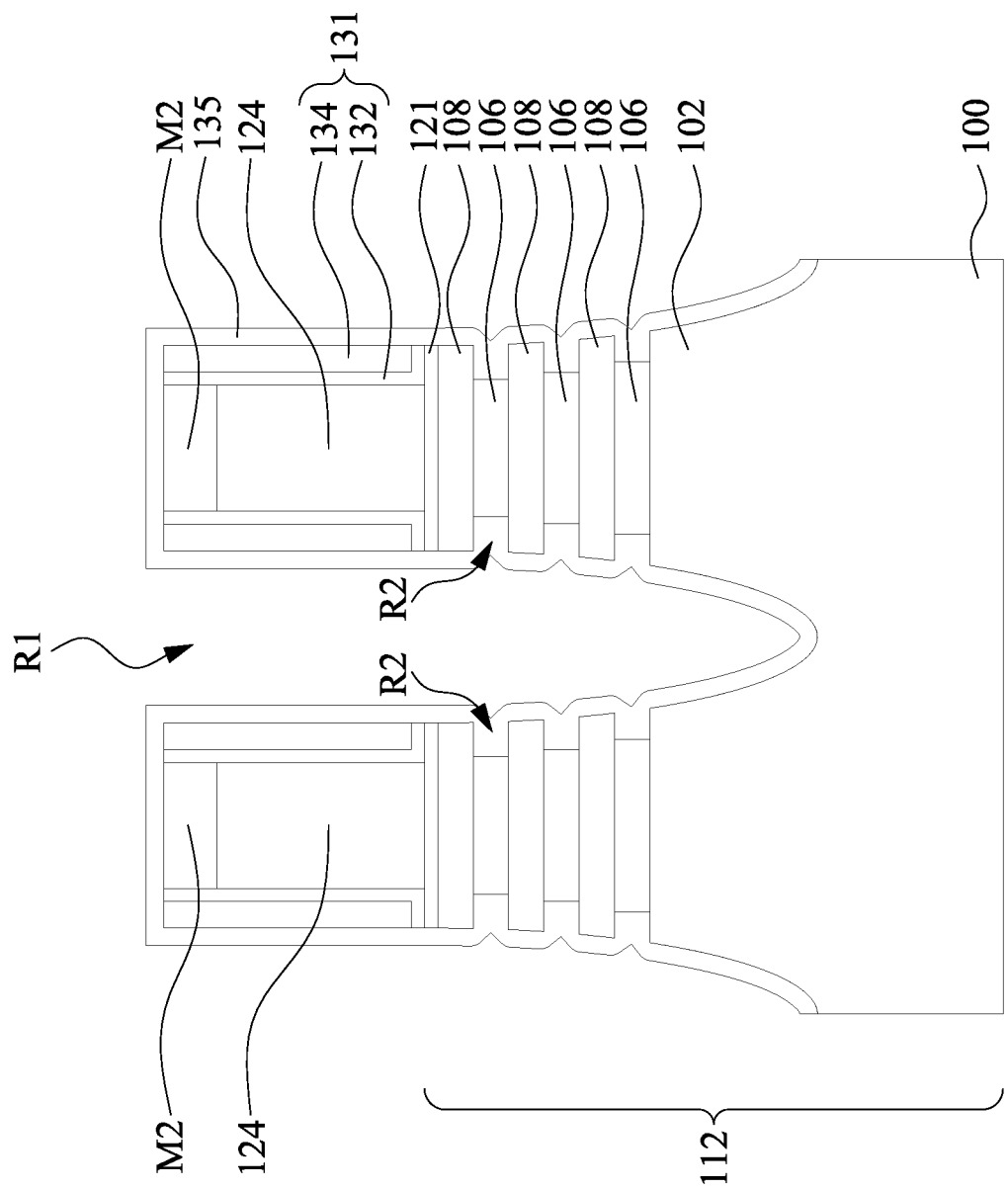

Reference is made to FIGS. 15A and 15B, in which FIG. 15B is a cross-sectional view along line B-B of FIG. 15A. An inner spacer layer 135 is conformally deposited in the first recesses R1 and fills the second recesses R2. In some embodiments, the material of the inner spacer layer 135 may be low-k material, such as SiO, SiN, SiON, SiCN, SiOC, SiOCN, or the like. The inner spacer layer 135 can be formed by ALD or other suitable methods.

Figure 16A:
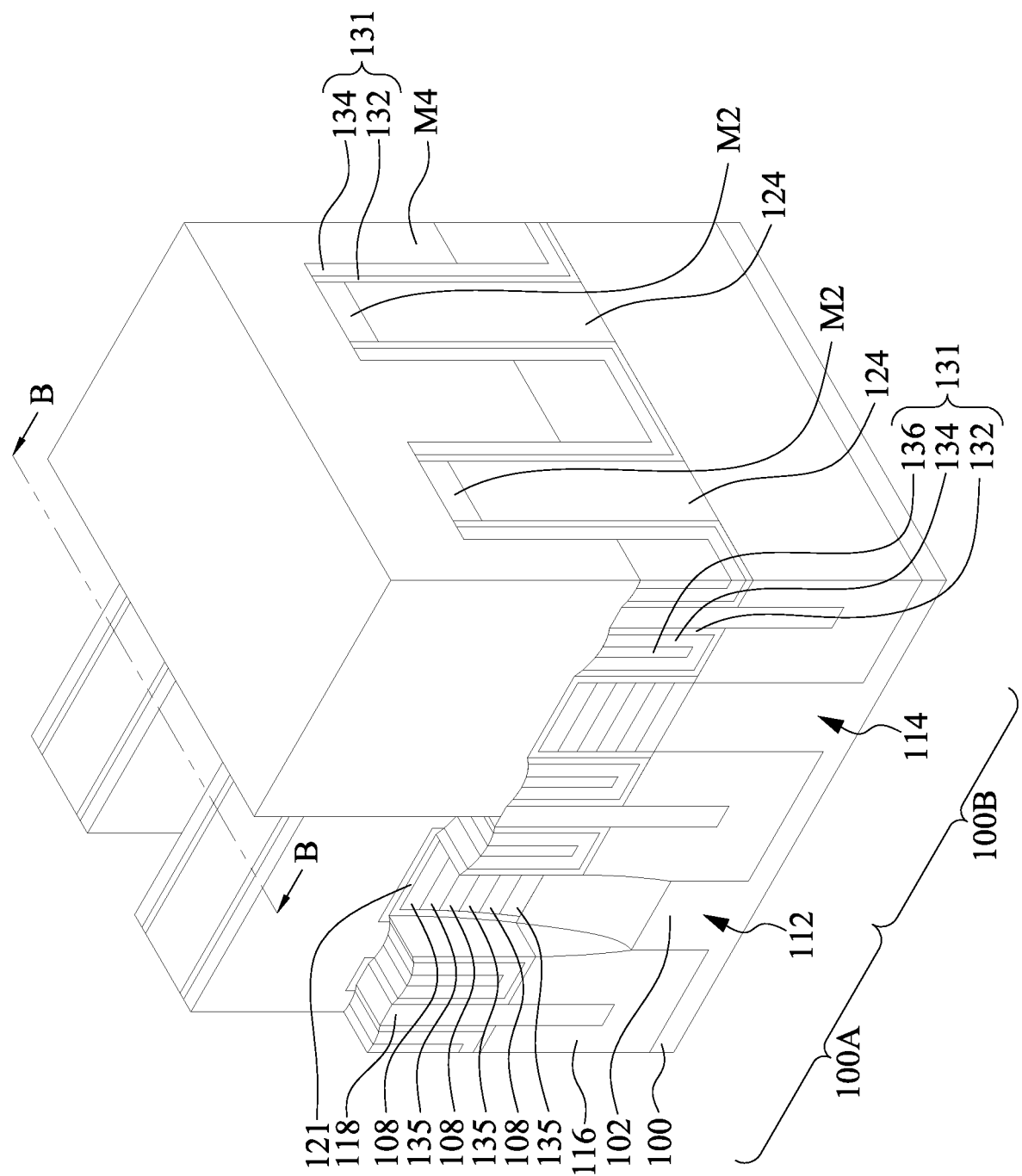
Figure 16B:
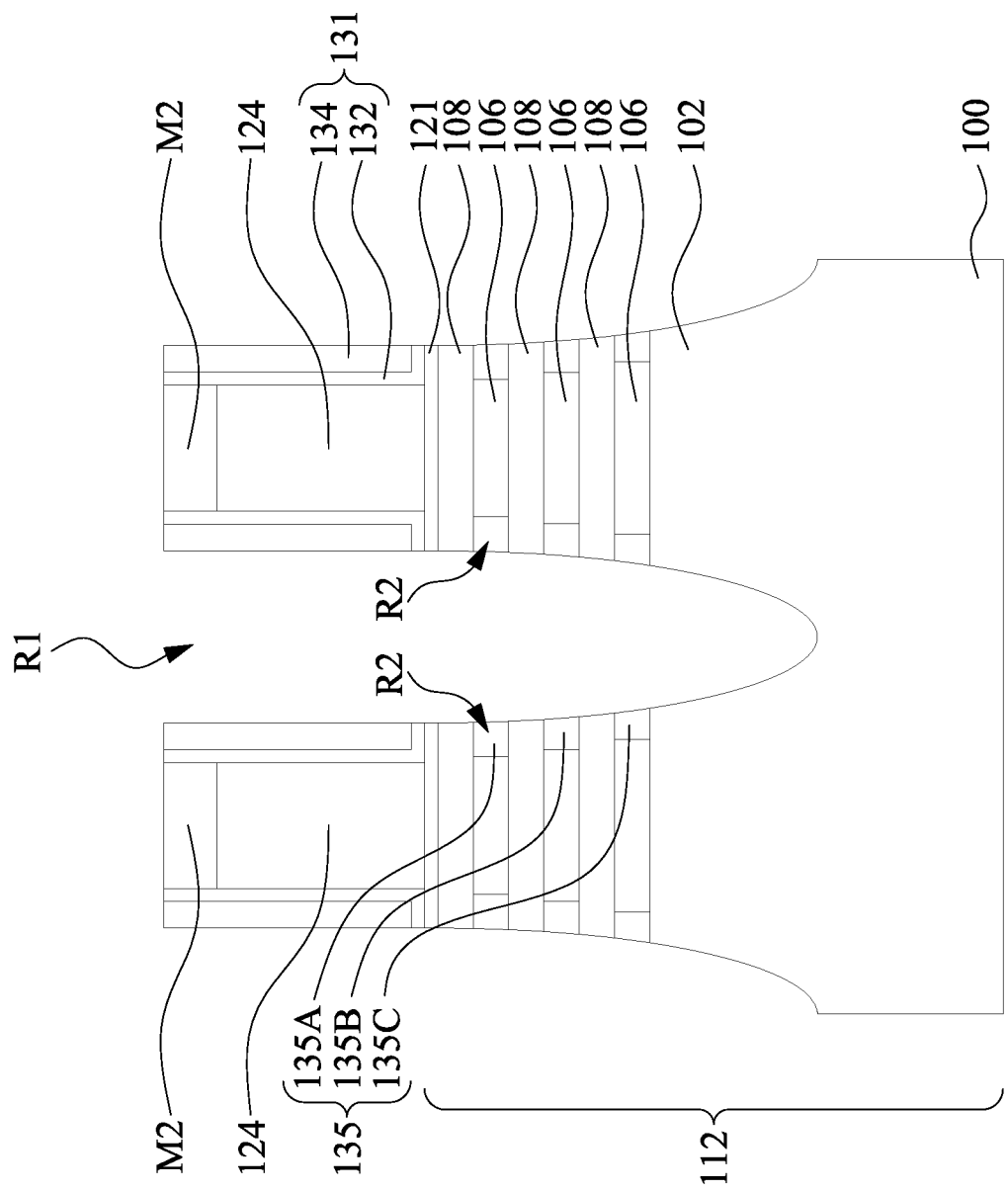

Reference is made to FIGS. 16A and 16B, in which FIG. 16B is a cross-sectional view along line B-B of FIG. 16A. The inner spacer layer 135 is partially removed, such that portions of the inner spacer layer 135 remain in the recesses R2. The inner spacer layer 135 may be partially removed by suitable process, such as an etching process. After this etching process, portions of the inner spacer layer 135 remain within the recesses R2. Generally, plasma dry etching etches a layer in wide and flat areas faster than a layer in concave (e.g., holes, grooves and/or slits) portions, which results that the inner spacer layer 135 can remain inside the recesses R2.

In FIG. 16B, the remaining inner spacer layer 135 may include a topmost inner spacer 135A adjacent to the topmost semiconductor layer 106, a middle inner spacer 135B adjacent to the middle semiconductor layer 106, and a bottommost inner spacer 135C adjacent to the bottommost semiconductor layer 106. In some embodiments, the remaining portions of the inner spacer layer 135 have a width in a range from about 4 nm to about 6 nm, and have a height in a range from about 8 nm to about 12 nm. For example, the topmost inner spacer 135A has a lateral width ranged from about 4.5 nm to about 5.5 nm (e.g., 5 nm), the middle inner spacer 135B has a lateral width ranged from about 4.3 nm to about 5.3 nm (e.g., 4.8 nm), and the bottommost inner spacer 135C has a lateral width ranged from about 3.9 nm to about 4.9 nm (e.g., 4.4 nm). In some embodiments, the width difference between two adjacent remaining portions of the inner spacer layer 135 (e.g., width difference between topmost and middle inner spacers 135A and 135B or width difference between middle and bottommost inner spacers 135B and 135C) is in a range from about 0.2 nm to about 0.4 nm. As mentioned above, because the etching process that forms the recesses R1 is performed such that the bottommost tips of the recesses R1 extends into the base portion 102 of the first fin structure 112, the sidewall of the recesses R1 may be steeper as compared to the condition where the bottommost tips of the recesses R1 is above the base portion 102 of the first fin structure 112. As a result, the variations of the widths of the recesses R2 can be decreased, which in turn will improve the uniformity of the widths of the topmost, middle and bottommost inner spacers 135A-135C. That is, by forming deeper recesses R1, the inner spacer layers 135 will have uniform widths, which will result in uniform gate-to-epi distance (e.g., the distance between metal gate structure 170 and the epitaxy structure 160 in FIG. 32B), and will improve the device performance and reliability.

Figure 17A:
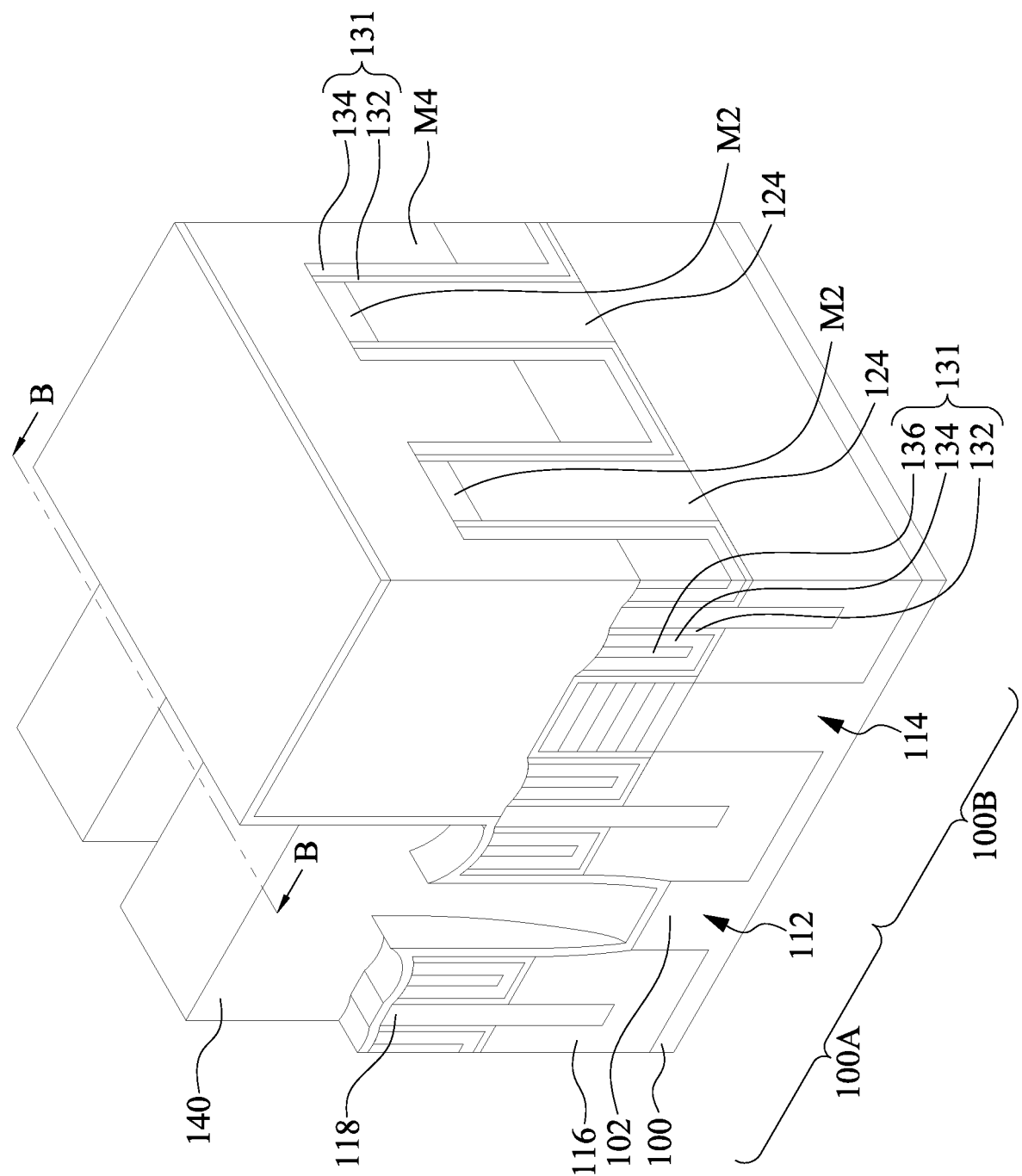
Figure 17B:
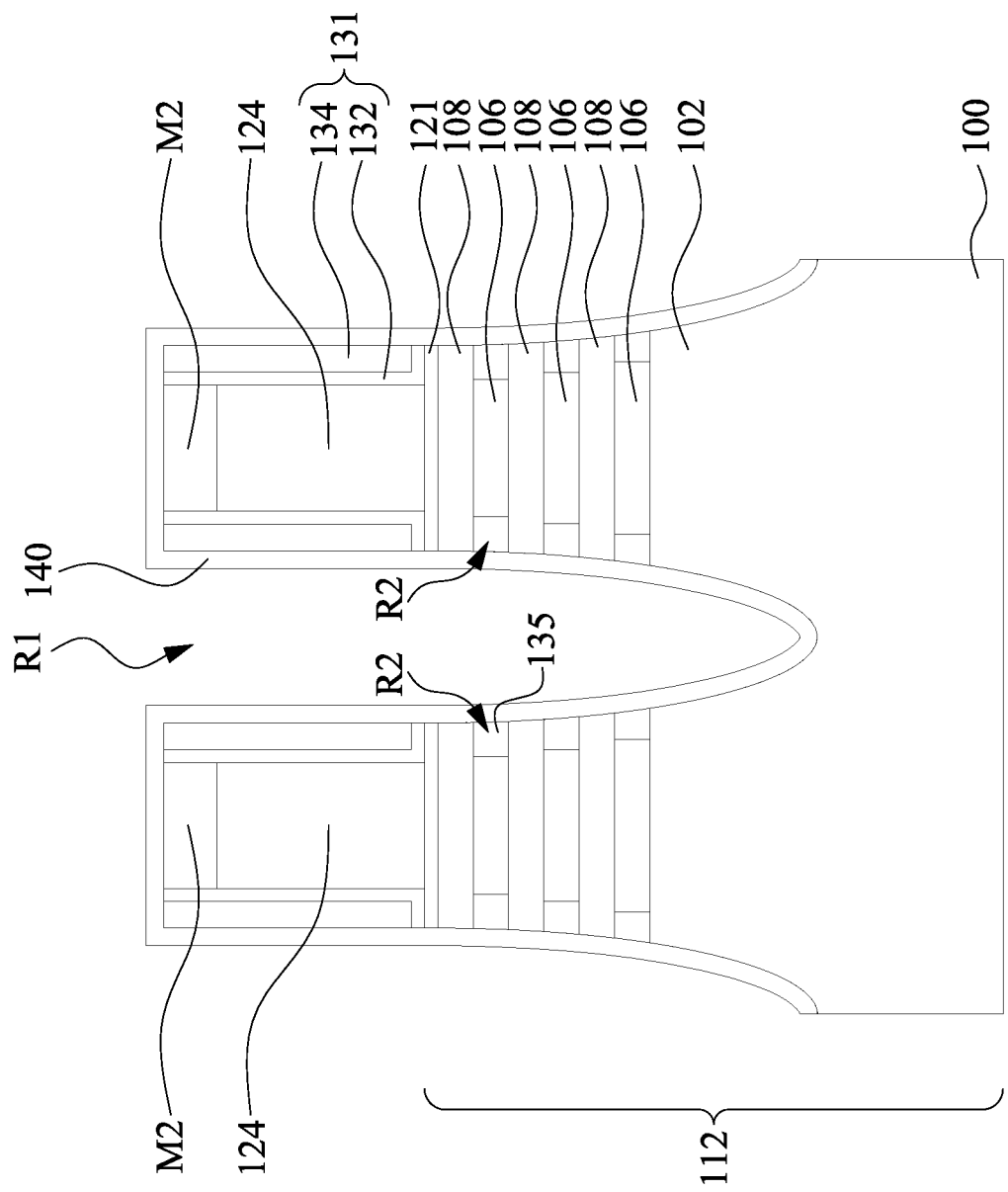

Reference is made to FIGS. 17A and 17B, in which FIG. 17B is a cross-sectional view along line B-B of FIG. 17A. A protective liner 140 is conformally deposited in the first recesses R1. In some embodiments, the material of the protective liner 140 may be dielectric material, such as $SiO_x$, SiOC, SiON, or the like. In some embodiments, the inner spacer layers 135 and the protective liner 140 are made of different materials, and may include etching selectivity. The protective liner 140 can be formed by ALD or other suitable methods.

Figure 18A:
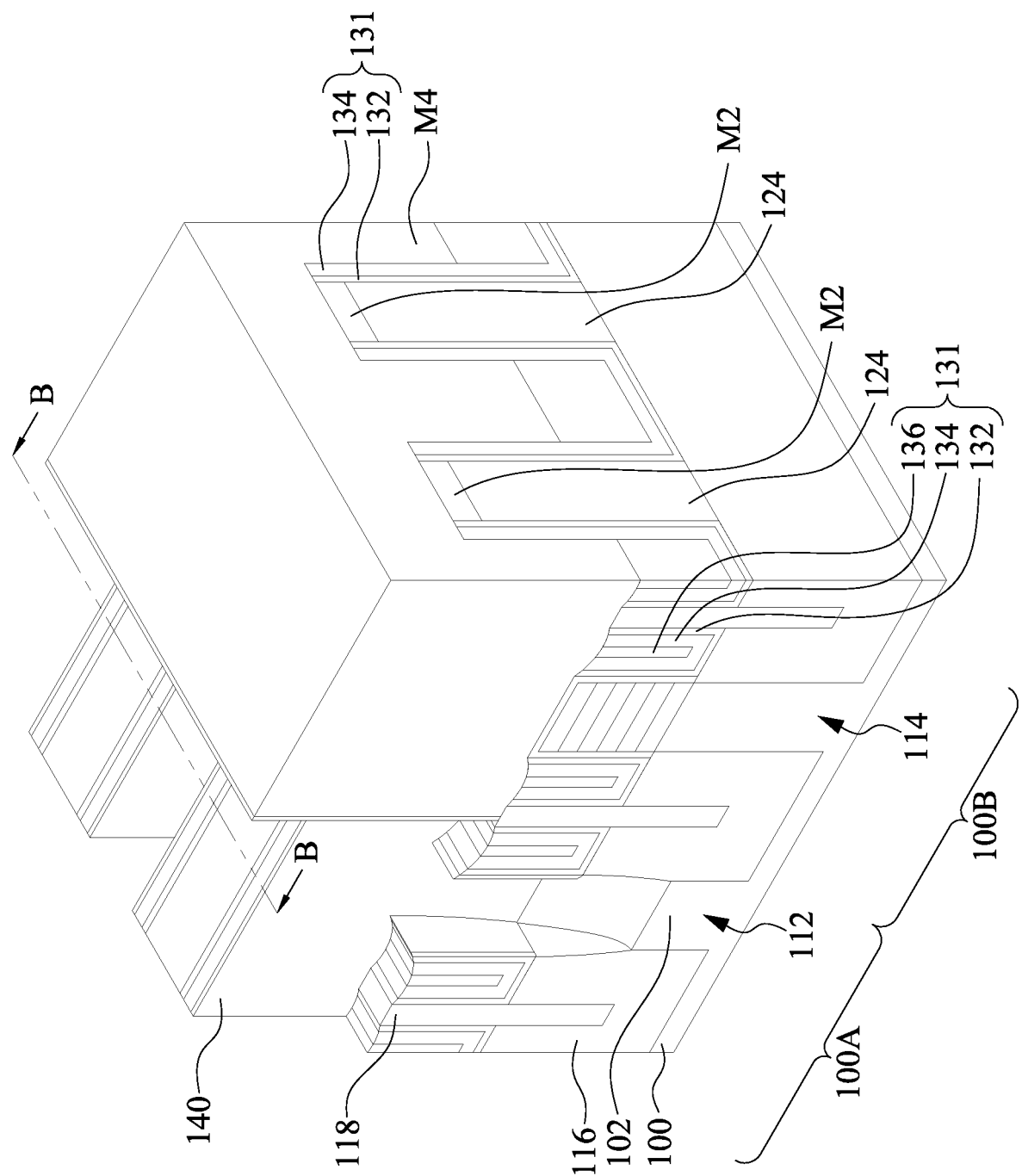
Figure 18B:
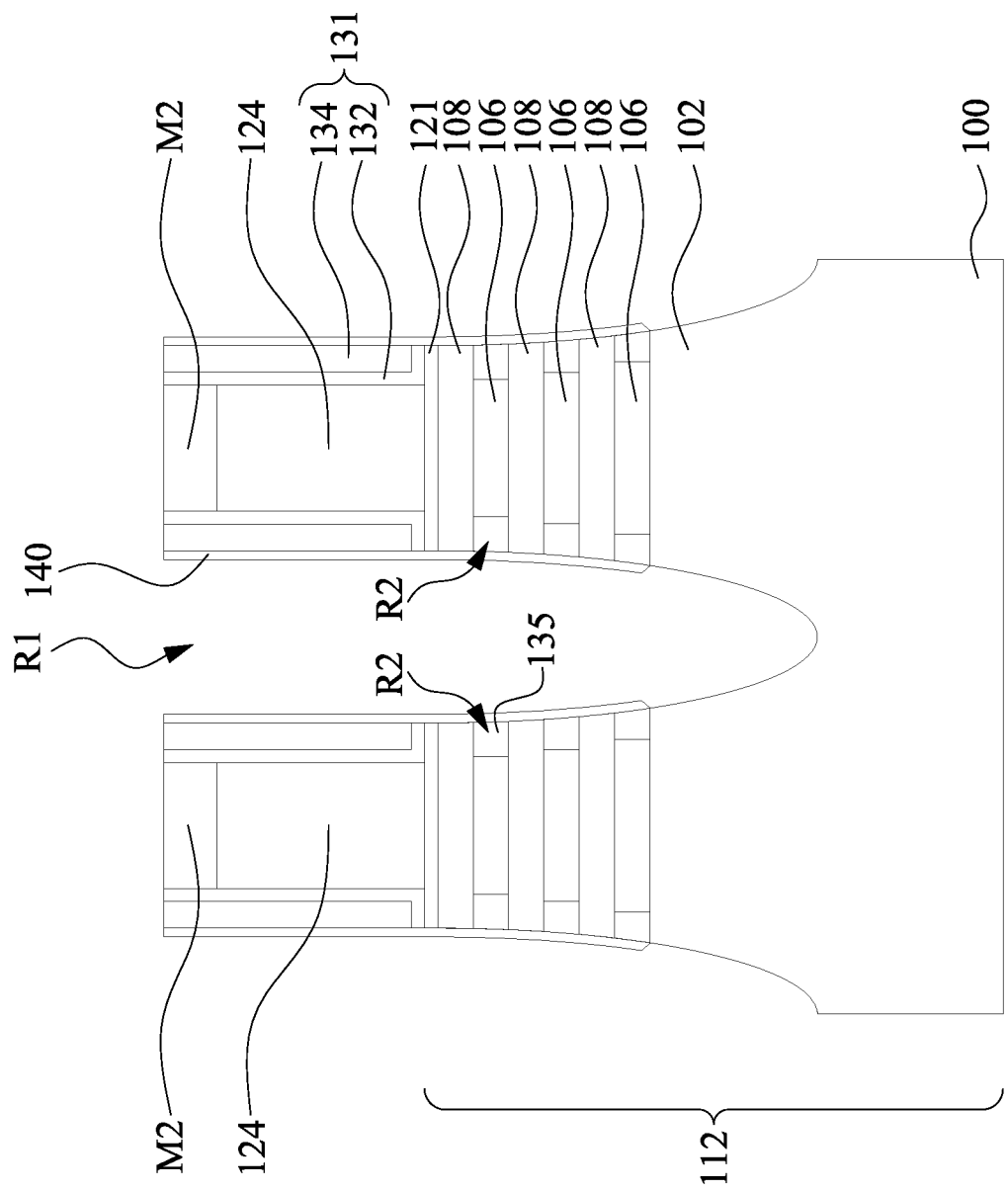

Reference is made to FIGS. 18A and 18B, in which FIG. 18B is a cross-sectional view along line B-B of FIG. 18A. The protective liner 140 is partially removed, such that surfaces of the base portion 102 of the first fin structure 112 are exposed by the recesses R1. The protective liner 140 may be partially removed by suitable process, such as a dry etching process. By this etching process, the remaining portions of the protective liner 140 cover sidewalls of the second semiconductor layer 108, while leaving the surfaces of the base portion 102 of the first fin structure 112 uncovered by the protective liner 140. In some embodiments, the reaming portions of the protective liner 140 also cover the inner spacers. In some embodiments, the dry etching are controlled, e.g., by tuning ion beam directions, to etch the horizontal portions of the protective liner 140 at a faster rate than etching the vertical portions (or slightly slanted portions) of the protective liner 140, which results in that portions of the protective liner 140 are etched away from the bottom of the recesses R1, while another portions of remain on sidewalls of the recesses R1. In some embodiments, the vertical portions of the protective liner 140 are thinned by the etching process as well.

Figure 19A:
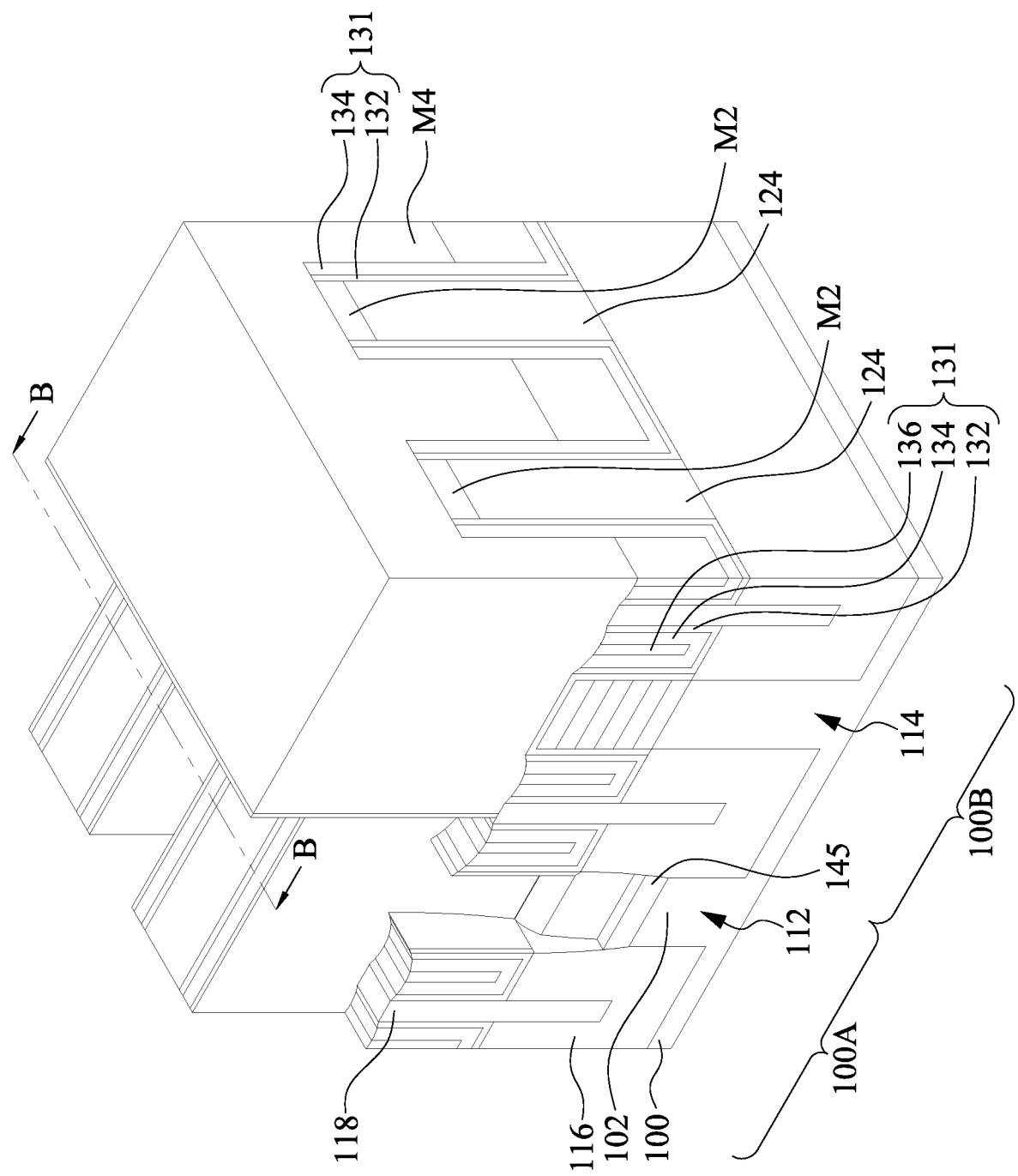
Figure 19B:
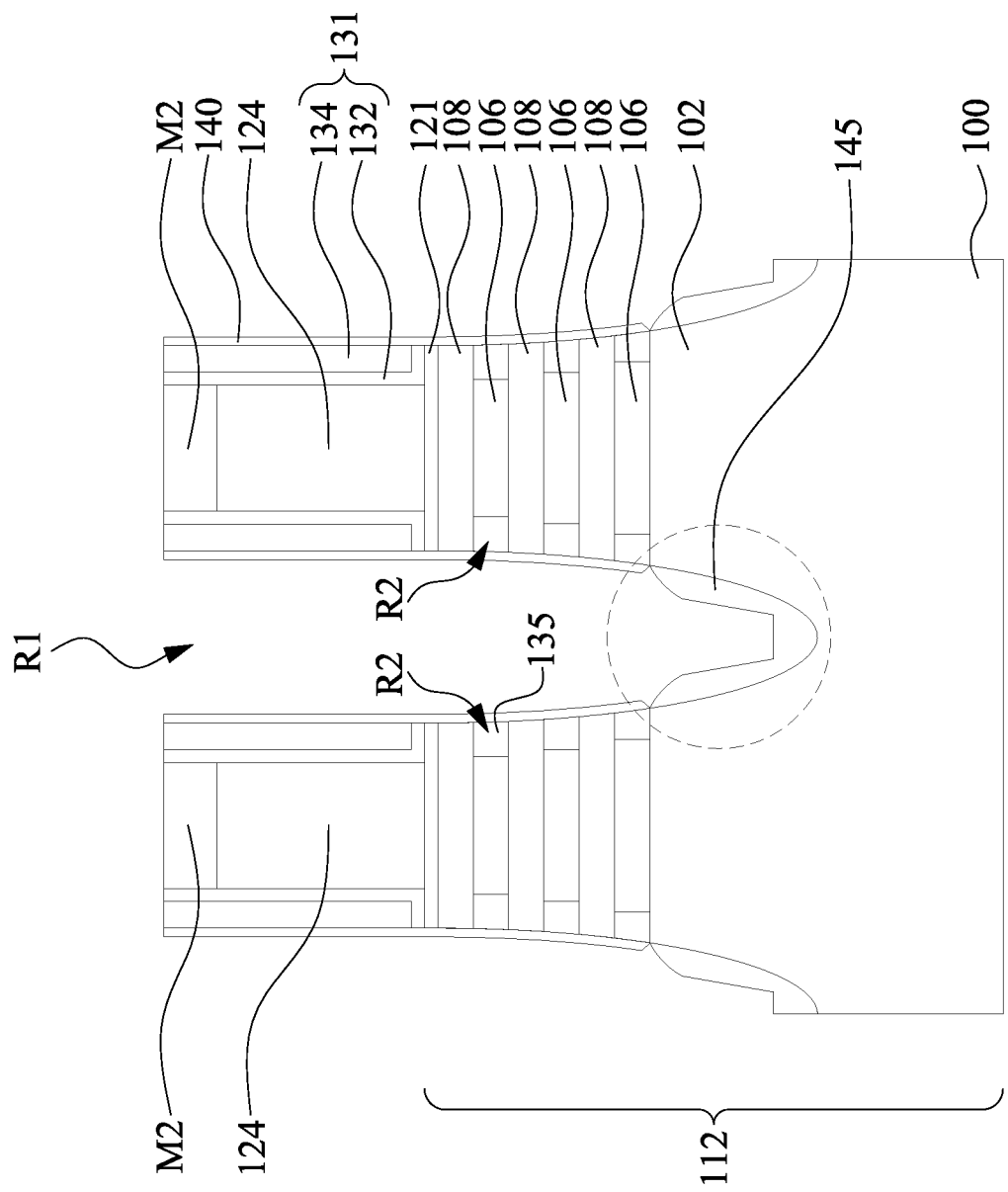

Reference is made to FIGS. 19A and 19B, in which FIG. 19B is a cross-sectional view along line B-B of FIG. 19A. A plurality of semiconductor layers 145 are epitaxially grown on the exposed surface of the base portion 102 of the first fin structure 112. In some embodiments, the semiconductor layers 145 are selectively grown on the exposed surface of the base portion 102 of the first fin structure 112. On the other hand, because the remaining portions of the protective liner 140 cover the second semiconductor layers 108, the semiconductor layers 145 would not grow on the second semiconductor layers 108. In some embodiments, the semiconductor layers 145 include germanium (Ge), such as silicon germanium (SiGe). In some embodiments, the semiconductor layers 145 have substantially the same material as the first semiconductor layers 106.

Figure 19C:
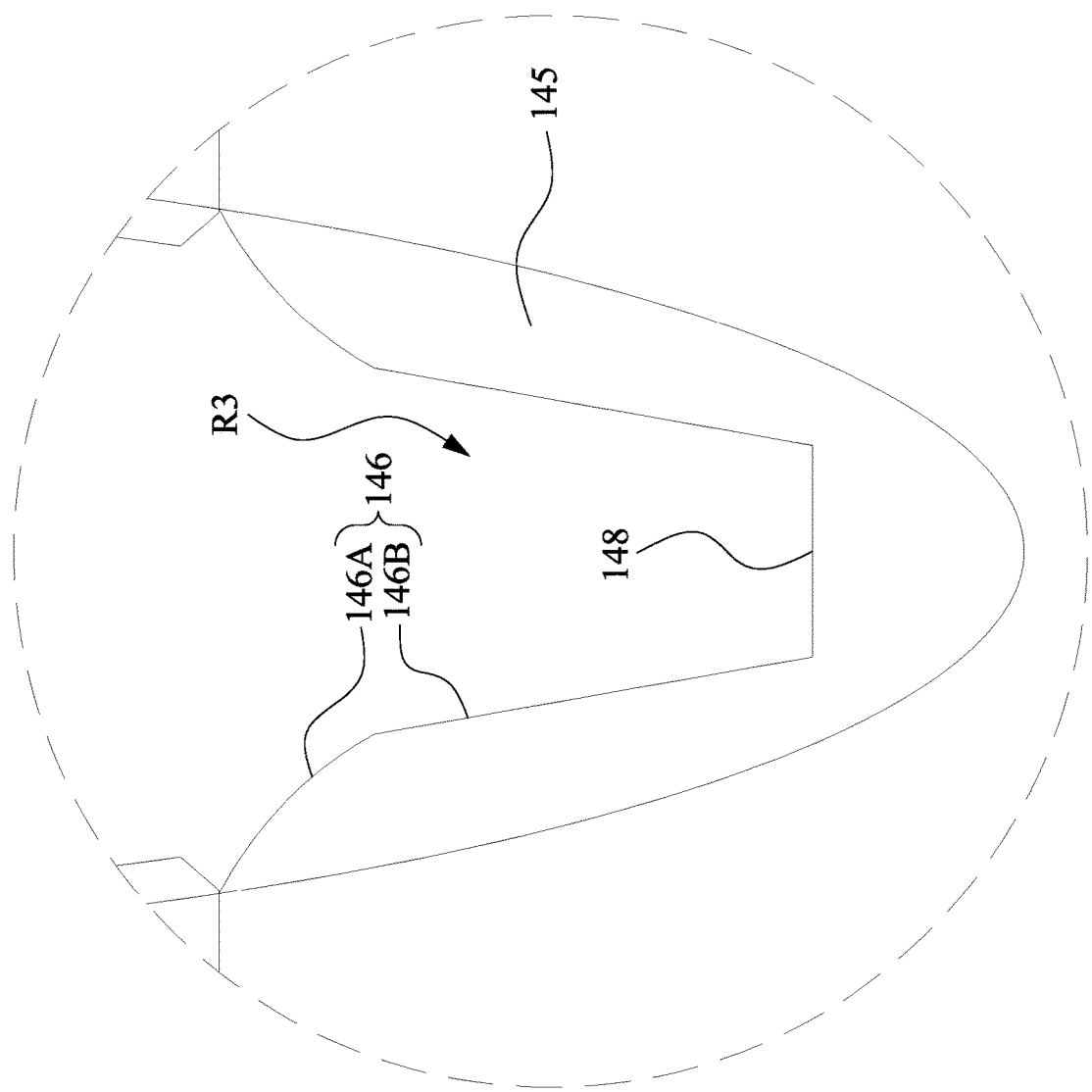

FIG. 19C is an enlarged view of one of the semiconductor layers 145. The semiconductor layer 145 has a recess R3 therein, in which the recess R3 is defined by opposite inner sidewalls 146 of the semiconductor layer 145 and a horizontal surface 148 of the semiconductor layer 145. Stated differently, the opposite inner sidewalls 146 can be referred to as opposite sidewalls of the recess R3, and the horizontal surface 148 can be referred to as the bottom surface of the recess R3. In some embodiments, the surface 148 is horizontal and extends substantially in a (100) crystalline plane. On the other hand, each of the sidewalls 146 includes a first section 146A and a second section 146B extending below the first section 146A. In some embodiments, the slope of the first section 146A is lower than the slope of the second section 146B. Stated another way, the second section 146B is steeper than the first section 146A. In some other embodiments, the first section 146A extends substantially in a (111) crystalline plane, while the second section 146B extends substantially in a (110) crystalline plane. As a result, the recess R3 has a width that narrows as the recess R3 extends towards the substrate 100. In some embodiments, each of the semiconductor layers 145 has a substantial U-shape cross-section.

Figure 20A:
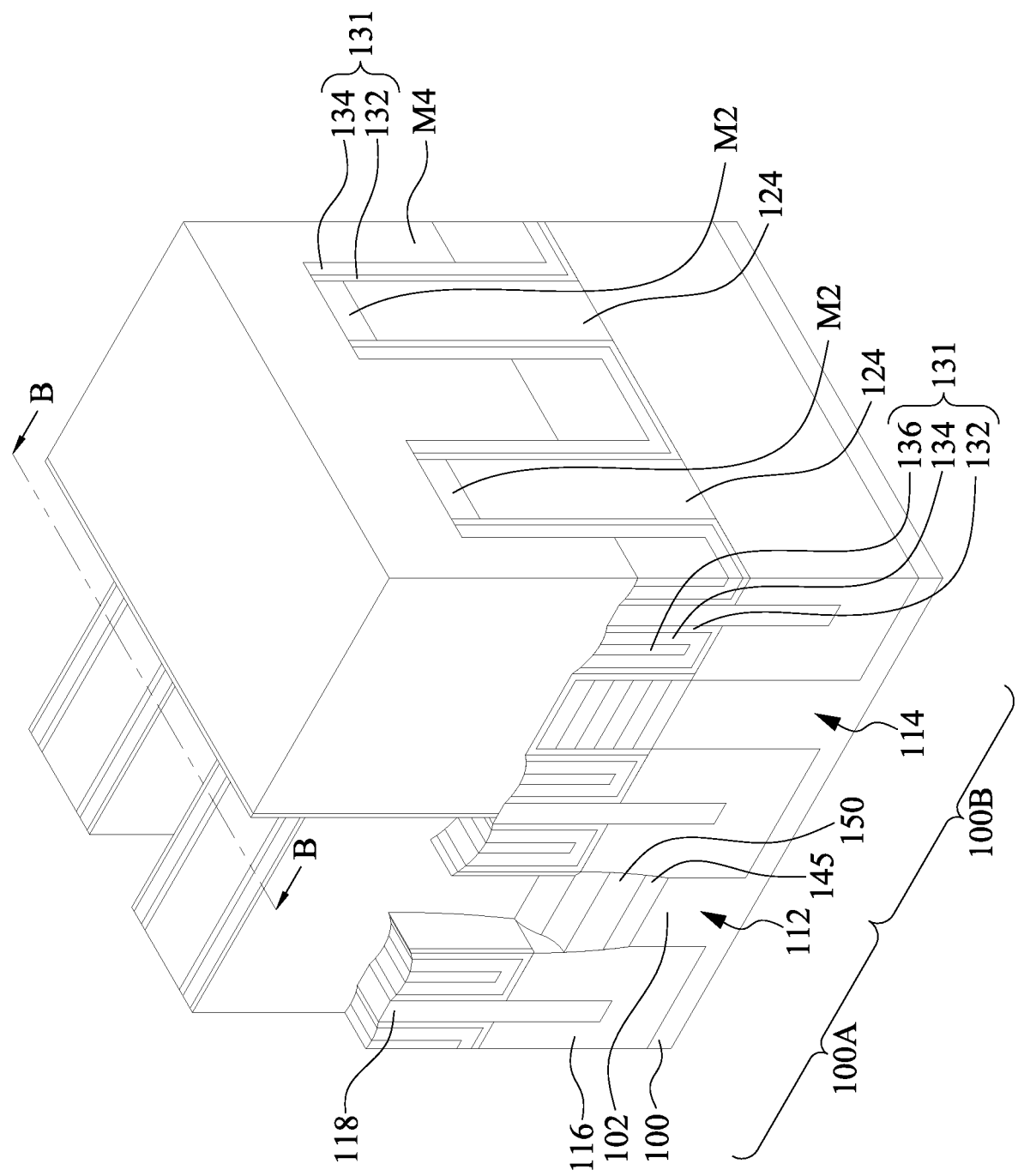
Figure 20B:
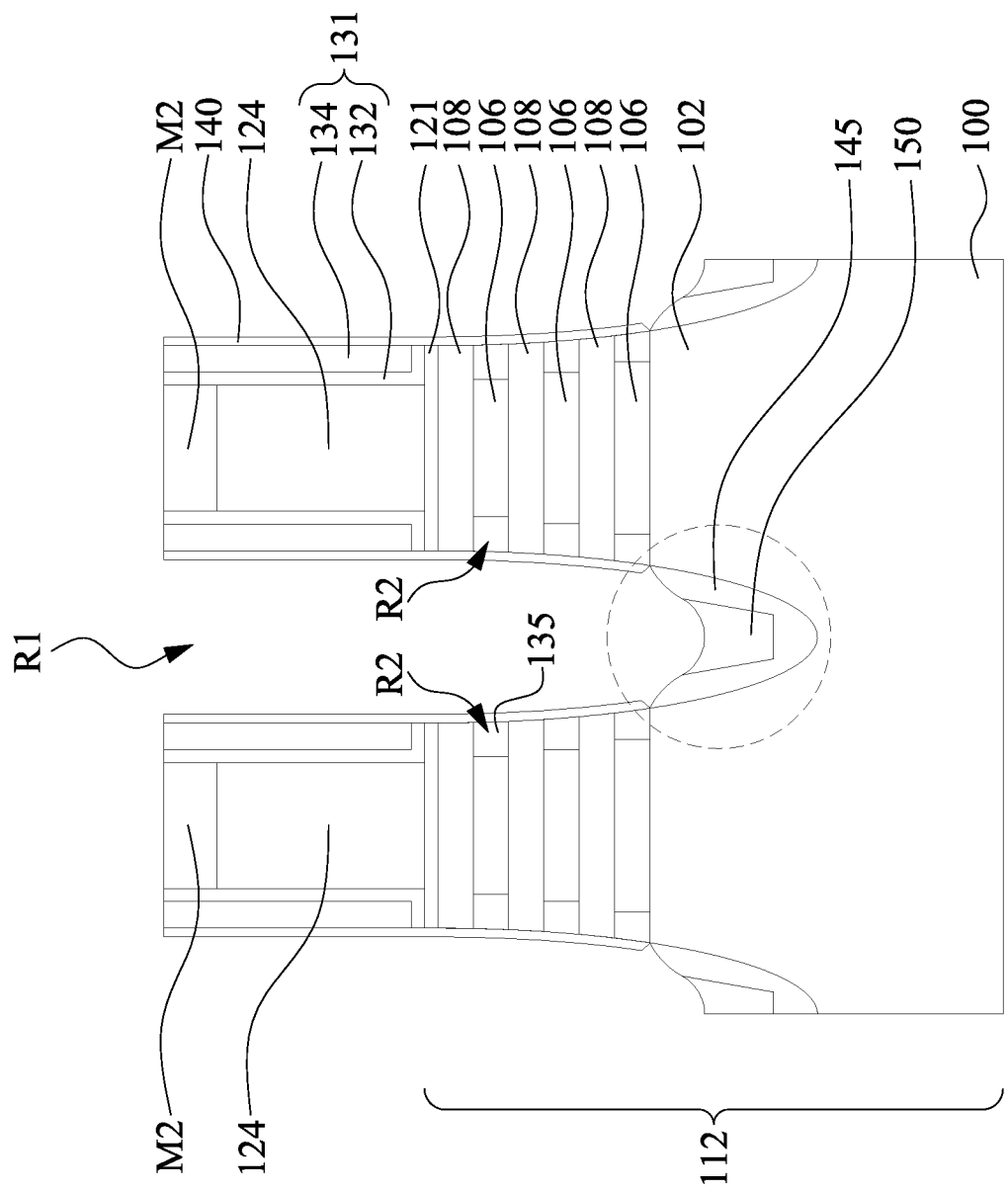

Reference is made to FIGS. 20A and 20B, in which FIG. 20B is a cross-sectional view along line B-B of FIG. 20A. A plurality of semiconductor layers 150 are epitaxially grown in the third recesses R3 of the semiconductor layers 145. In some embodiments, the semiconductor layers 150 are formed from a material different from the semiconductor layers 145. For example, the semiconductor layers 150 are made of silicon (Si), while the semiconductor layers 145 are made of SiGe. In some embodiments, the germanium (Ge) atomic concentration in the semiconductor layers 145 is greater that in the semiconductor layers 150. In some embodiments, the semiconductor layers 150 and the semiconductor layers 108 include the same material, such as silicon.

Figure 20C:
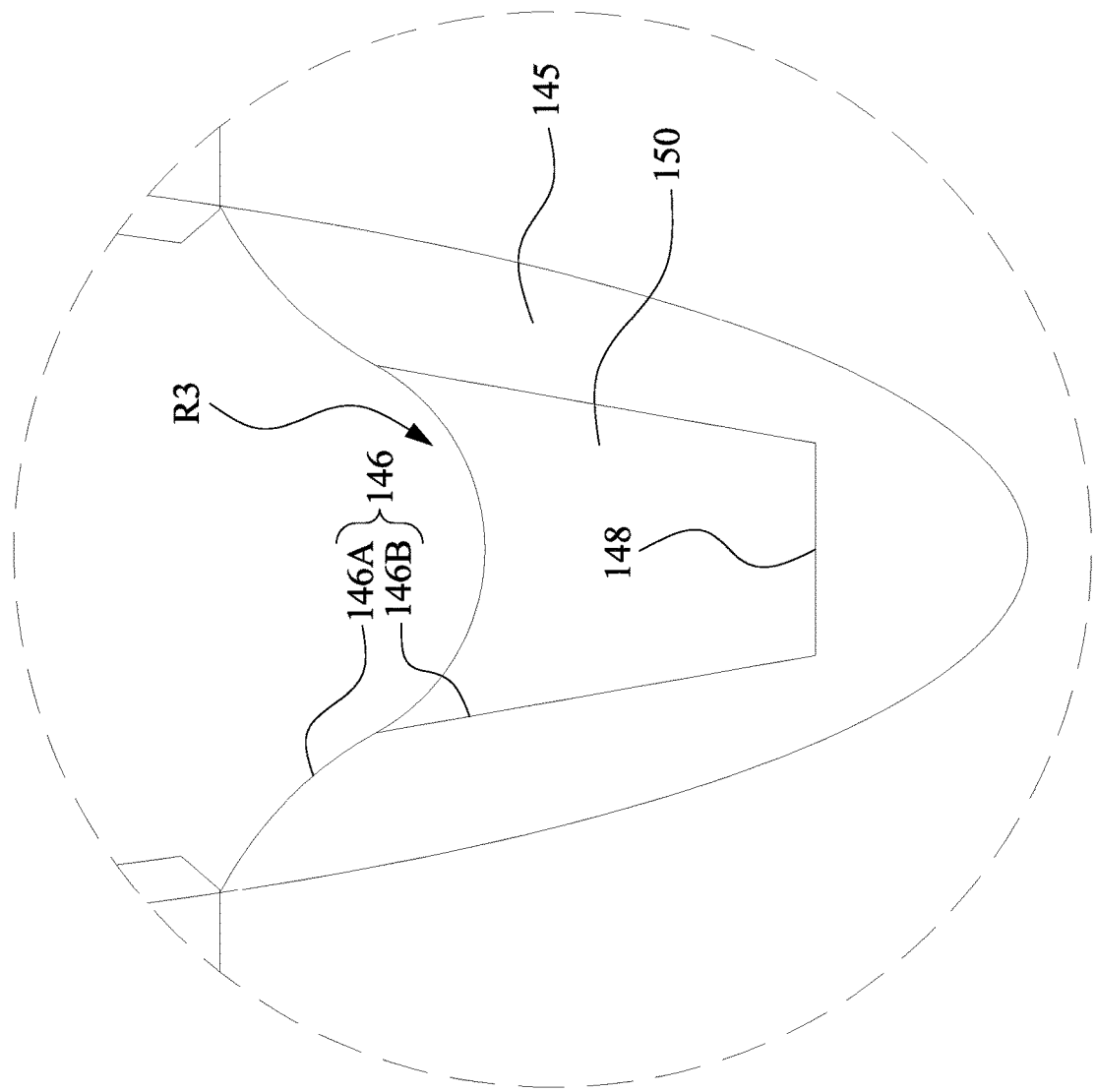

FIG. 20C is an enlarged view of one of the semiconductor layers 145 and the semiconductor layer 150 extending in the semiconductor layer 145. In some embodiments, the semiconductor layer 150 is selectively grown from the second section 146B of the inner sidewall 146 of the semiconductor layer 145 and the horizontal surface 148 of the semiconductor layer 145, instead of grown from the first section 146A of the inner sidewall 146 of the semiconductor layer 145. In greater detail, in some embodiments where the semiconductor layer 150 is formed from silicon, the silicon layer 150 has a higher growing rate on a (110) crystal plane than on a (111) crystal plane. This can be achieved by using different gas flow ratios such that the semiconductor material has a higher growing rate on a (110) crystal plane than on a (111) crystal plane. As mentioned above, in some embodiments, the first section 146A extends substantially in the (111) plane, and the second section 146B extends substantially in the (110) plane, and thus the silicon layer 150 tends to grow from the second section 146B rather than the first section 146A. Accordingly, after forming the semiconductor layer 145, the first section 146A of the inner sidewall of the semiconductor layer 145 remains uncovered by the semiconductor layer 150. In some embodiments, the topmost surface of the semiconductor layer 150 is lower than the topmost end of the semiconductor layer 145, and the bottommost surface of the semiconductor layer 150 is higher than the bottommost surface of the semiconductor layer 145.

Figure 21A:
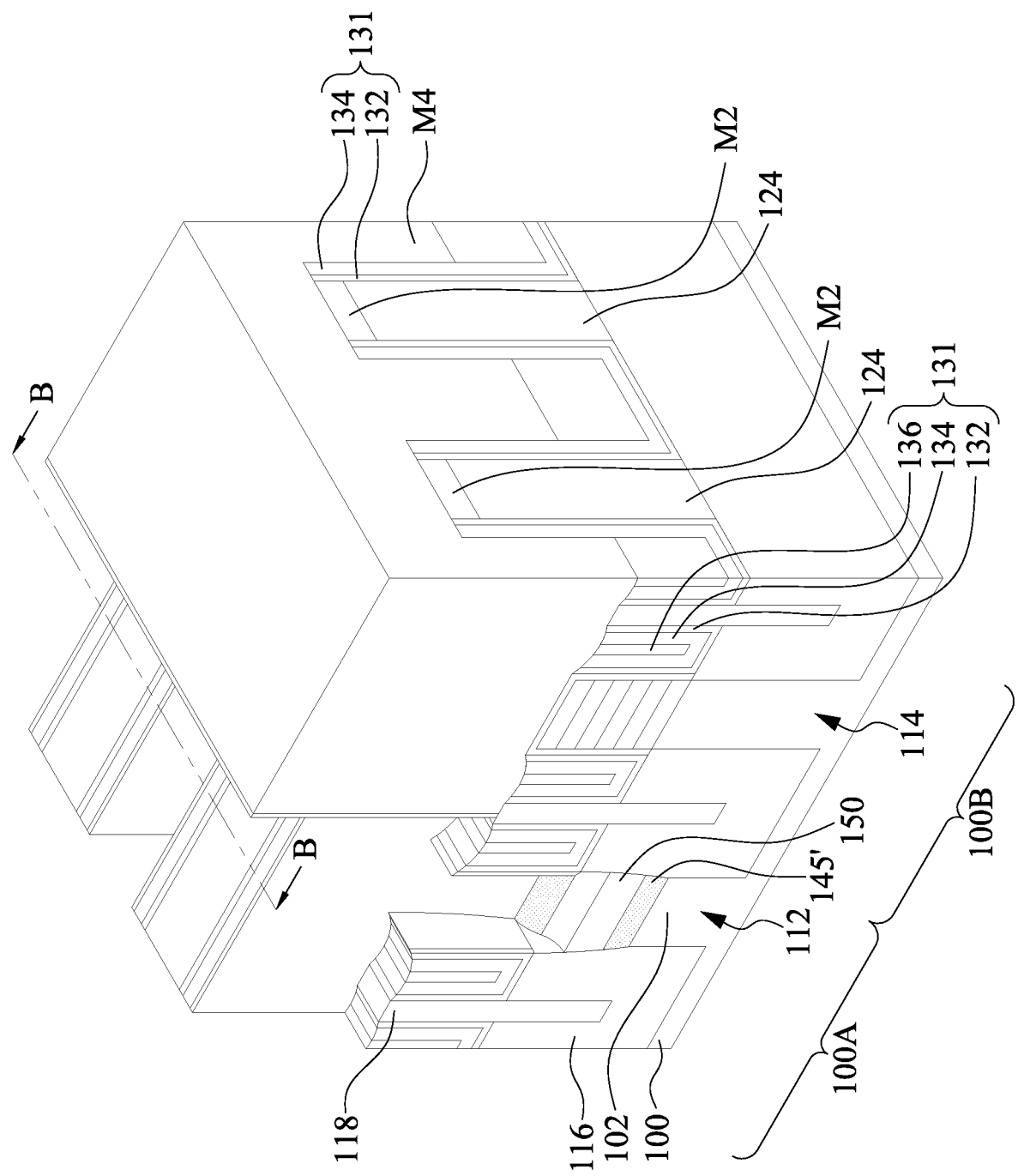
Figure 21B:
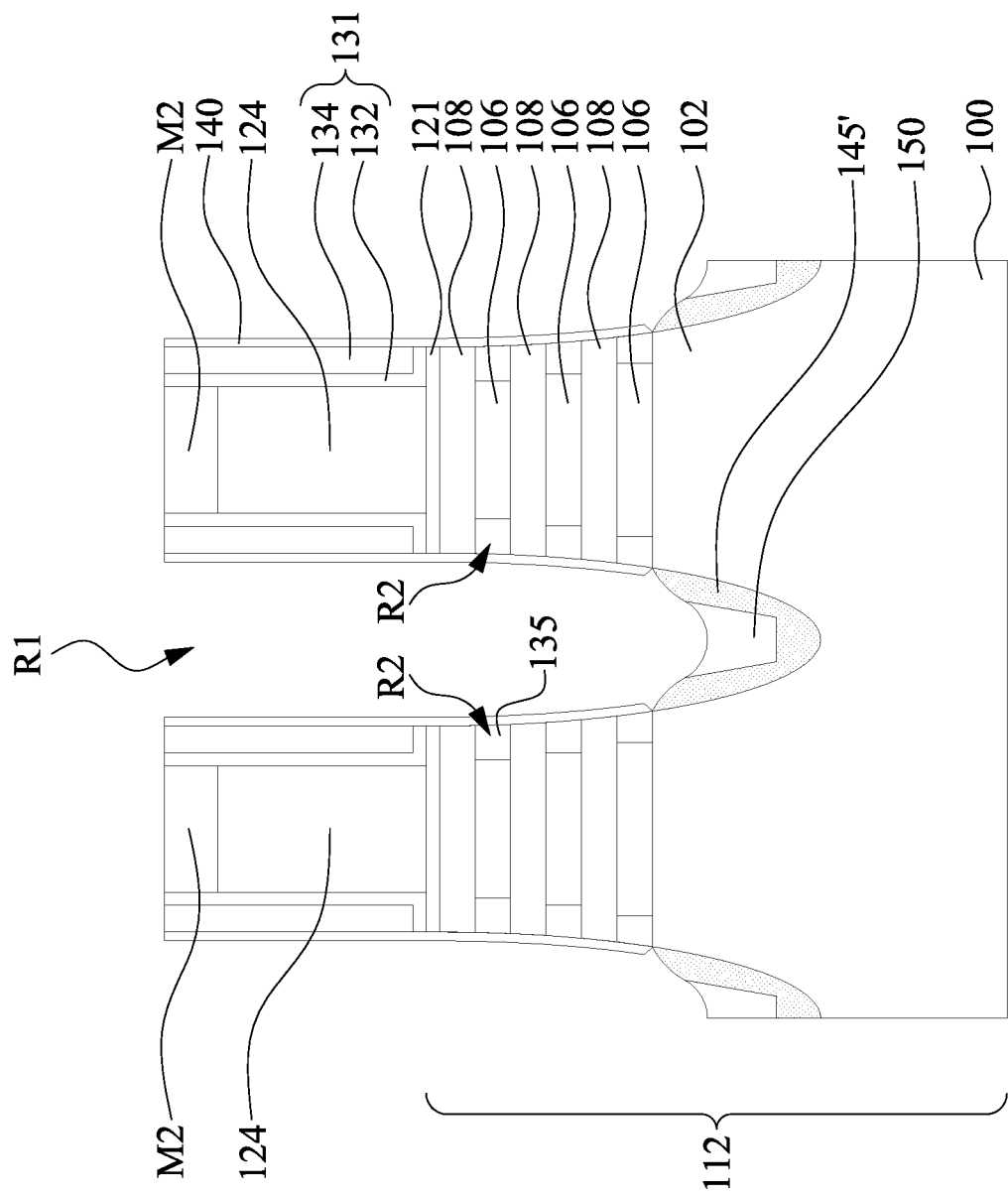

Reference is made to FIGS. 21A and 21B, in which FIG. 21B is a cross-sectional view along line B-B of FIG. 21A. The semiconductor layers 145 are oxidized, such that the semiconductor layers 145 are converted into a plurality of oxidized layers 145'. In some embodiments, the oxidized layers 122 can also be referred to as dielectric layers 145'. In some embodiments, the oxidized layers 122 may include an oxide of silicon germanium ($SiGeO_x$).

In some embodiments, the oxidation process may be referred to as a selective oxidation due to the different oxidation rates between the semiconductor layers 145 and 150, and thus some layers are oxidized while some are not oxidized. In some embodiments, the oxidation process may be a wet oxidation process, a thermal oxidation process, or a combination thereof. By way of example, in some embodiments where the semiconductor layers 145 include SiGe, and where semiconductor layers 150 includes Si, the faster SiGe oxidation rate (i.e., as compared to Si) ensures that the SiGe of the semiconductor layers 145 become substantially oxidized while minimizing or eliminating the oxidization of the semiconductor layers 150. It will be understood that any of the plurality of materials discussed above may be selected for each of the semiconductor layers that provide different suitable oxidation rates.

Figure 22A:
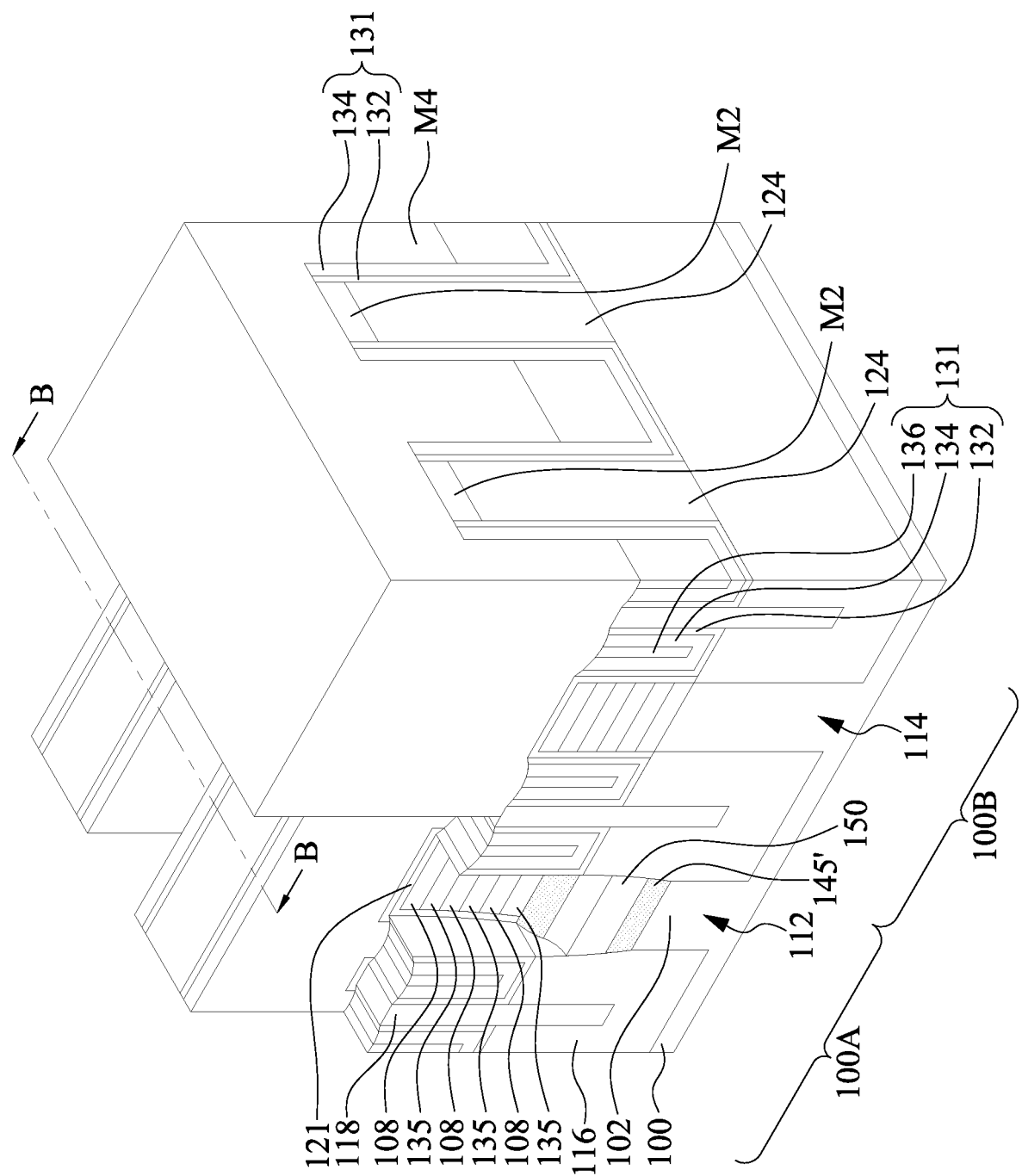
Figure 22B:
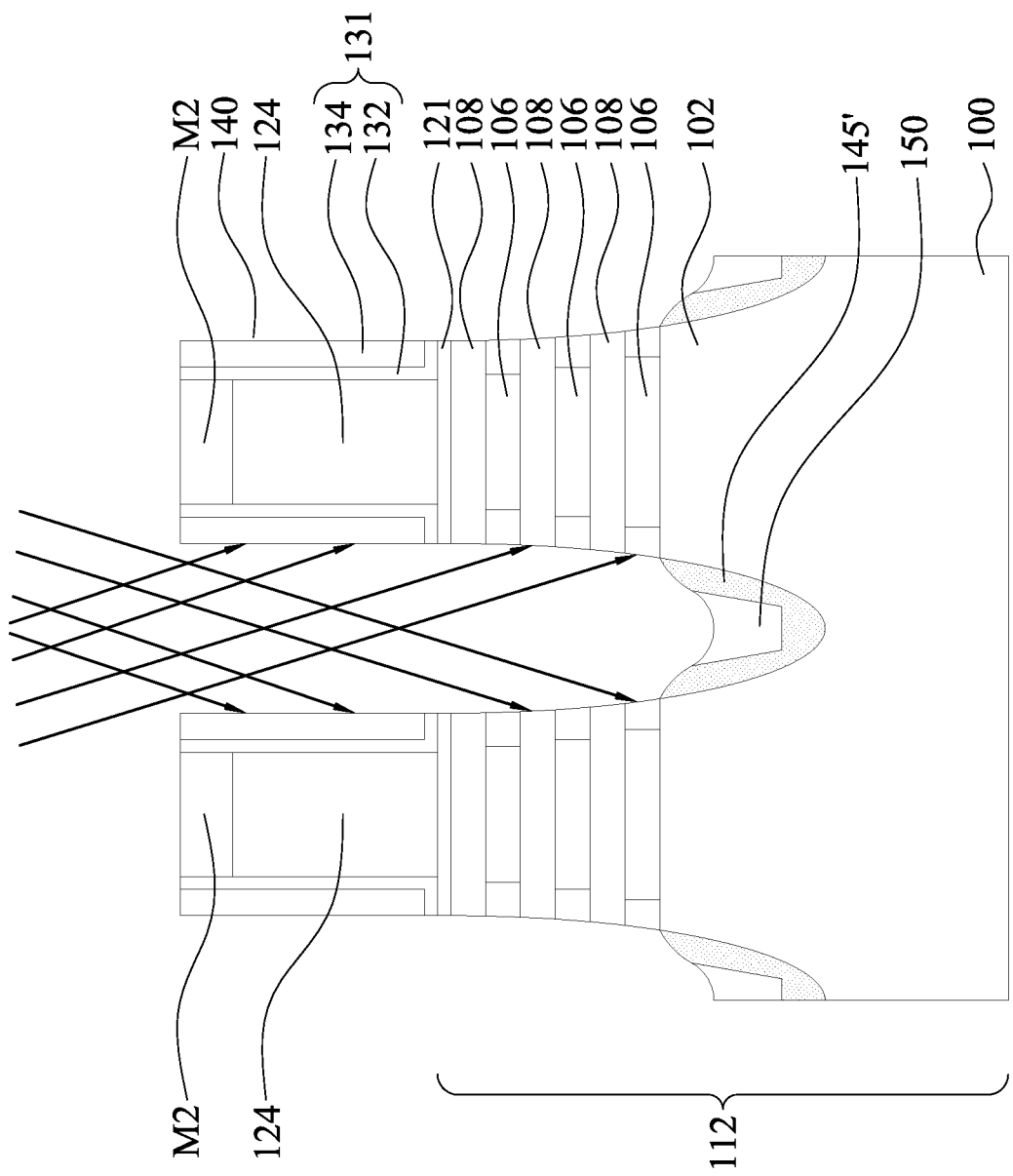

Reference is made to FIGS. 22A and 22B, in which FIG. 22B is a cross-sectional view along line B-B of FIG. 22A. The protective liner 140 is removed to expose the second semiconductor layers 108. The protective liner 140 can be removed by suitable process, such as an etching process. In some embodiments, the etching process may be a directional etching process, in which directional ions are directed to the wafer at oblique angles with respect to a perpendicular to the substrate 100. The arrows with dashed lines in FIG. 22B indicate the ion beams that are incident on the wafer. In greater detail, the ion beams are directed to the protective liner 140 (see FIG. 21B), while the spacers 131 and the dummy gate structures 124 block the incident ion beams such that the ion beams cannot reach the dielectric layers 145' and the semiconductor layers 150. Stated another way, the dielectric layers 145' and the semiconductor layers 150 are shadowed by the spacers 131 and the dummy gate structures 124, which will prevent the dielectric layers 145' and the semiconductor layers 150 from being etched. It is noted that the arrows with dashed lines in FIG. 22B are merely used to explain, and is not intended to limit the present disclosure.

Figure 23A:
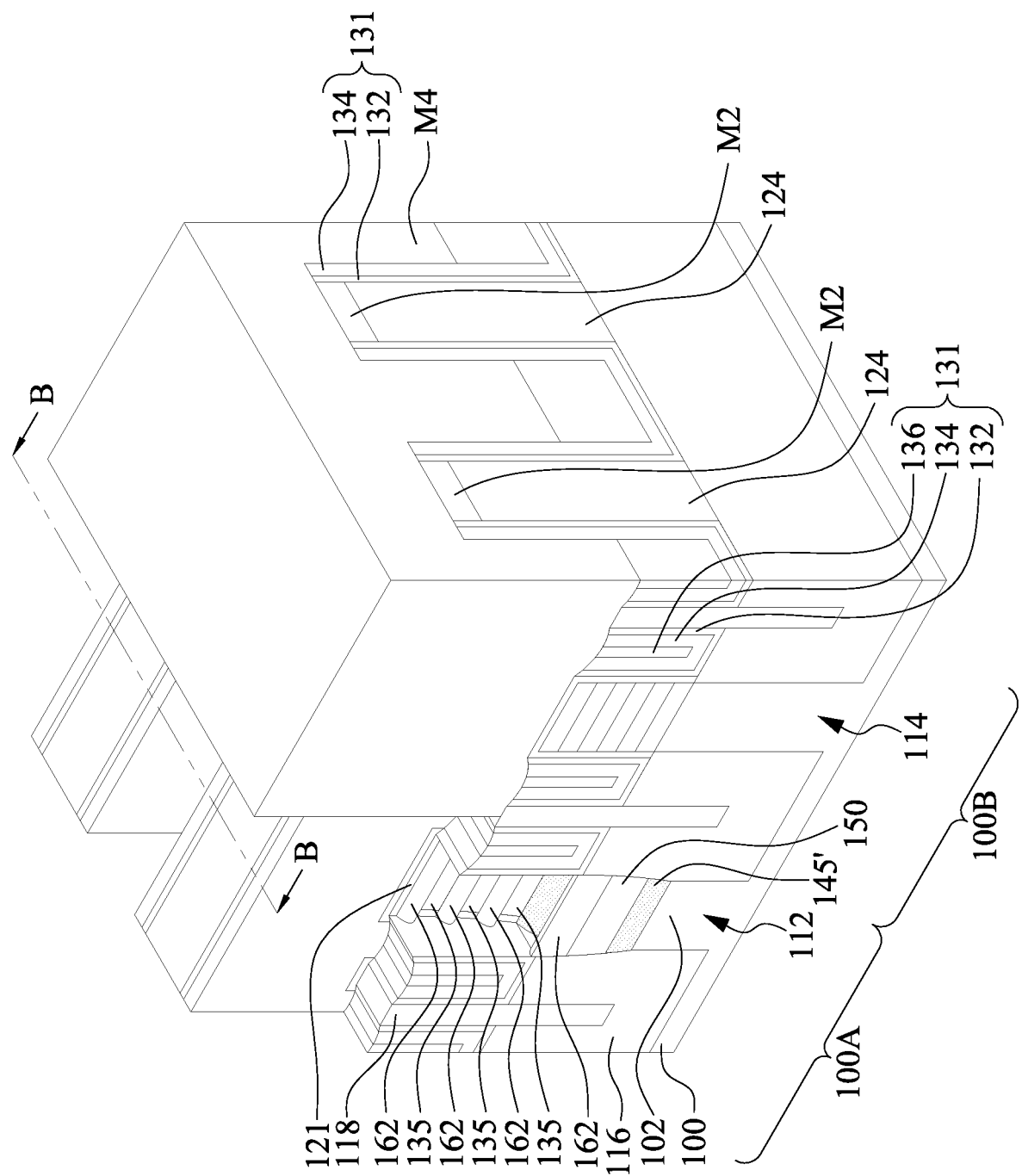
Figure 23B:
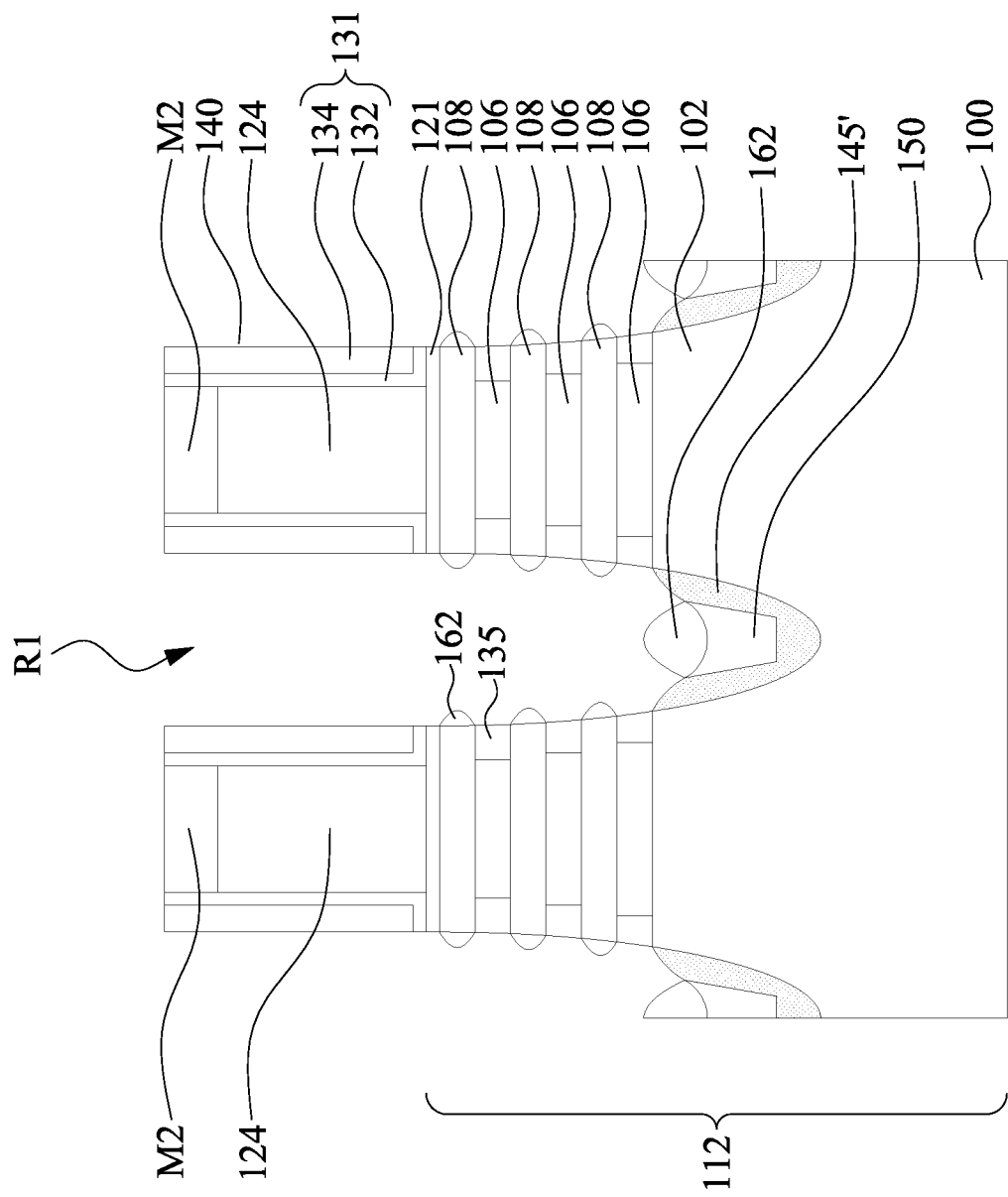

Reference is made to FIGS. 23A and 23B, in which FIG. 23B is a cross-sectional view along line B-B of FIG. 23A. A plurality of first source/drain epitaxial layers 162 are epitaxially grown on the semiconductor layers 108 and the semiconductor layers 150. In greater detail, the first source/drain epitaxial layers 162 are epitaxially grown by using the semiconductor layers 108 and the semiconductor layers 150 as seed layers. In some embodiments, the first source/drain epitaxial layers 162 are formed by selective epitaxial growth (SEG). For example, the source/drain epitaxial layers 162 has a higher growing rate on the semiconductor layers 108 and the semiconductor layers 150 than on the inner spacer layers 135 and the dielectric layers 145', which results in that the first epitaxial layers 162 are selectively grown on the semiconductor layers 108 and the semiconductor layers 150 but not on the inner spacer layers 135 and the dielectric layers 145'. Accordingly, after the first source/drain epitaxial layers 162 are formed, the inner spacer layers 135 and the dielectric layers 145' are still exposed to the recesses R1.

In some embodiments, the first source/drain epitaxial layers 162 may be a silicon-containing material. The deposition of the silicon-containing material 162 includes in-situ doping the silicon-containing material 162, in accordance with some embodiments. As the first region 100A is an N-type region. Accordingly, forming an n-type transistor can use an n-type doping precursor, e.g., phosphine (PH$_3$) and/or other n-type doping precursor. By using the in-situ doping process, the dopant profile of the silicon-containing material 162 can be desirably achieved. In some embodiments, the silicon-containing material 162 can be an n-type doped silicon layer that is doped with phosphorus (Si:P). In some embodiments, the silicon-containing material 162 can be an n-type doped silicon layer that is doped with both phosphorus and carbon (Si:CP). Carbon could impede the out-diffusion of phosphorus from the silicon-containing material 162. Other types of dopants may also be included. In some embodiments, the phosphorus dopant has a concentration in a range from about 0.1% to about 5% (atomic percent). In some embodiments, the carbon dopant has a concentration in a range from about 0.1% to about 5% (atomic percent). Because the epitaxial layers 162 will act as source/drain regions of transistors, and the semiconductor layers 150 are not used as the source/drain regions, the epitaxial layers 162 have a higher dopant concentration (e.g., higher n-type dopant concentration) than the semiconductor layers 150. For example, the semiconductor layers 150 may have no or negligible n-type dopants caused by unintentional thermal diffusion during, for example, a following anneal process performed to activate the n-type dopants. In some other embodiments, the first epitaxial layers 162 can be un-doped or slightly doped.

Figure 24A:
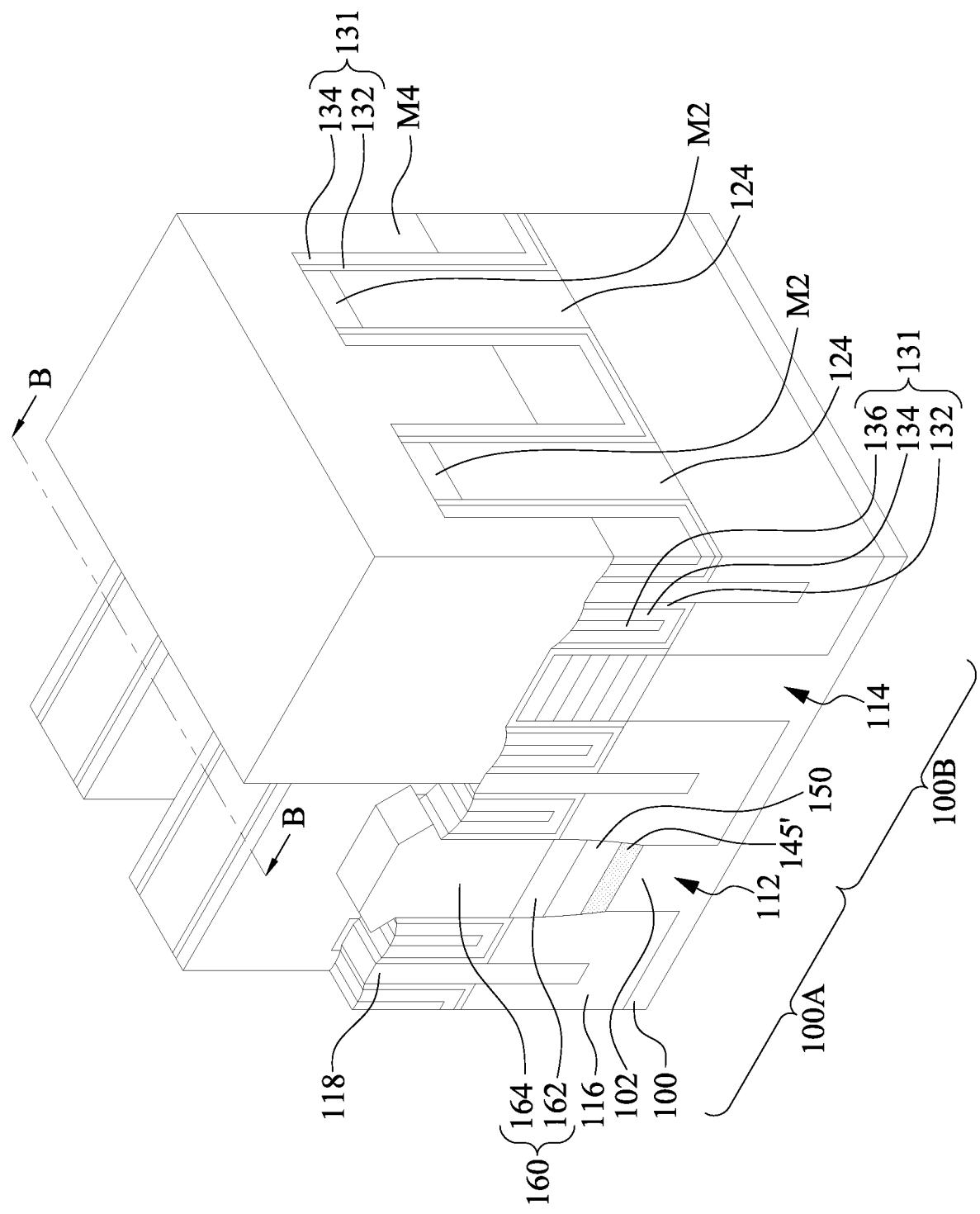
Figure 24B:
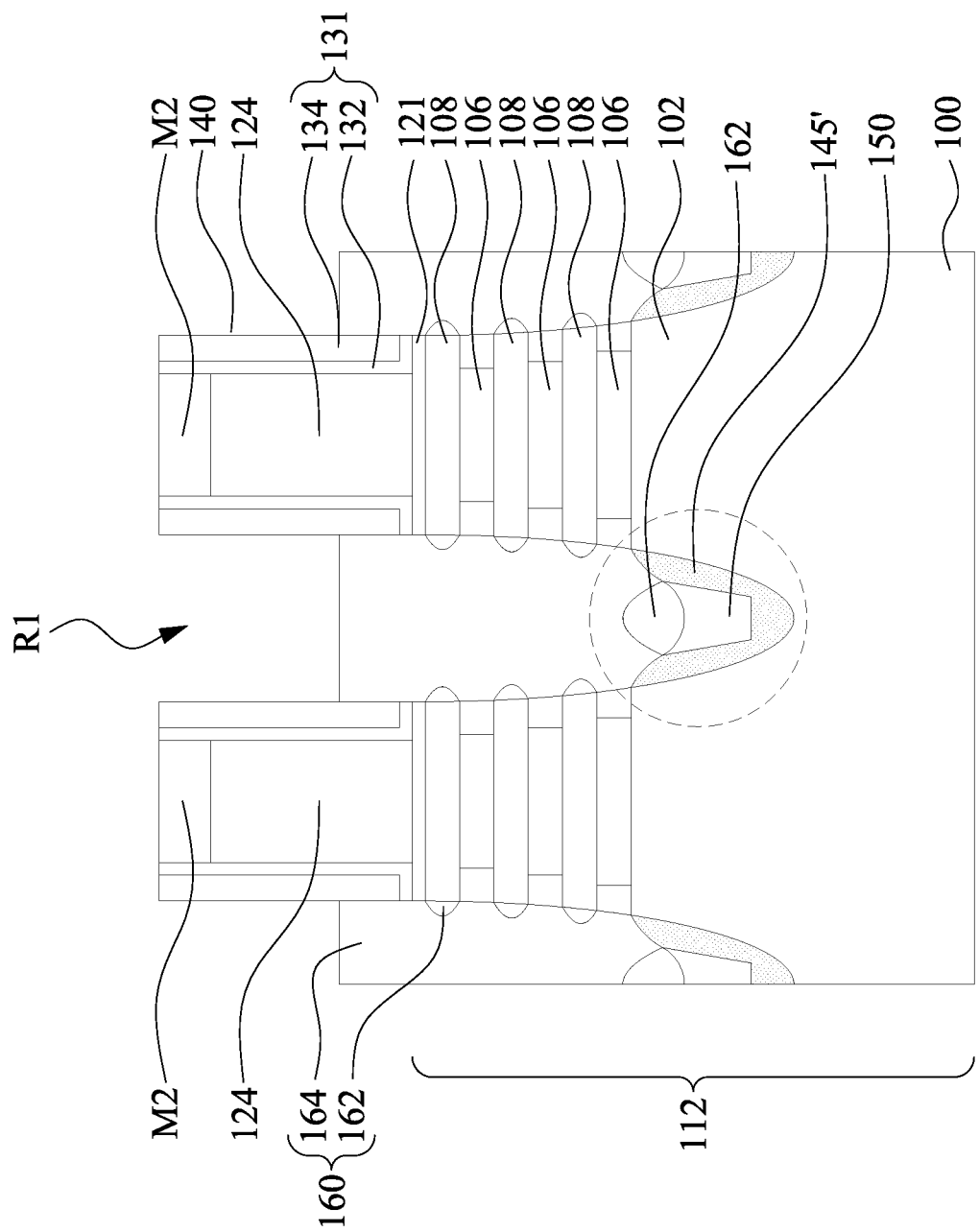

Reference is made to FIGS. 24A and 24B, in which FIG. 24B is a cross-sectional view along line B-B of FIG. 24A. A second source/drain epitaxial layer 164 is formed on the first source/drain epitaxial layers 162. In greater detail, the second source/drain epitaxial layer 164 is epitaxially grown by using the first source/drain epitaxial layers 162 as seed layers. In some embodiments, the second source/drain epitaxial layer 164 is formed by selective epitaxial growth (SEG). In some embodiments, the material and/or method of forming the second source/drain epitaxial layer 164 can be as same as or similar to those of the first source/drain epitaxial layers 162. For example, the second source/drain epitaxial layer 164 can be a silicon-containing material, such as Si:P or Si:CP. In some embodiments, the second source/drain epitaxial layer 164 may have a dopant concentration different from that of the first source/drain epitaxial layers 162. For example, the second source/drain epitaxial layer 164 may include higher dopant concentration (e.g., higher n-type dopant concentration) than the first source/drain epitaxial layers 162. The first source/drain epitaxial layers 162 and the second source/drain epitaxial layer 164 can be collectively referred to as source/drain epitaxy structures 160.

Referring to FIG. 24A, the semiconductor layers 150 and dielectric layers 145' are in contact with the isolation structures 116. The top surfaces of the semiconductor layers 150 and the dielectric layers 145' are lower than a bottom surface of the dummy gate structures 124 (as well as the metal gate structures 170 and 270 of FIG. 32A).

Figure 24C:
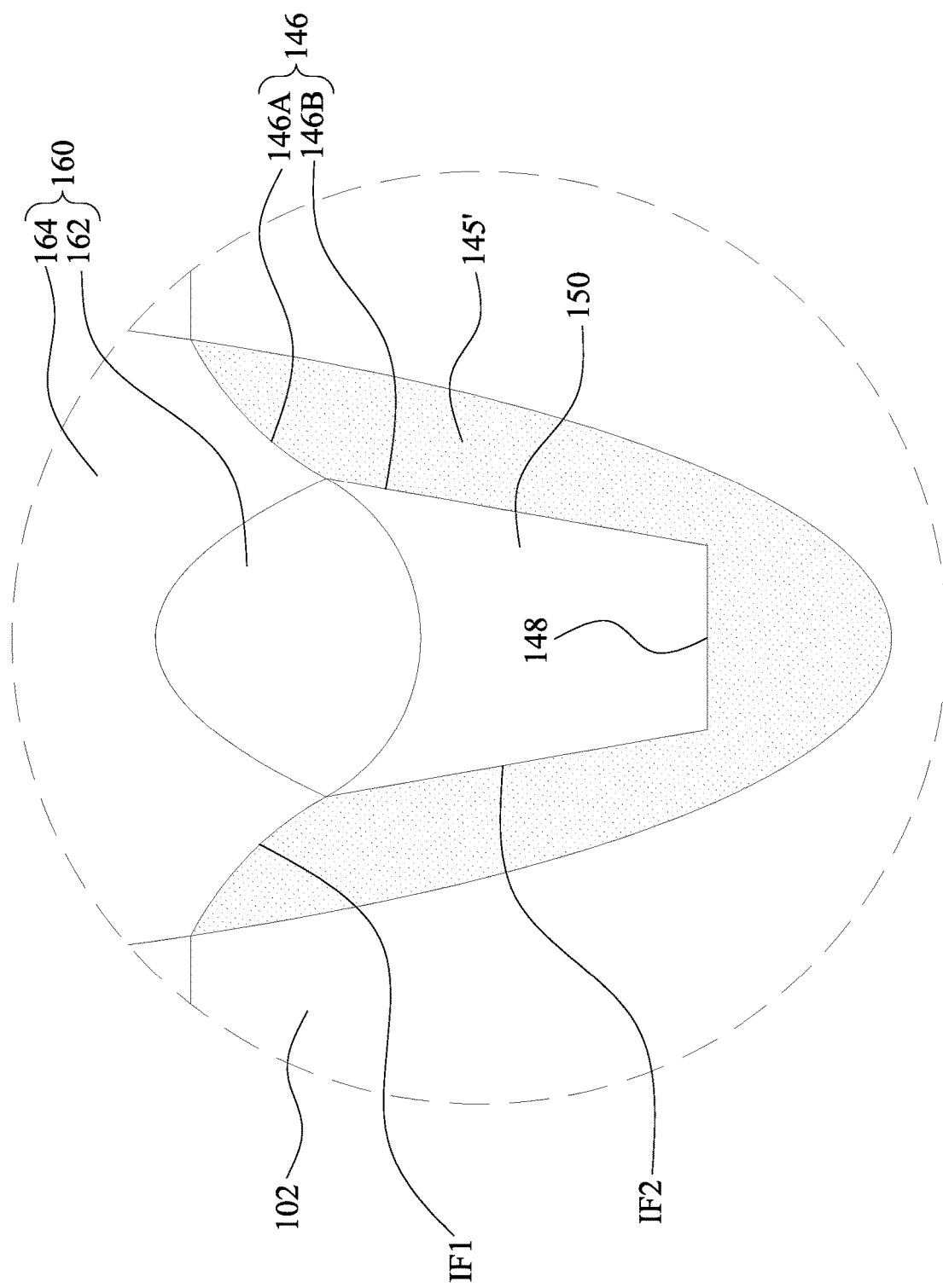

FIG. 24C is an enlarged view of FIG. 24B. In some embodiments, the source/drain epitaxy structures 160 are in contact with the inner spacer layer 135, the dielectric layer 145', and the semiconductor layer 150. In some embodiments, the source/drain epitaxy structure 160 is in contact with the first section 146A of the inner sidewalls of the dielectric layer 145'. The first section 146A of the sidewall 146 of the oxidized layer 145' forms an interface IF1 with the epitaxy structure 160. On the other hand, the second section 146B of the sidewall 146 of the oxidized layer 145' forms an interface IF2 with the semiconductor layer 150. In some embodiments, the first interface IF1 extends upwardly from the second interface IF2, and the slope of the first interface IF1 is lower than a slope of the second interface IF2.

The bottom surface of the epitaxy structure 160 is lower than a top surface of the base portion 102 of the first fin structure 112. The semiconductor layer 150 and the epitaxy structure 160 are spaced from the base portion 102 of the first fin structure 112 by the dielectric layer 145'. The semiconductor layer 150 is between the dielectric layer 145' and the epitaxy structure 160. In some embodiments, the top surface of the semiconductor layer 150 is in contact with the epitaxy structure 160, and opposite sidewalls of the semiconductor layer 150 are in contact with the dielectric layer 145'. In some embodiments, the topmost surface of the semiconductor layer 150 is lower than a topmost surface of the dielectric layer 145'.

In some embodiments, the semiconductor layer 150 has a width in a range from about 5 nm to about 20 nm, and has height in a range from about 5 nm to about 40 nm. In some embodiments, the dielectric layer 145' has a width in a range from about 1 nm to about 5 nm, and has height in a range from about 5 nm to about 50 nm.

According to some embodiments, the semiconductor layers 150 are formed in the bottom of the recesses R1, the semiconductor layers 150 can act as seed layers for growing the epitaxy structures 160, and thus the epitaxy structures 160 can start to grow from the bottom of the recesses R1, thus reducing voids formed at bottoms of the recesses R1 and improving the size of the epitaxy structures 160. In some other embodiments where the semiconductor layers 150 are omitted, because there is no seed layer for growing the epitaxy structures 160, voids (i.e., air gaps) may be formed at bottoms of the recesses R1, which might reduce the size of the epitaxy structures 160. On the other hand, the dielectric layers 145' can act as isolation structures between two adjacent fin structures 112, which can prevent punch-through effect (i.e., leakage current from one epitaxy structure 160 to another through the base portion 102 of the first fin structure 112) between two adjacent epitaxy structures 160.

Figure 25:
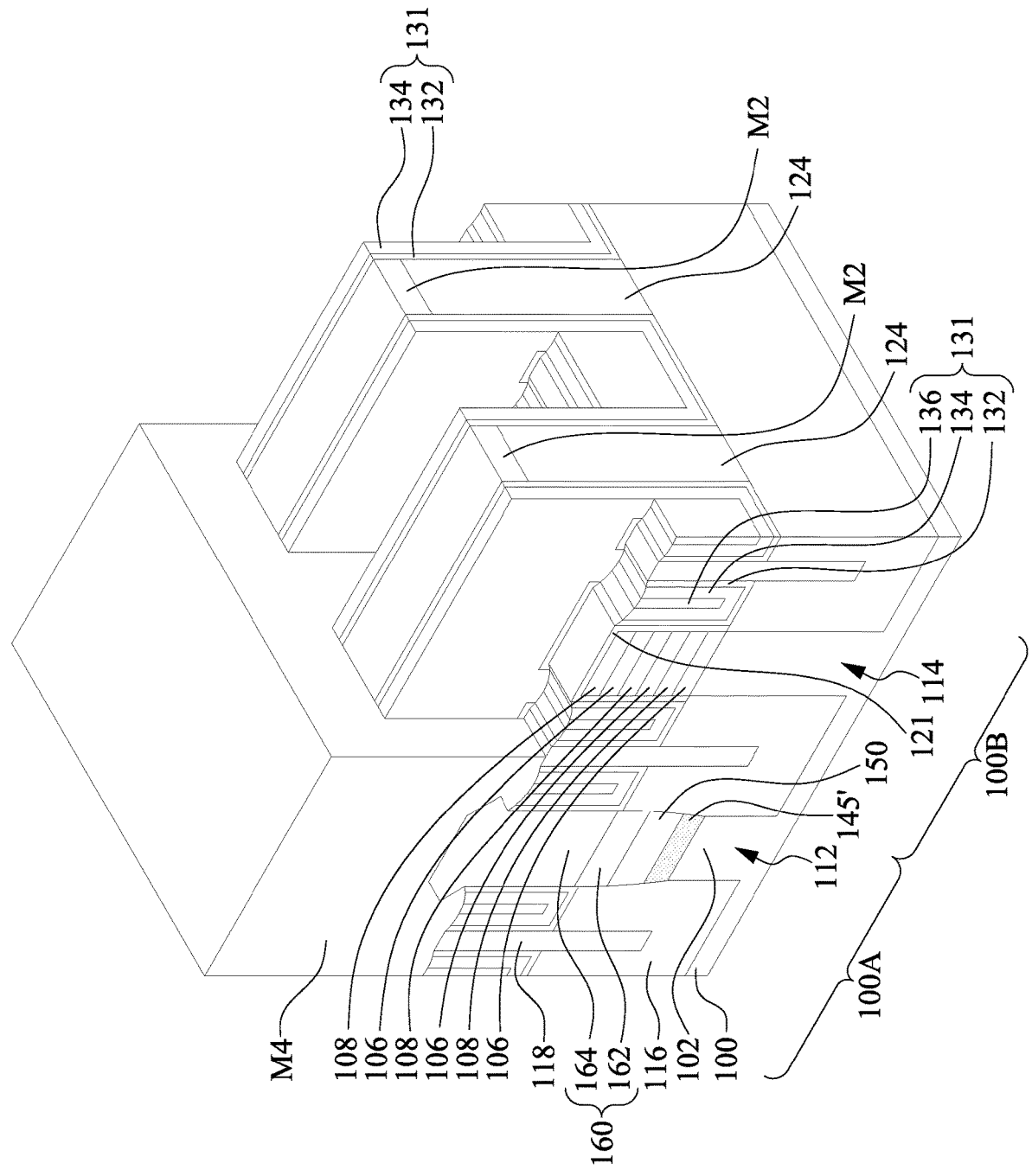

Reference is made to FIG. 25. The patterned mask M4 is removed to expose the second region 100B of the substrate 100, and a patterned mask M4 is formed covering the first region 100A of the substrate 100. As a result, the second fin structure 114 is uncovered by the patterned mask M4. In some embodiments, the patterned mask M4 may be a photoresist layer.

Figure 26A:
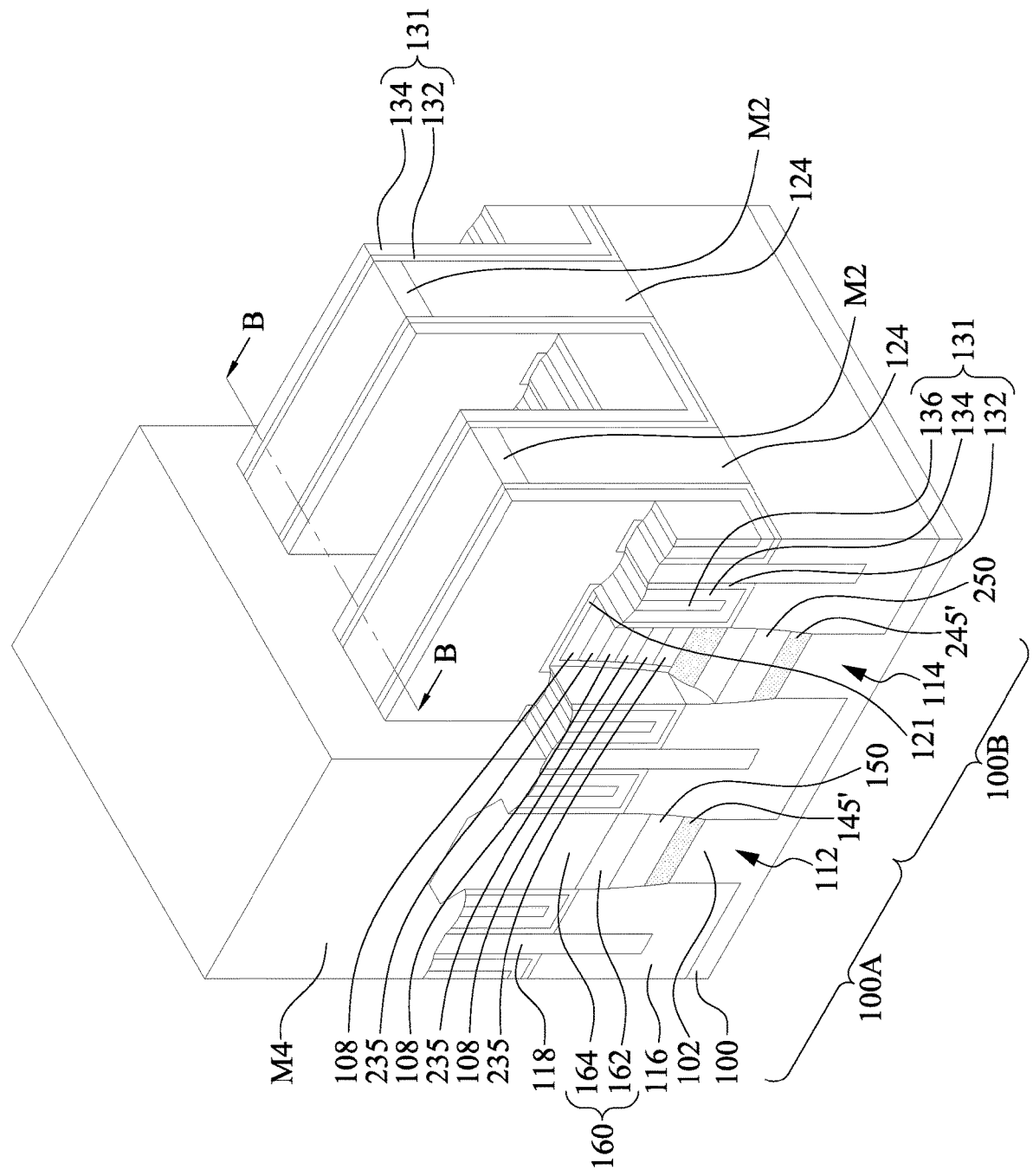
Figure 26B:
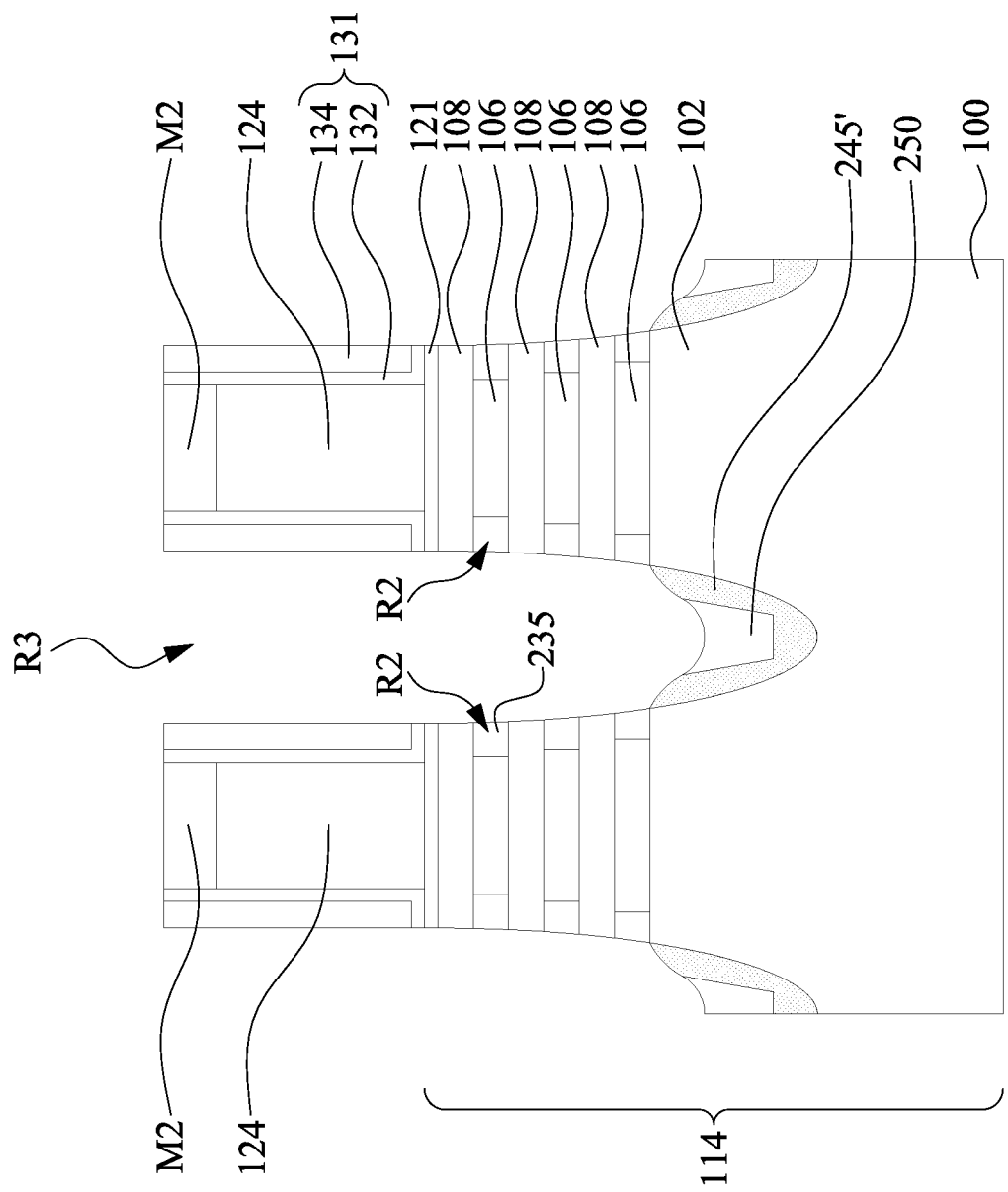

Reference is made to FIGS. 26A and 26B, in which FIG. 26B is a cross-sectional view along line B-B of FIG. 26A. The second region 100B of the substrate 100 undergoes the same or similar processes as described in FIGS. 13A to 22B with respect to the first region 100A of the substrate 100. For example, the gate dielectric layer 121 is removed, and the second fin structure 114 is etched to form a plurality of recesses R3. Then, an inner spacer layer 235, dielectric layers 245', and semiconductor layers 250 are formed. The materials and/or methods of forming the inner spacer layer 235, the dielectric layers 245', and the semiconductor layers 250 can be as same as or similar to those of the inner spacer layer 135, the dielectric layers 145', and the semiconductor layers 150, respectively, and thus relevant details are omitted for simplicity.

Figure 27A:
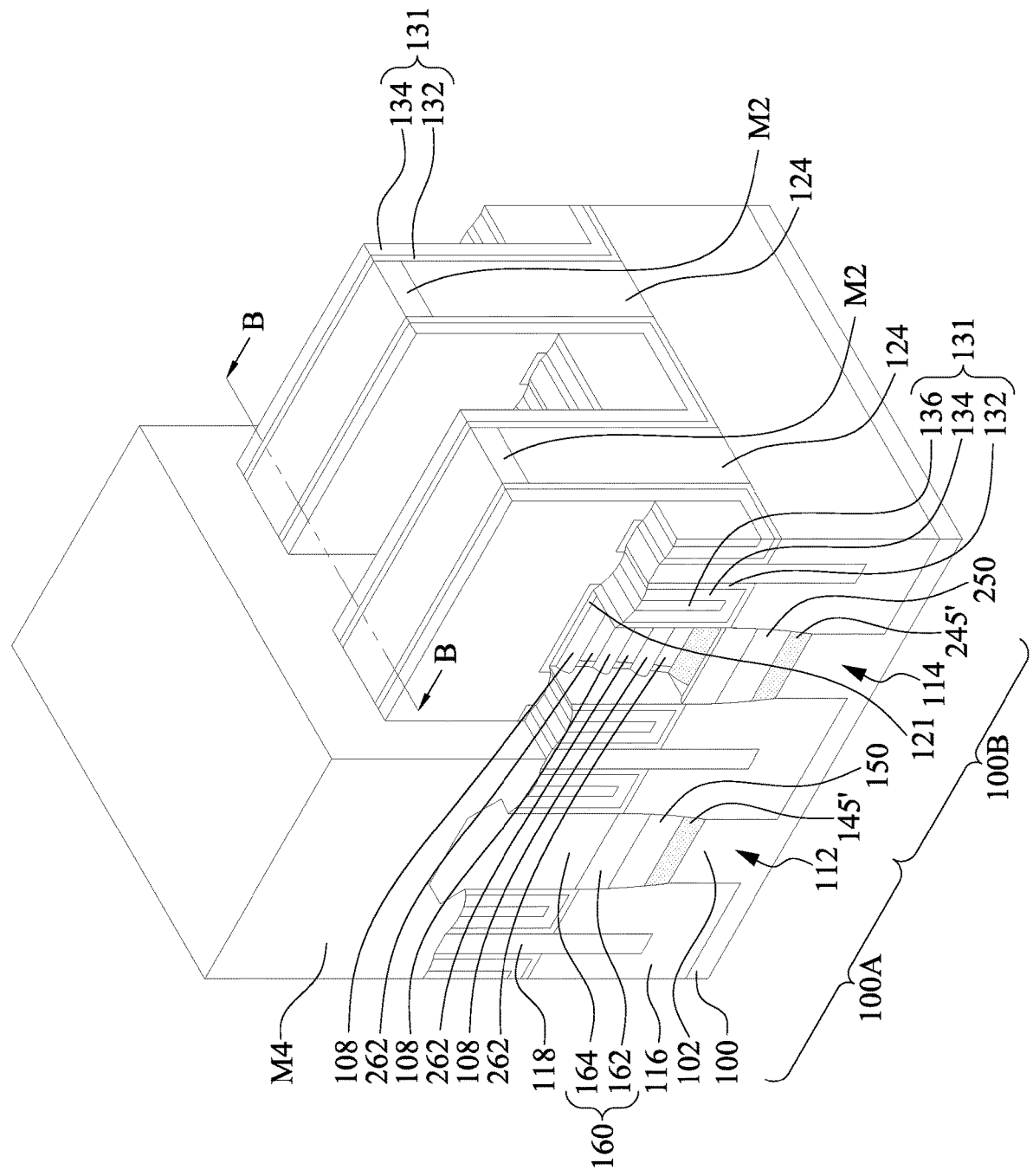
Figure 27B:
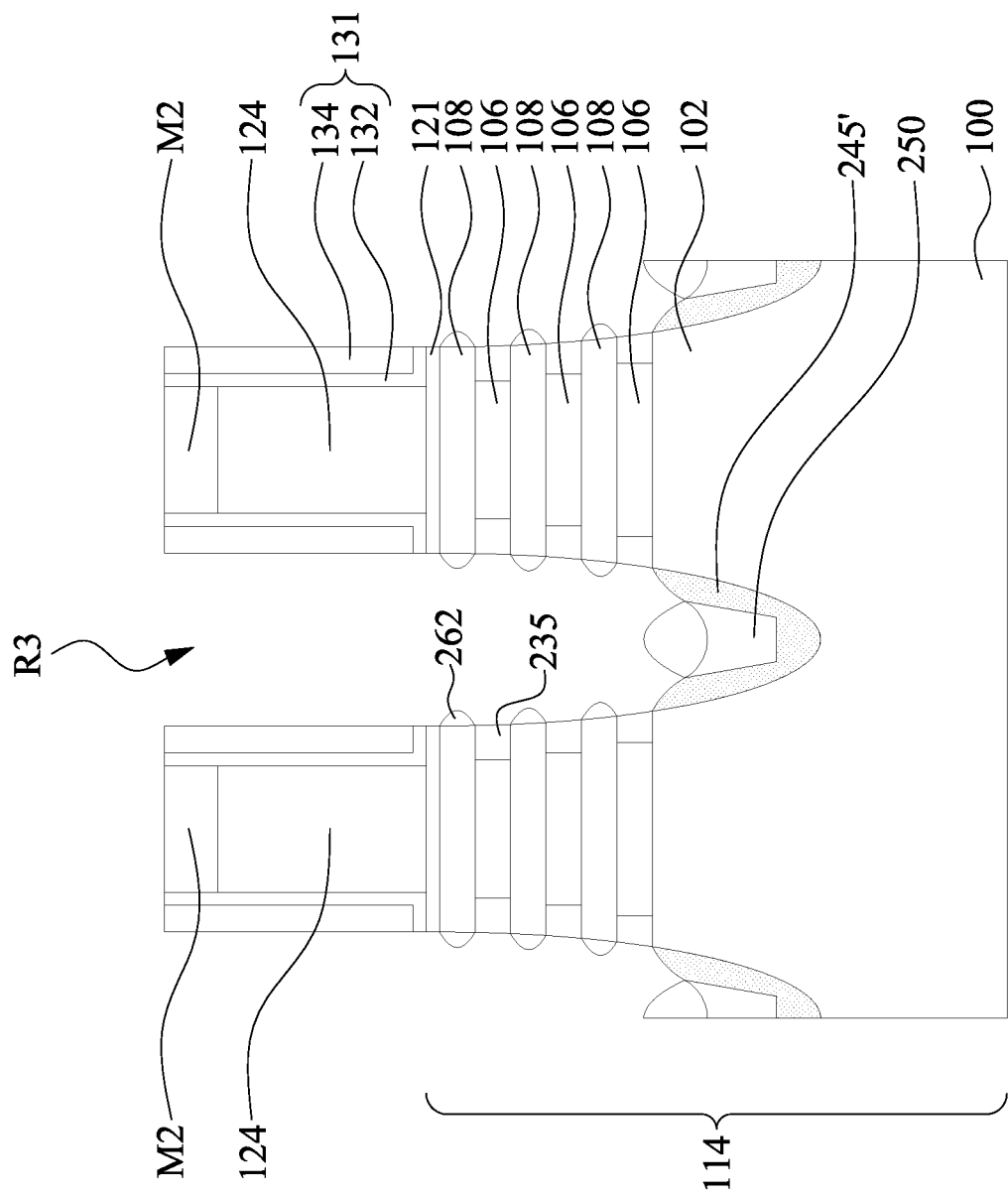

Reference is made to FIGS. 27A and 27B, in which FIG. 27B is a cross-sectional view along line B-B of FIG. 27A. A plurality of first source/drain epitaxial layers 262 are epitaxially grown on the semiconductor layers 108 and the semiconductor layers 250. In greater detail, the first source/drain epitaxial layers 262 are epitaxially grown by using the semiconductor layers 108 and the semiconductor layers 250 as seed layers. In some embodiments, the first source/drain epitaxial layers 262 are formed by selective epitaxial growth (SEG).

In some embodiments, the first source/drain epitaxial layers 262 may be a silicon-containing material. The deposition of the silicon-containing material 262 includes in-situ doping the silicon-containing material 262, in accordance with some embodiments. As the second region 100B is a P-type region. Accordingly, forming an p-type transistor can use an p-type doping precursor, e.g., $B_2H_6$ and/or other p-type doping precursor. In some embodiments, the first source/drain epitaxial layers 262 may be silicon germanium (SiGe). The process gases may include Hz, $N_2$, dichlorosilane (DCS), $SiH_4$, $GeH_4$, and/or the like. In some other embodiments, the first source/drain epitaxial layers 262 can be un-doped or slightly doped.

Figure 28A:
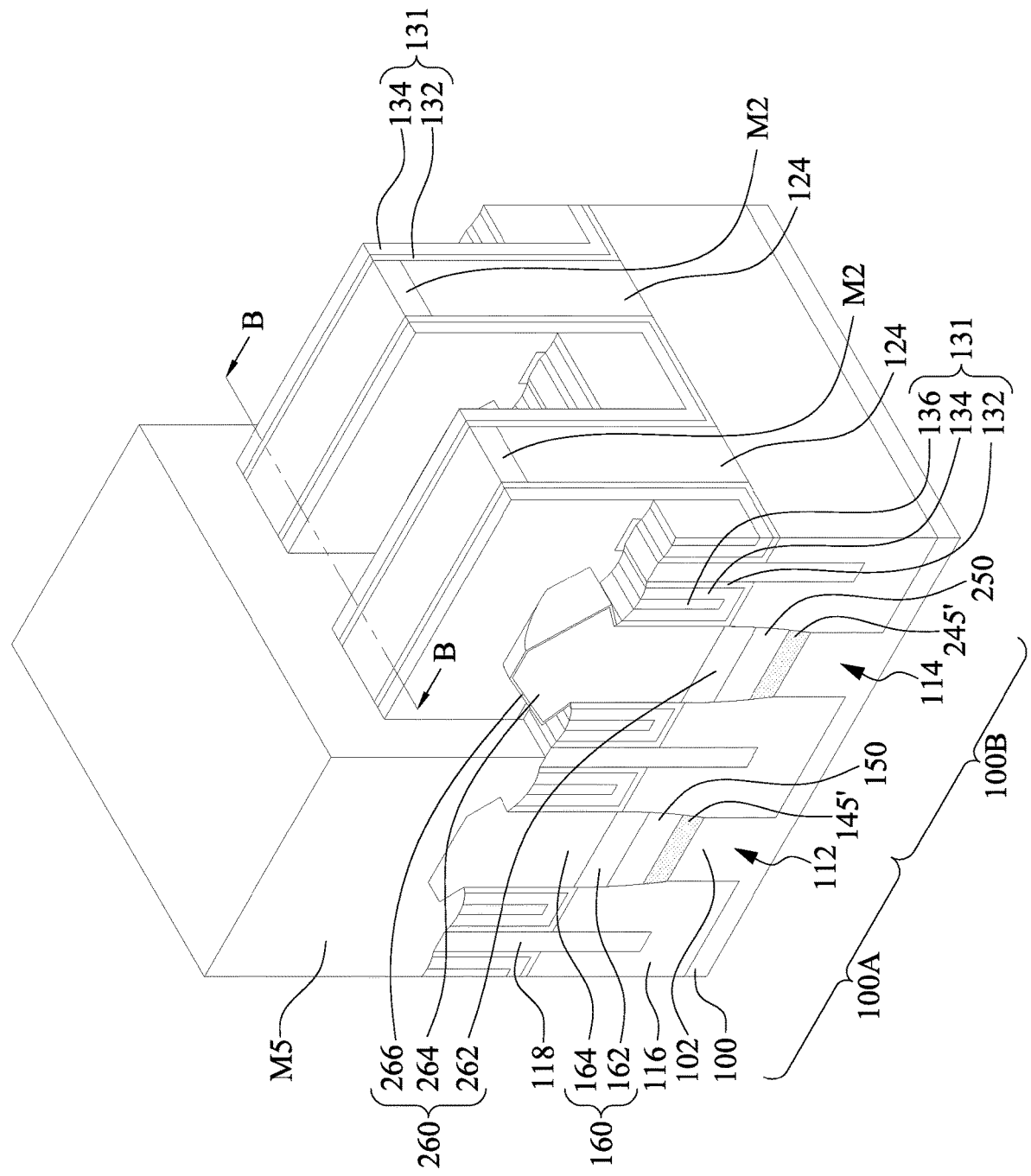
Figure 28B:
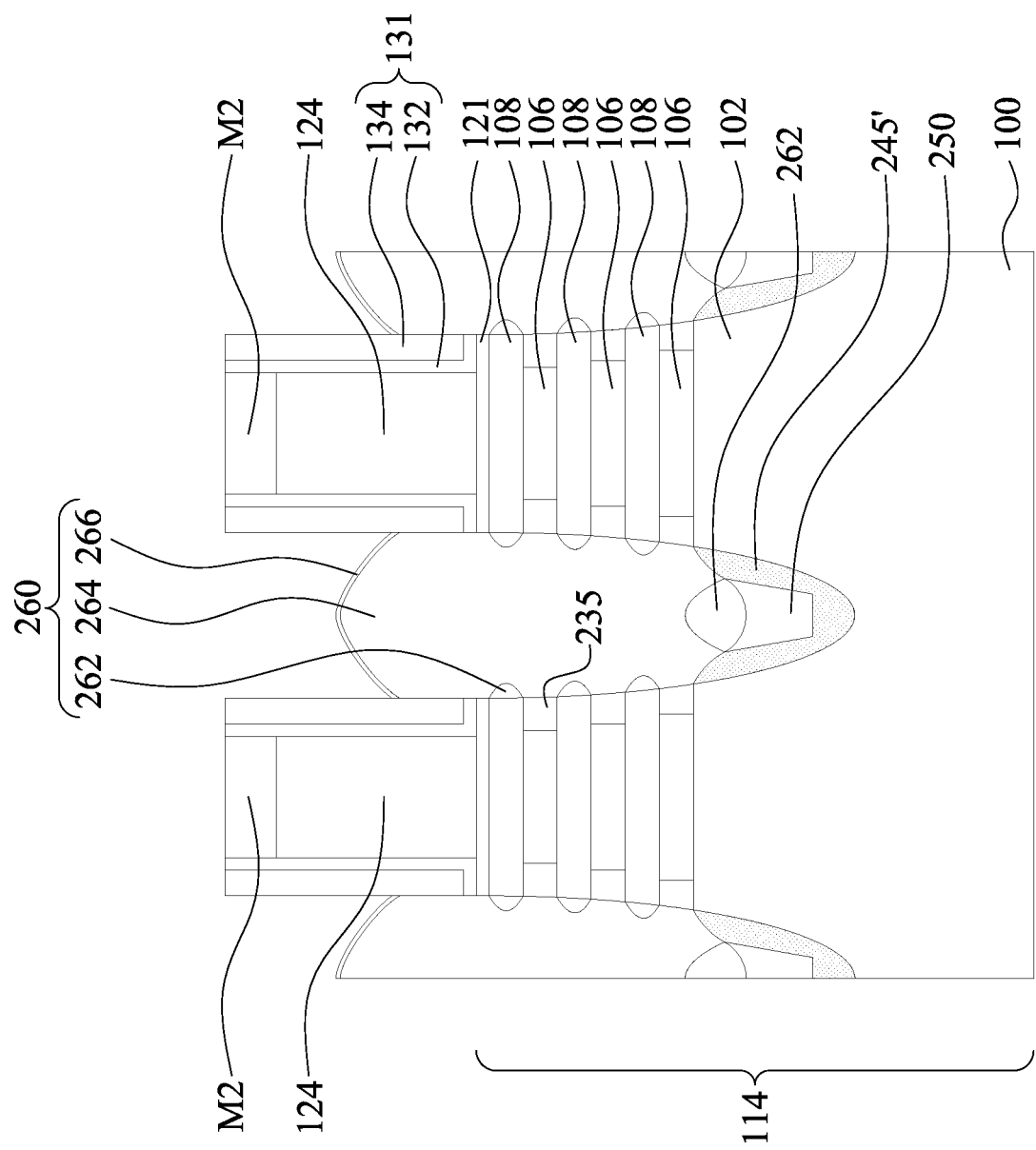

Reference is made to FIGS. 28A and 28B, in which FIG. 28B is a cross-sectional view along line B-B of FIG. 28A. A plurality of second source/drain epitaxial layers 264 are formed on the first source/drain epitaxial layers 262, and a plurality of third source/drain epitaxial layers 266 are formed on the second source/drain epitaxial layers 264. In greater detail, the second source/drain epitaxial layers 264 and the third source/drain epitaxial layers 266 are epitaxially grown. In some embodiments, the second source/drain epitaxial layers 264 and the third source/drain epitaxial layers 266 are formed by selective epitaxial growth (SEG). In some embodiments, the material and/or method of forming the second source/drain epitaxial layers 264 and the third source/drain epitaxial layers 266 can be as same as or similar to those of the first source/drain epitaxial layers 262. For example, the second source/drain epitaxial layers 264 and the third source/drain epitaxial layers 266 can be SiGe with p-type dopants. In some embodiments, the second source/drain epitaxial layers 264 and the third source/drain epitaxial layers 266 may have a dopant concentration different from that of the first epitaxial layers 162. For example, the second source/drain epitaxial layers 264 may include higher dopant concentration than the first source/drain epitaxial layers 262, and the third source/drain epitaxial layers 266 may include higher dopant concentration than the second source/drain epitaxial layers 264, The first source/drain epitaxial layers 262, the second source/drain epitaxial layers 264, and the third epitaxial layers 266 can be collectively referred to as epitaxy structures 260 (or source/drain structure 260). The relationship between the epitaxy structures 260, the dielectric layer 245' and the semiconductor layers 250 are similar to those described with respect to the epitaxy structures 160, the dielectric layer 145' and the semiconductor layers 150, and thus relevant details are omitted for simplicity.

Figure 29:
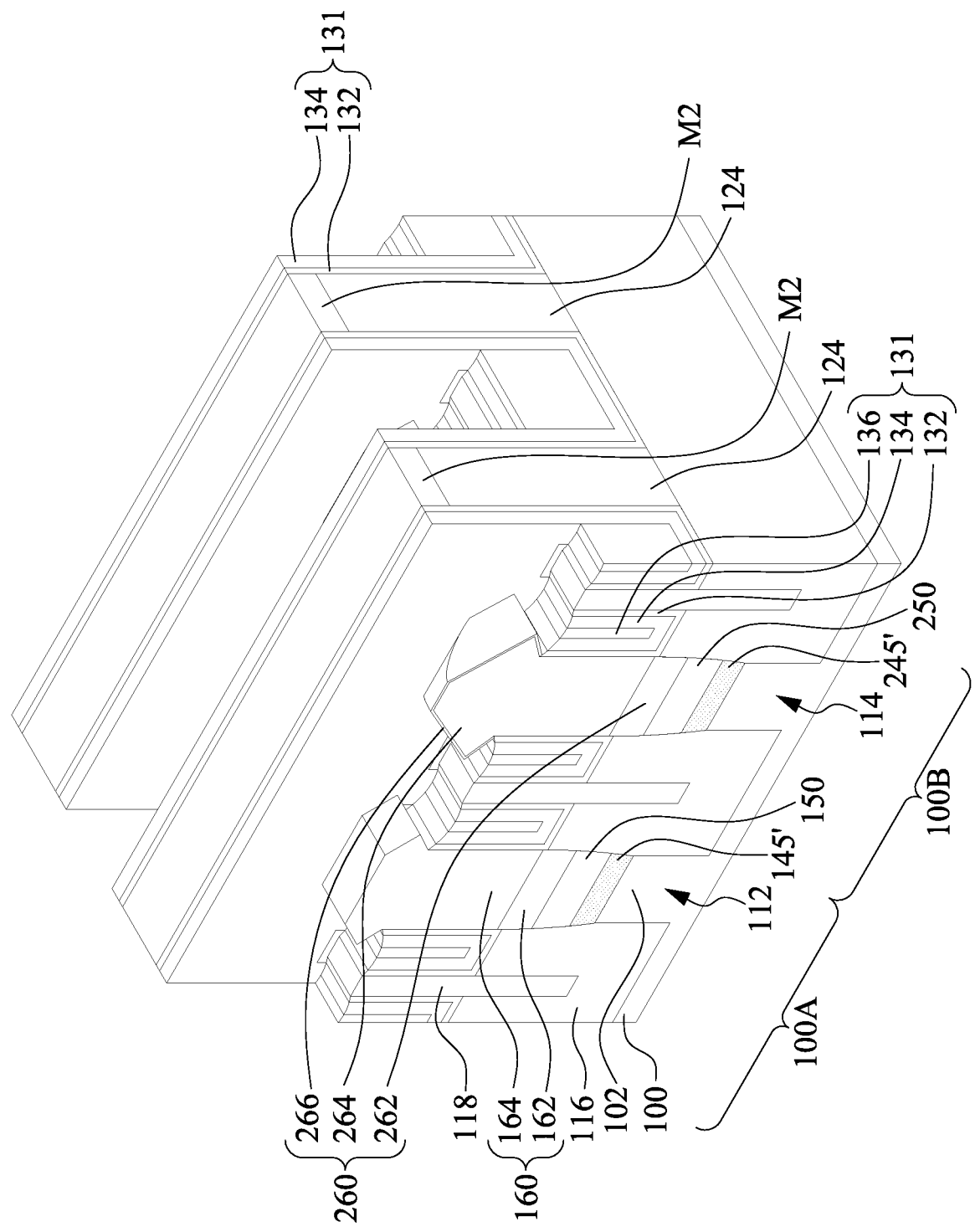

Reference is made to FIG. 29. The patterned mask M4 is removed. In some embodiments, the patterned mask M4 can be removed by suitable process, such as ashing or etching process. After the patterned mask M4 is removed, the epitaxy structures 160 and 260 are exposed.

Figure 30:
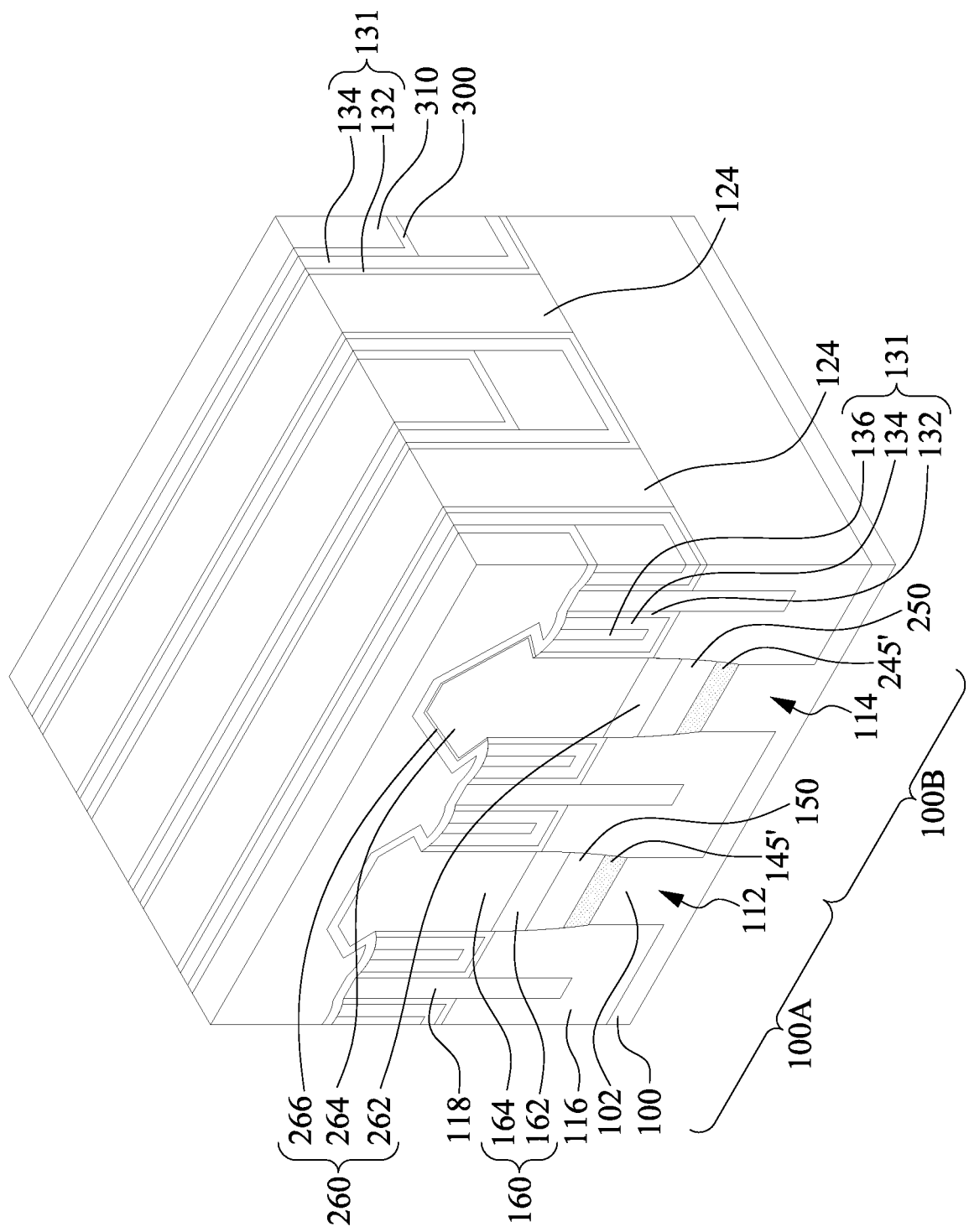

Reference is made to FIG. 30. A contact etching stop layer (CESL) 300 and a first interlayer dielectric (ILD) layer 310 are formed over the substrate 100. In some embodiments, the CESL 300 and the first ILD layer 310 can be formed by, for example, depositing a plurality of dielectric layers over the substrate 100, followed by a CMP process to remove the excessive dielectric materials until the dummy gate structures 124 are exposed. The CESL 300 may be a dielectric layer including silicon nitride, silicon oxynitride or other suitable materials. In some embodiments, the first ILD layer 310 may include silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The CESL 300 and the first ILD layer 310 may be formed using, for example, CVD, ALD, spin-on-glass (SOG) or other suitable techniques. In some embodiments, the CESL 300 has a thickness in a range from about 2 nm to about 8 nm.

Figure 31A:
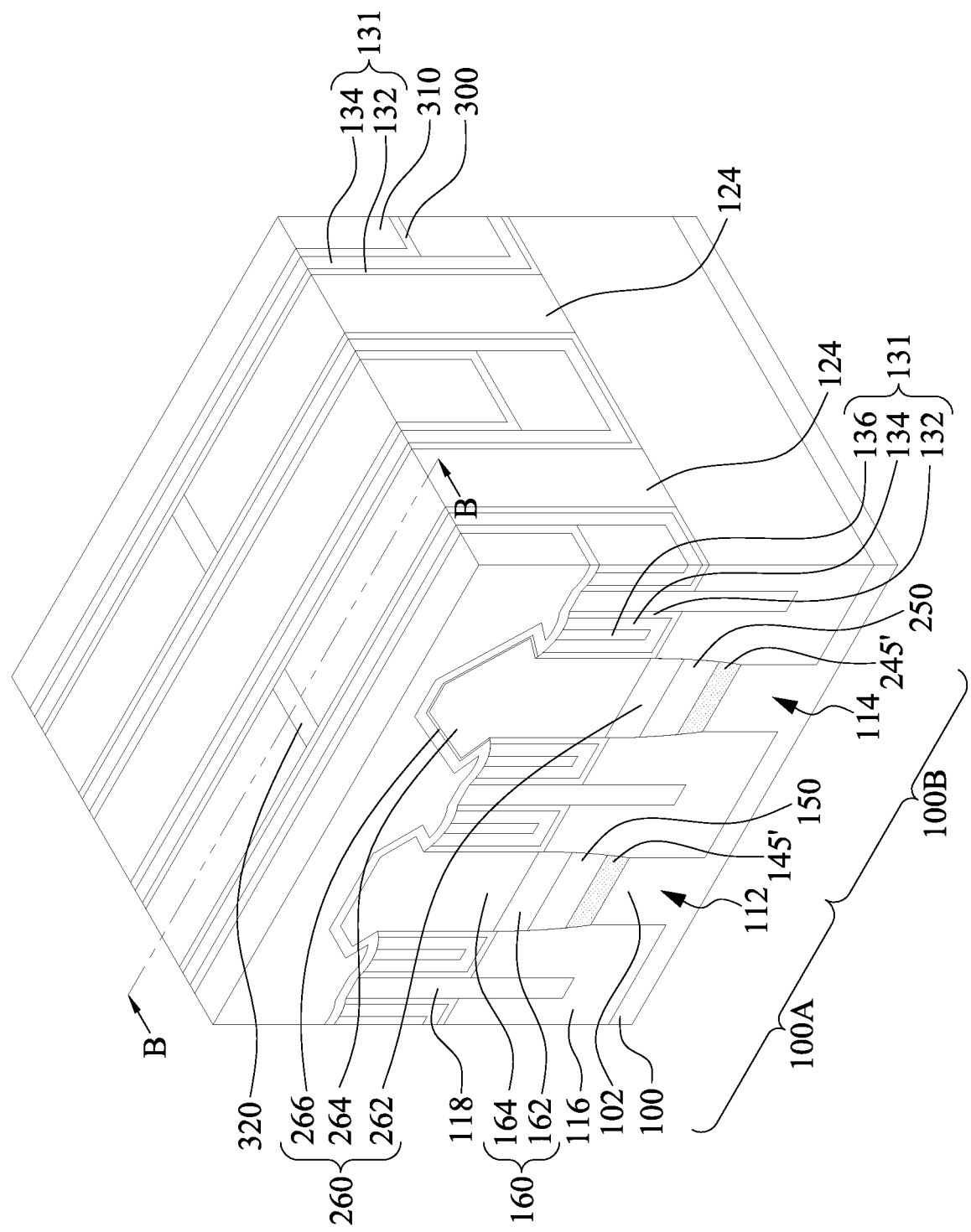
Figure 31B:
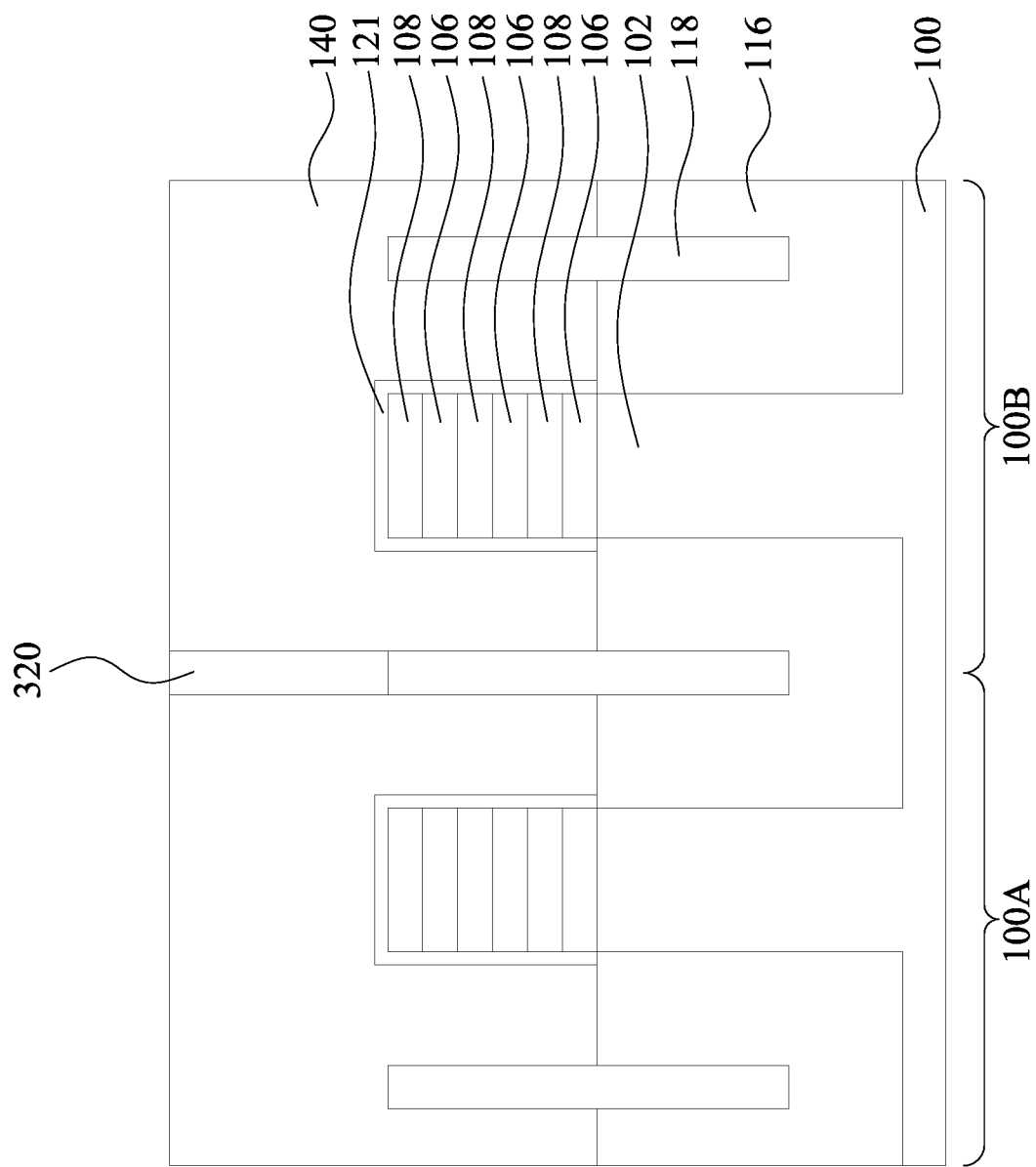

Reference is made to FIGS. 31A and 31B, in which FIG. 31B is a cross-sectional view along line B-B of FIG. 31A. A plurality of isolation plugs 320 are formed through the dummy gate structures 124, respectively. The isolation plugs 320 may be formed by, for example, etching the dummy gate structures 124 to form openings extending vertically through the dummy gate structures to cut each dummy gate structure into separate dummy gate structures, filling the openings with dielectric material, and followed by a CMP process to remove excessive material until the dummy gate structures 124 are exposed. Each of the isolation plugs 320 separates each of the dummy gate structures 124 into two separated portions, in which a portion is within the first region 100A of the substrate 100, and another portion is within the second region 100B of the substrate 100. In FIG. 31B, the isolation plugs 320 are drawn to have the same width as the dielectric fin 118, while the isolation plugs 320 can be wider or narrower than the dielectric fin 118 in some other embodiments. The isolation plug s 320 can be a dielectric layer including silicon nitride, silicon oxynitride or other suitable materials, and may be formed by CVD, ALD, spin-on-glass (SOG) or other suitable techniques.

Figure 32A:
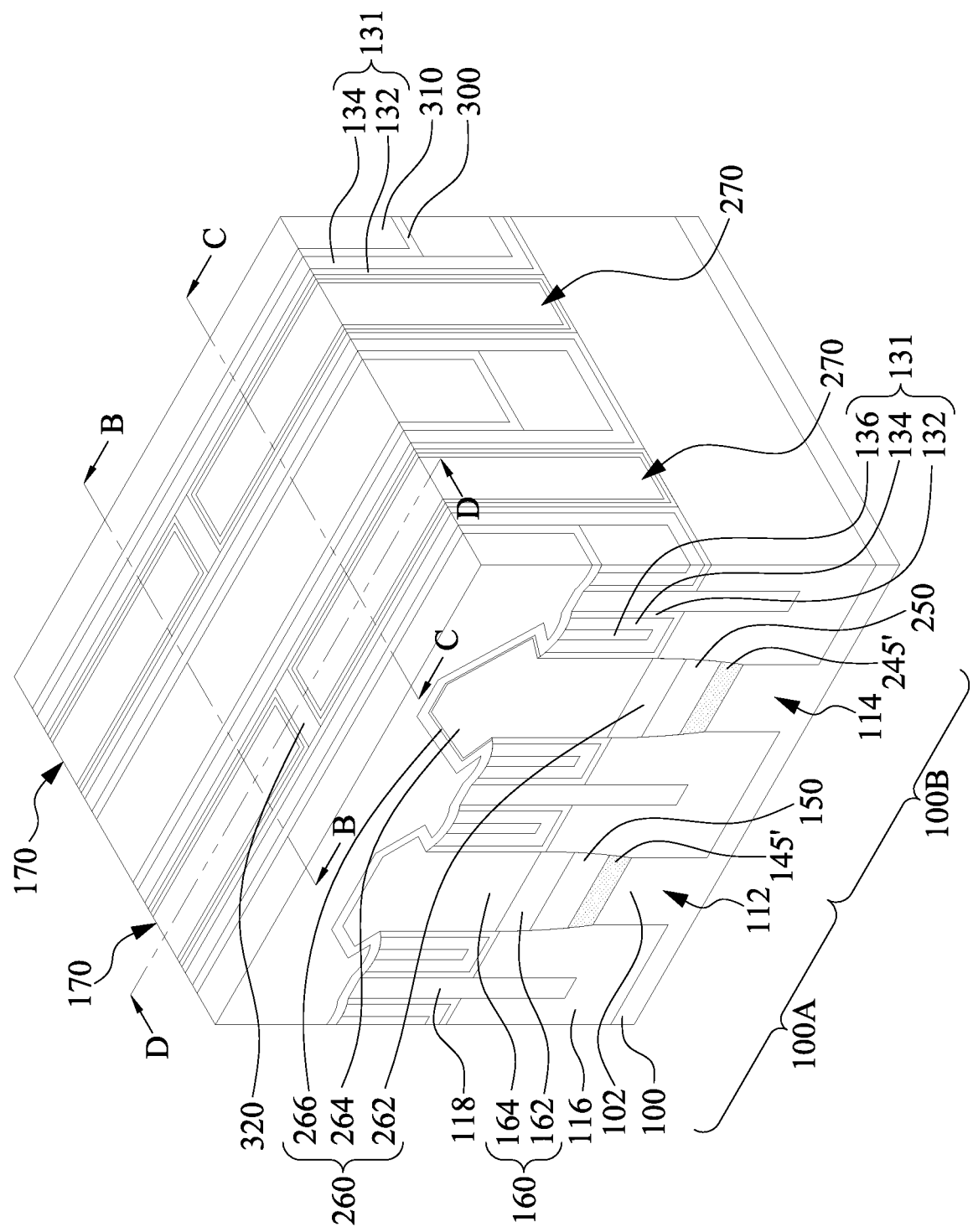
Figure 32B:
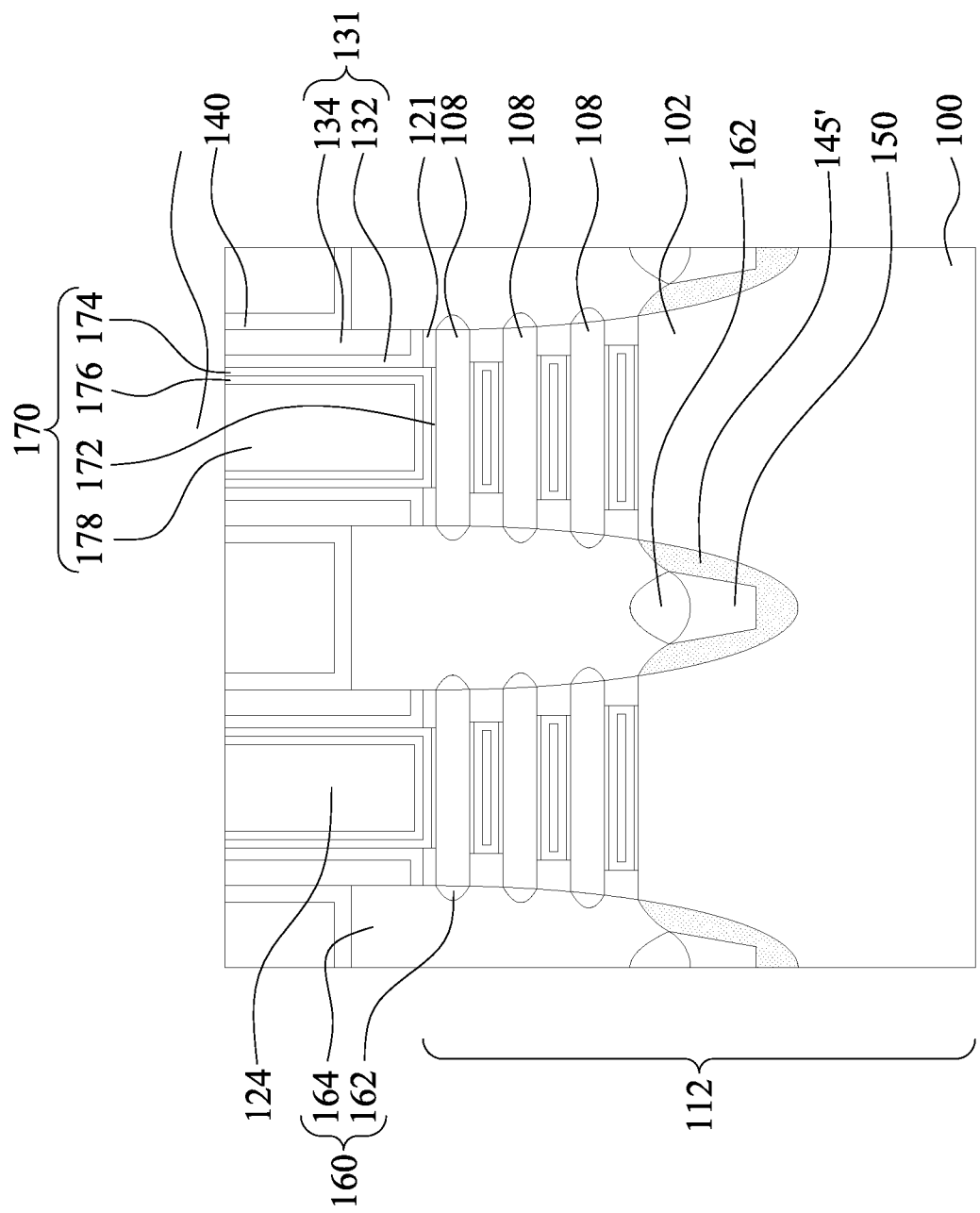
Figure 32C:
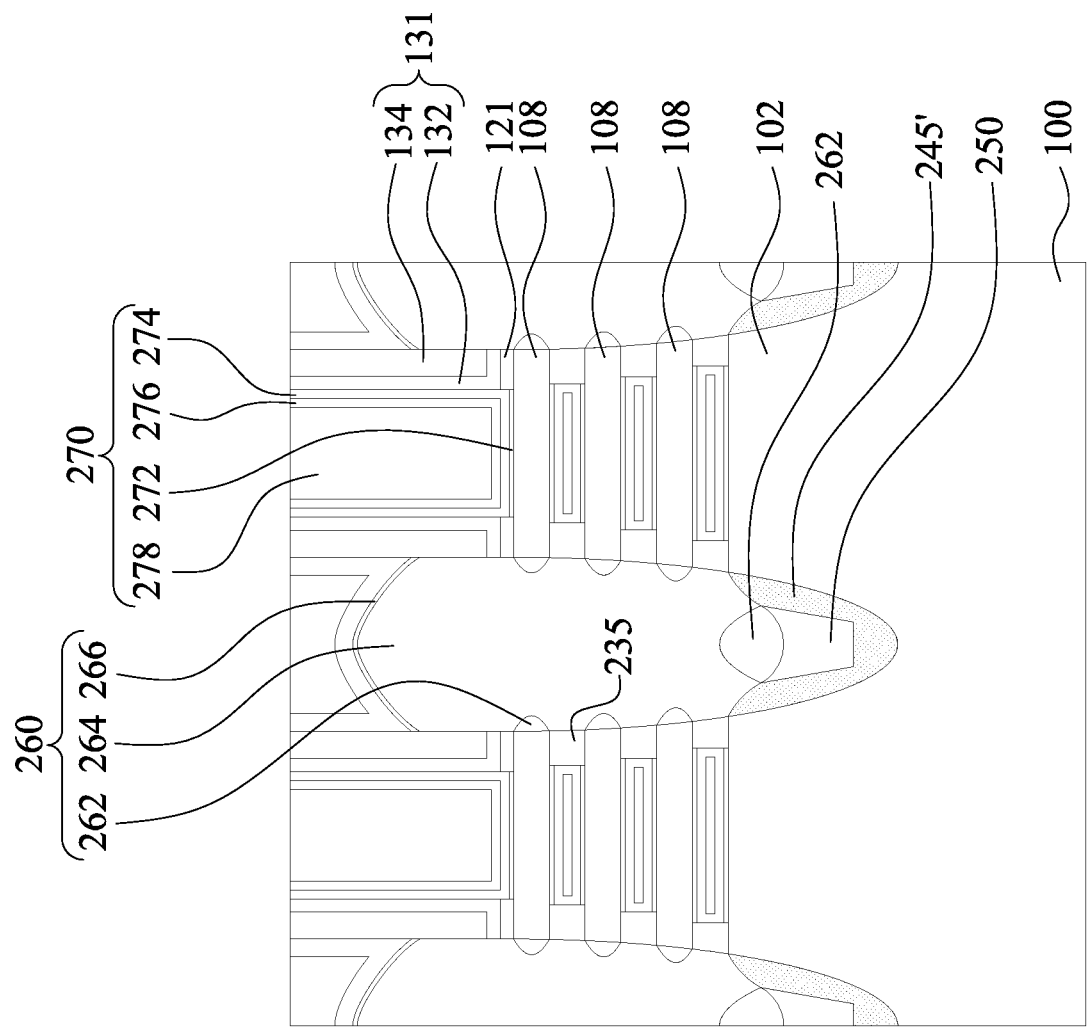
Figure 32D:
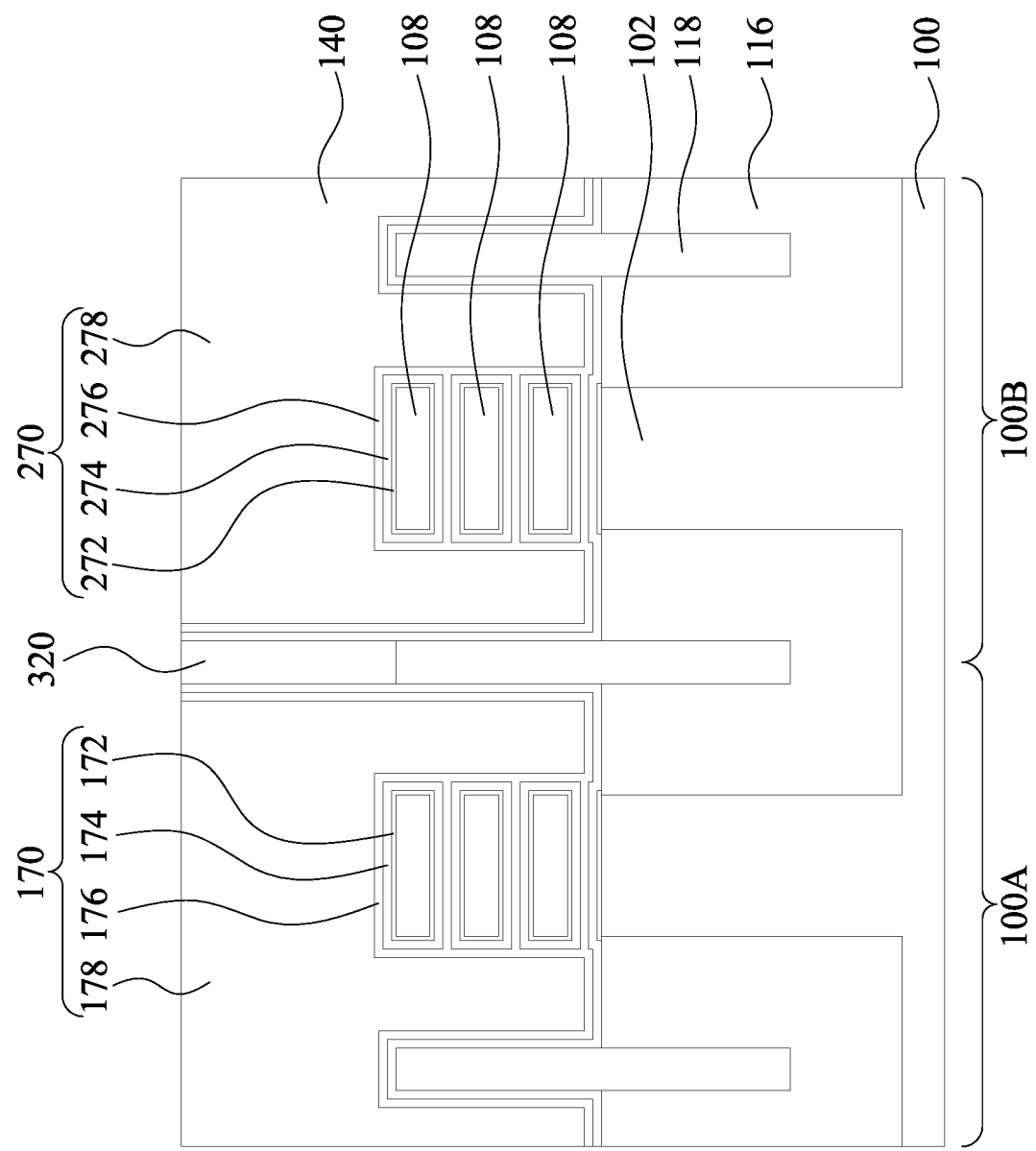

Reference is made to FIGS. 32A to 32D, in which FIG. 32B is a cross-sectional view along line B-B of FIG. 32A, FIG. 32C is a cross-sectional view along line C-C of FIG. 32A, and FIG. 32D is a cross-sectional view along line D-D of FIG. 32A. The dummy gate structures 124 are replaced with metal gate structures 170 and 270, respectively. In greater detail, the metal gate structures 170 and 270 can be formed by, for example, removing the dummy gate structures 124 and the gate dielectric layer 121 to form a plurality of gate trenches between the spacers 131, etching the first semiconductor layers 106 such that the second semiconductor layers 108 are suspended within the gate trenches, and depositing the metal gate structure materials into the gate trenches to wrap around the second semiconductor layers 108, and followed by a CMP process to remove excessive metal gate structure materials until the spacers 131 are exposed. The metal gate structures 170 are formed within the first region 100A of the substrate 100, and the metal gate structures 270 are formed within the second region 100B of the substrate 100. In some embodiments, the metal gate structures 170 and 270 can be formed in different steps. For example, the second region 100B of the substrate 100 may be masked during forming the metal gate structures 170, while the first region 100A of the substrate 100 may be masked during forming the metal gate structures 270.

In some embodiments, the metal gate structures 170 include an interfacial layer 172, a gate dielectric layer 174, a work function metal layer 176, and a filling metal 178. The interfacial layer 172 may include silicon oxide, which may be formed by thermal oxidation. The interfacial layer 172 surrounds the surfaces of second semiconductor layers 108. The gate dielectric layer 174 may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO SiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. The work function metal layer 176 may be an n-type work function layers. Exemplary n-type work function metals include Ti, Ag, TaAl, TaAlC, TiAlN, TaC, TaCN, TaSiN, Mn, Zr, other suitable n-type work function materials, or combinations thereof. The work function layer may include a plurality of layers. In some embodiments, the filling metal 178 may include tungsten (W). In some other embodiments, the gate electrode includes aluminum (Al), copper (Cu) or other suitable conductive material. In some embodiments, the gate dielectric layer 174, the work function metal layer 176, and the filling metal 178 can be formed by suitable process, such as PVD, CVD, or ALD.

The metal gate structures 270 include an interfacial layer 272, a gate dielectric layer 274, a work function metal layer 276, and a filling metal 278. The interfacial layer 272, the gate dielectric layer 274, and the filling metal 278 may be similar to the interfacial layer 172, the gate dielectric layer 174 and the filling metal 178, and thus relevant details are omitted for simplicity. The work function metal layer 276 may be an p-type work function layers. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof.

Figure 33:
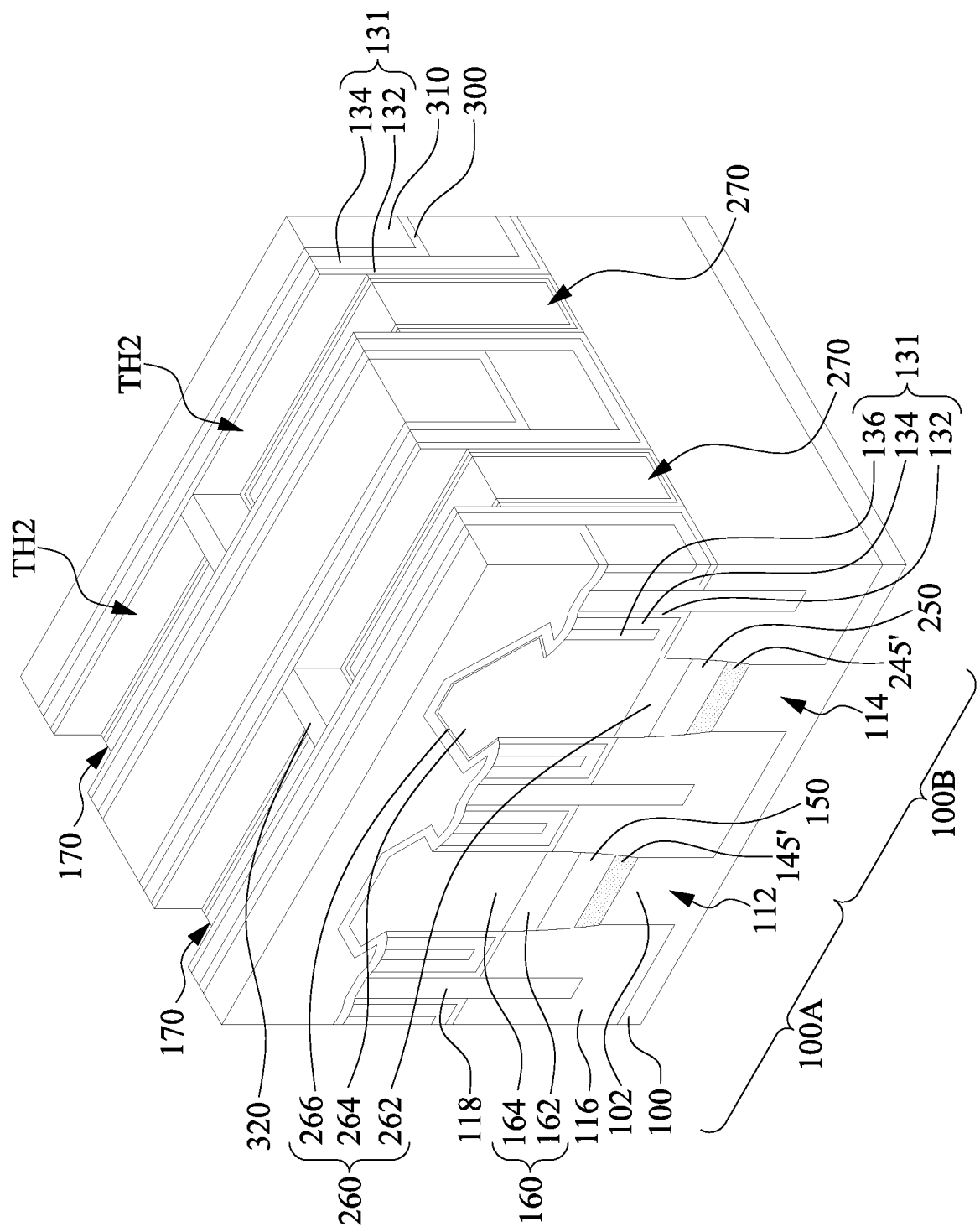

Reference is made to FIG. 33. The metal gate structures 170 and 270 are etched back. In greater detail, upper portions of the metal gate structures 170 and 270 are removed to form a plurality of trenches TH2 between the spacers 131. In some embodiments, the metal gate structures 170 and 270 can be etched by, for example, dry etching, wet etching, or combinations thereof. During the etching process, the spacers 131 and the isolation plugs 320 have higher etching resistance to the etching process than the metal gate structures 170 and 270.

Figure 34:
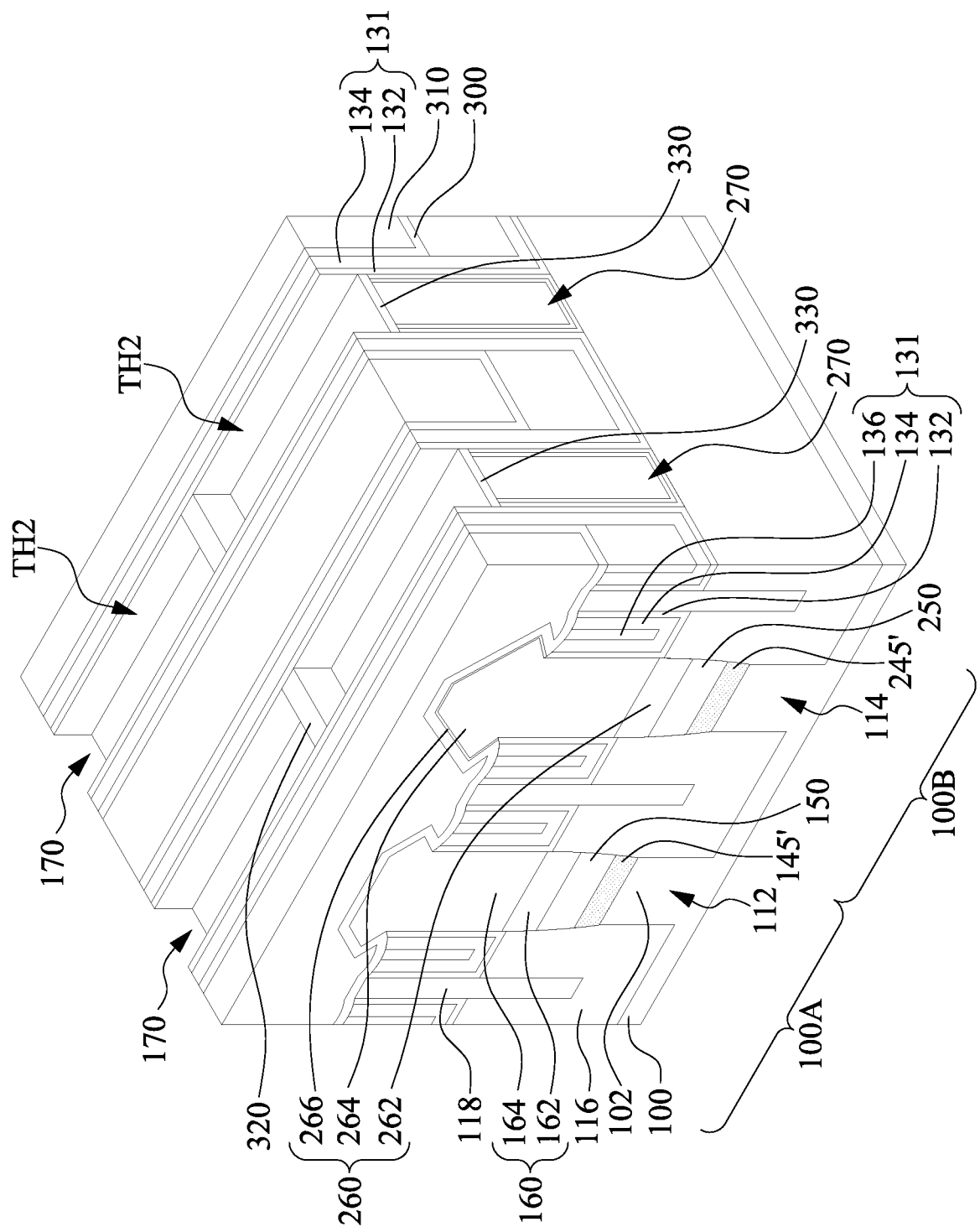

Reference is made to FIG. 34. A plurality of metal layers 330 are formed respectively on the metal gate structures 170 and 270 via a bottom-up approach. That is, the metal layers 330 are selectively grown on the metal gate structures 170 and 270, and thus the sidewalls of the spacers 131 and the isolation plugs 320 are substantially free from the growth of the metal layers 330. In some embodiments, the metal layers 330 may include but not limited to, for example, tungsten (W).

In a bottom-up approach, the growth of a metal layers 330 has a different nucleation delay on a metal-containing surface (i.e., the metal gate structures 170 and 270) as compared to a dielectric surface (i.e., the spacers 131 and the isolation plugs 320). Usually, the nucleation delay on the metal-containing surface is shorter than on the dielectric surface. The nucleation delay differences can be used to allow selective growth on the metal-containing surface. The present disclosure utilizes the selectivity to allow metal growth from a bottom of a trench (i.e. the metal gate structures 170 and 270) while limiting the growth from the dielectric side walls (i.e. the spacers 131 and the isolation plugs 320). As a result, the deposition rate of the metal layers 330 on the metal-containing surface (i.e., the metal gate structures 170 and 270) is faster than that on the dielectric surface (i.e., the spacers 131 and the isolation plugs 320).

Figure 35:
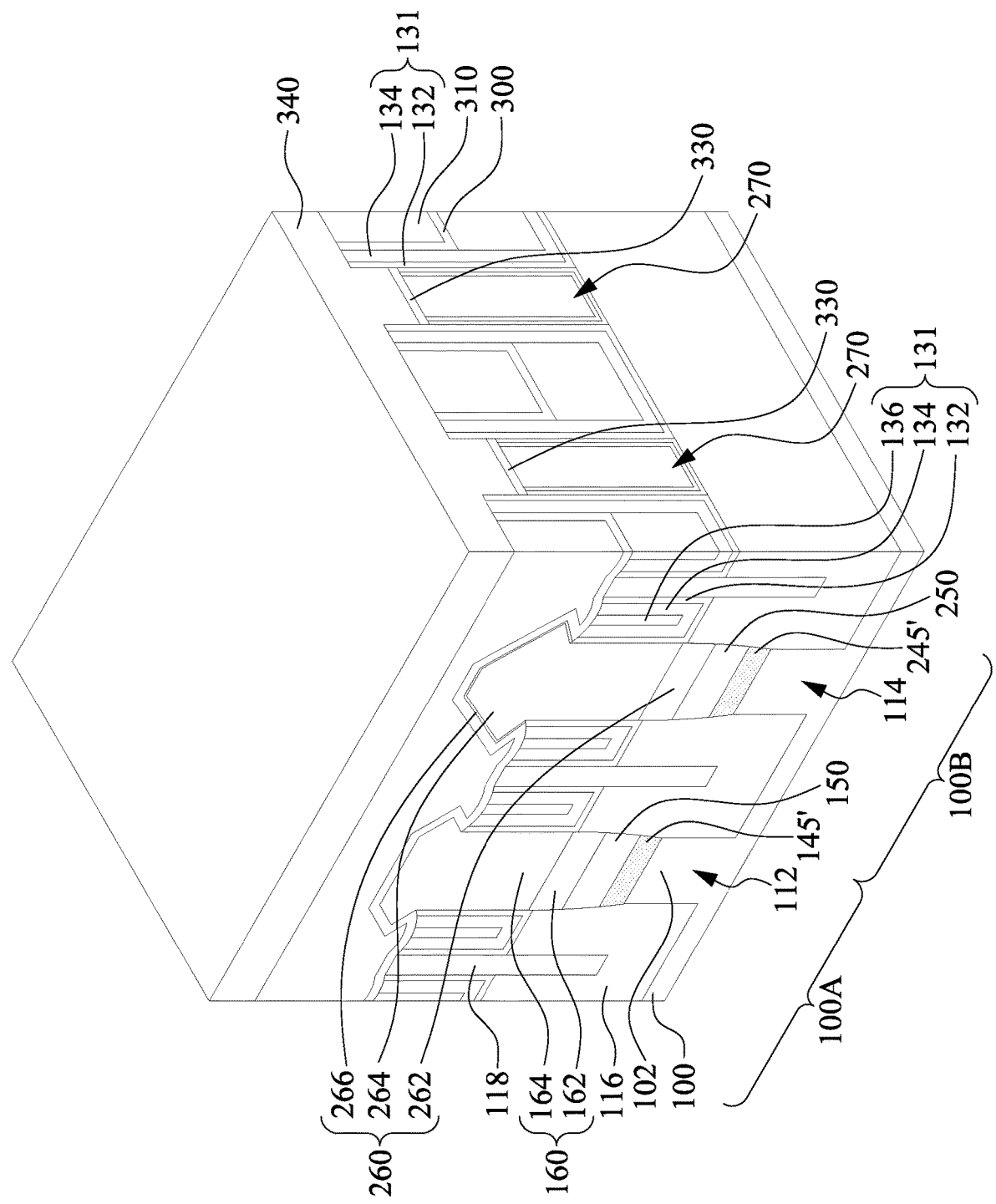

Reference is made to FIG. 35. A second interlayer dielectric (ILD) layer 340 is formed over the substrate 100. In greater detail, the second ILD layer 340 fills the trenches TH2 (see FIG. 34) and cover the first ILD layer 310, the spacers 131, and the isolation plug 320 (see FIG. 34). In some embodiments, the second ILD layer 340 may include silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The second ILD layer 340 may be formed using, for example, CVD, ALD, spin-on-glass (SOG) or other suitable techniques.

Figure 36A:
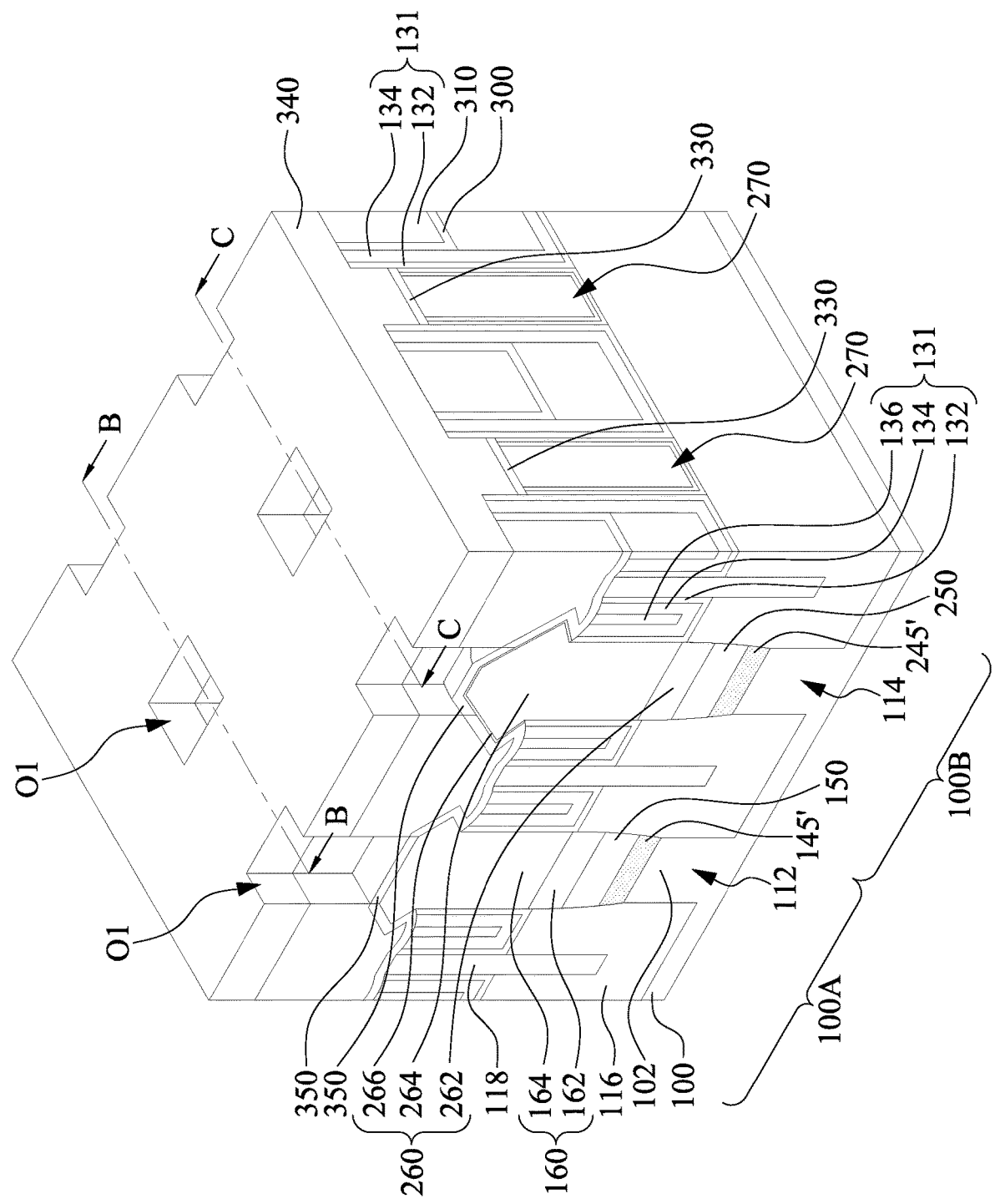
Figure 36B:
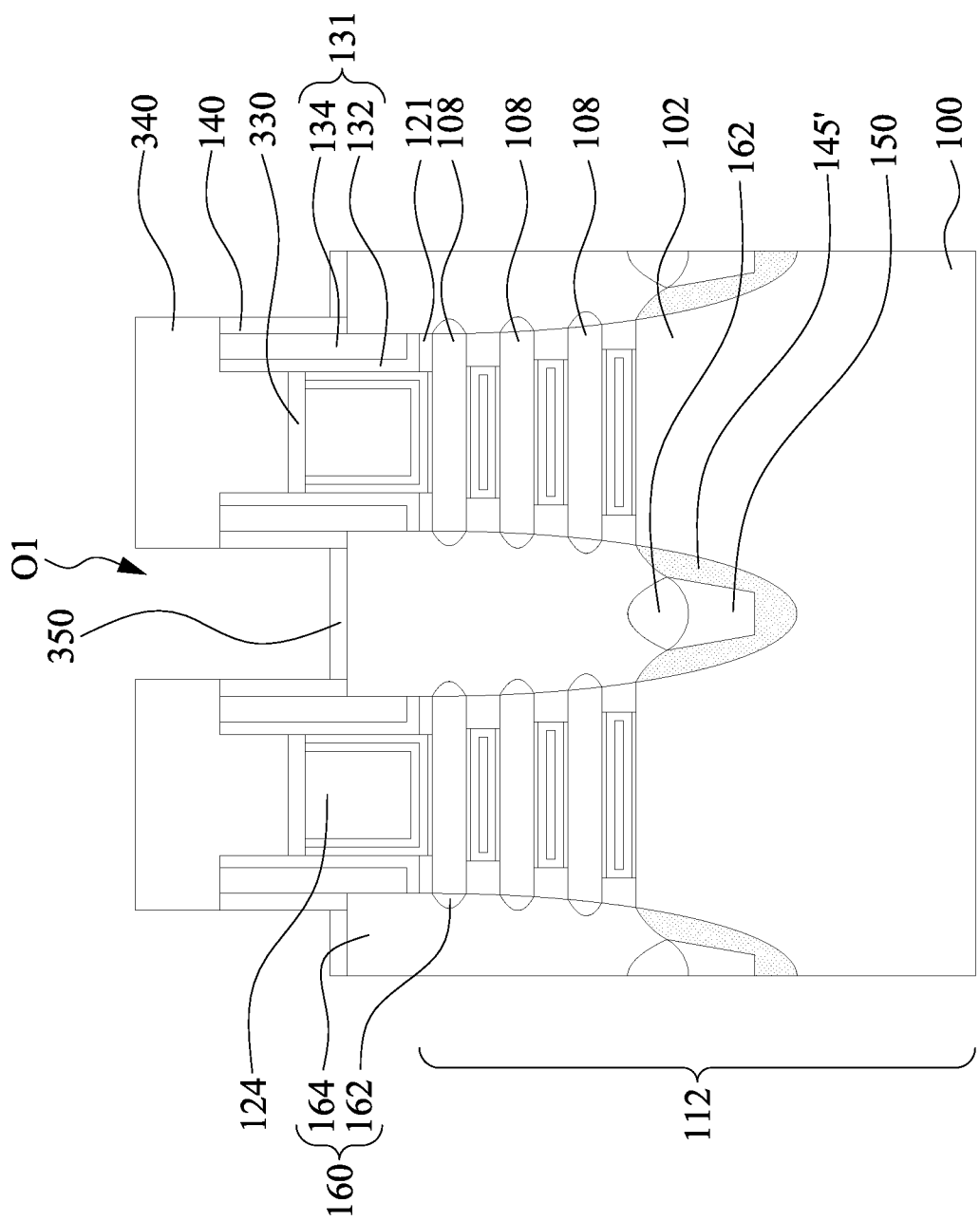
Figure 36C:
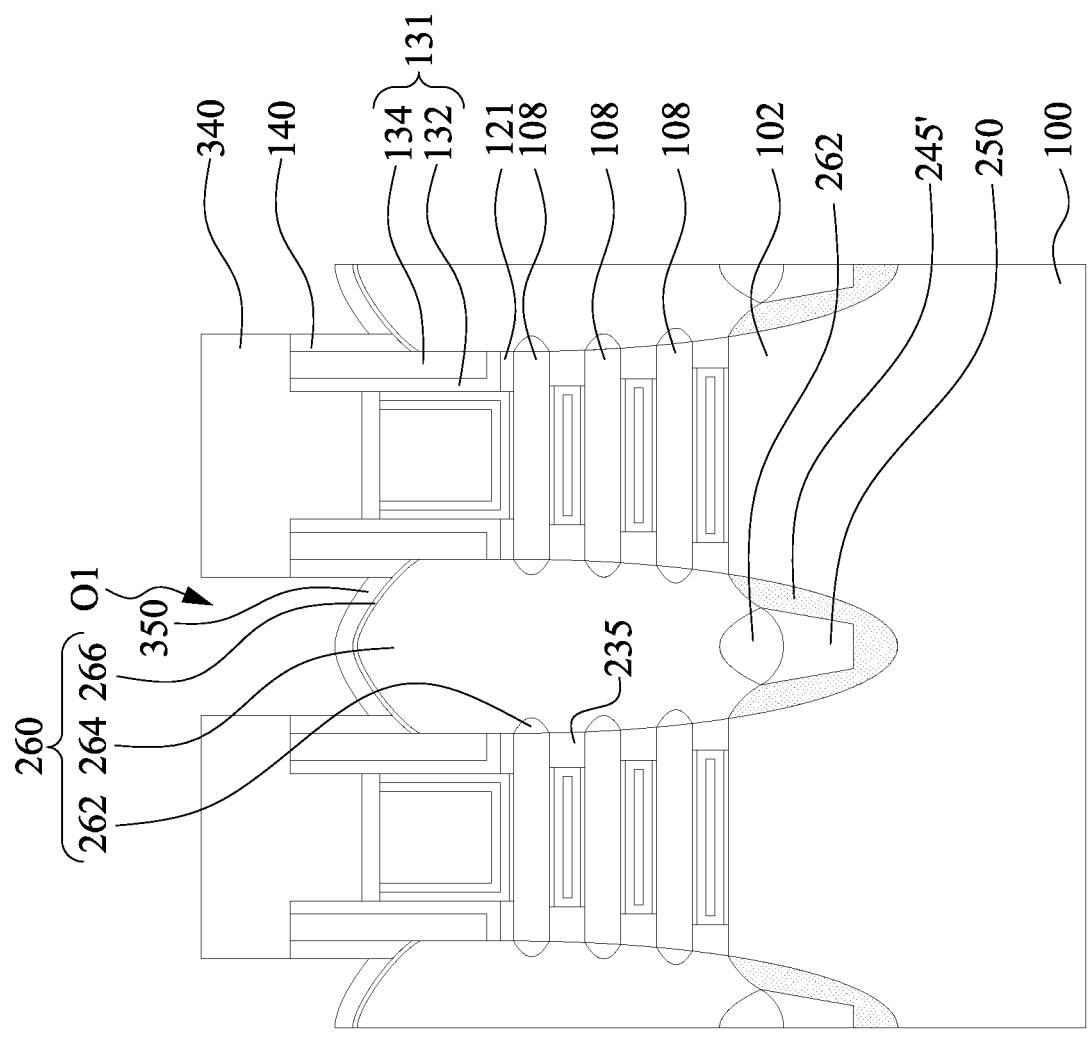

Reference is made to FIGS. 36A to 36C, in which FIG. 36B is a cross-sectional view along line B-B of FIG. 36A, and FIG. 36C is a cross-sectional view along line C-C of FIG. 36A. The second ILD layer 340 is patterned to form a plurality of openings O1 that expose the epitaxy structures 160 and 260, and a plurality of silicides 350 are formed on the epitaxy structures 160 and 260. In some embodiments, the silicides 350 may metal silicides, such as titanium silicide ($TiSi_x$), cobalt silicide ($CoSi_x$), or tantalum silicide ($TaSi_x$). For example, a metal layer is deposited by sputtering over the substrate 100 and then annealed by a rapid thermal annealing (RTA) treatment. The metal layer overlying the surface of the substrate 100 is reacted with silicon (Si) of the epitaxy structures 160 and 260, and is transformed into metal silicide. The unreacted metal layer on the second ILD layer 340 is next removed.

Figure 37A:
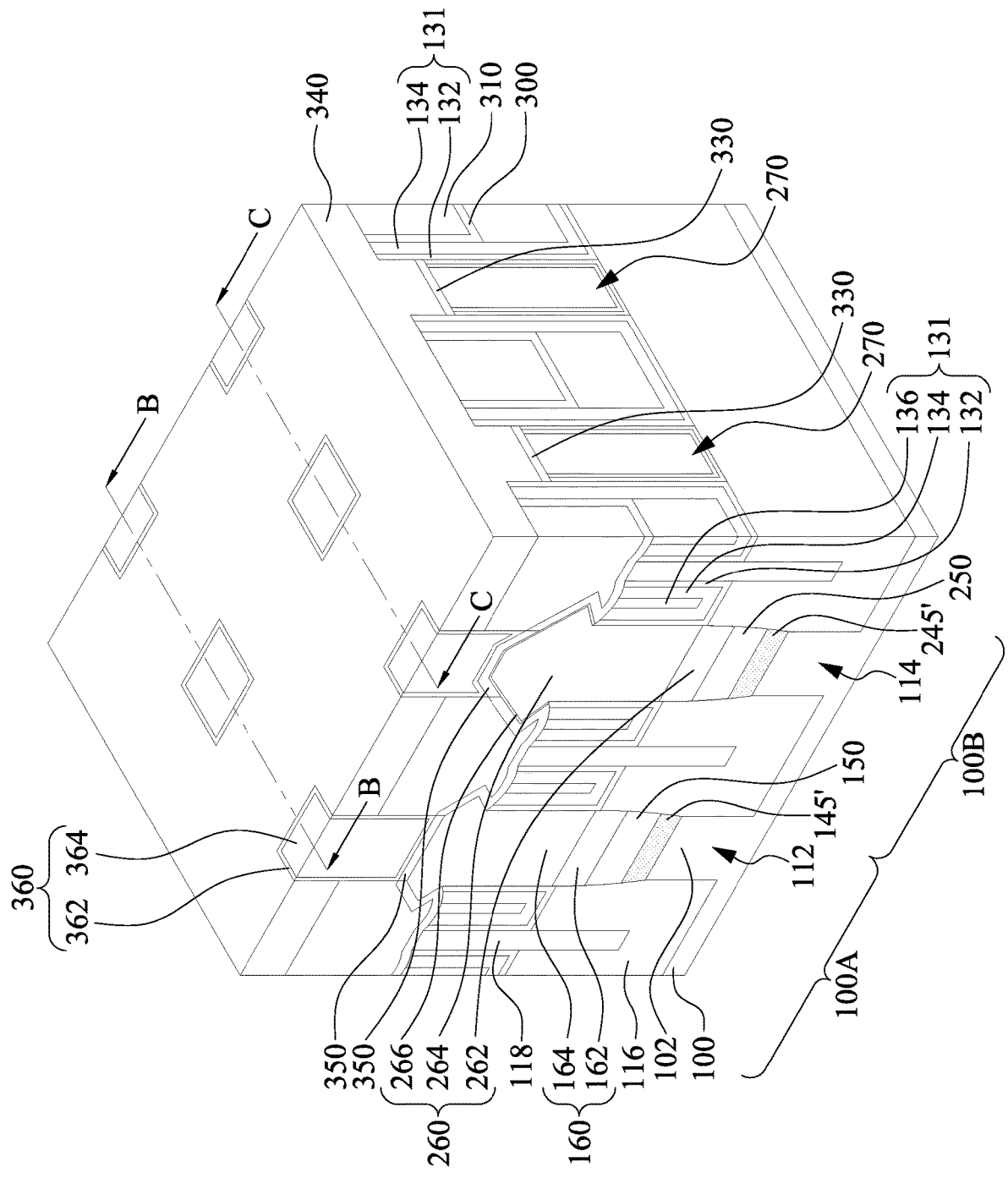
Figure 37B:
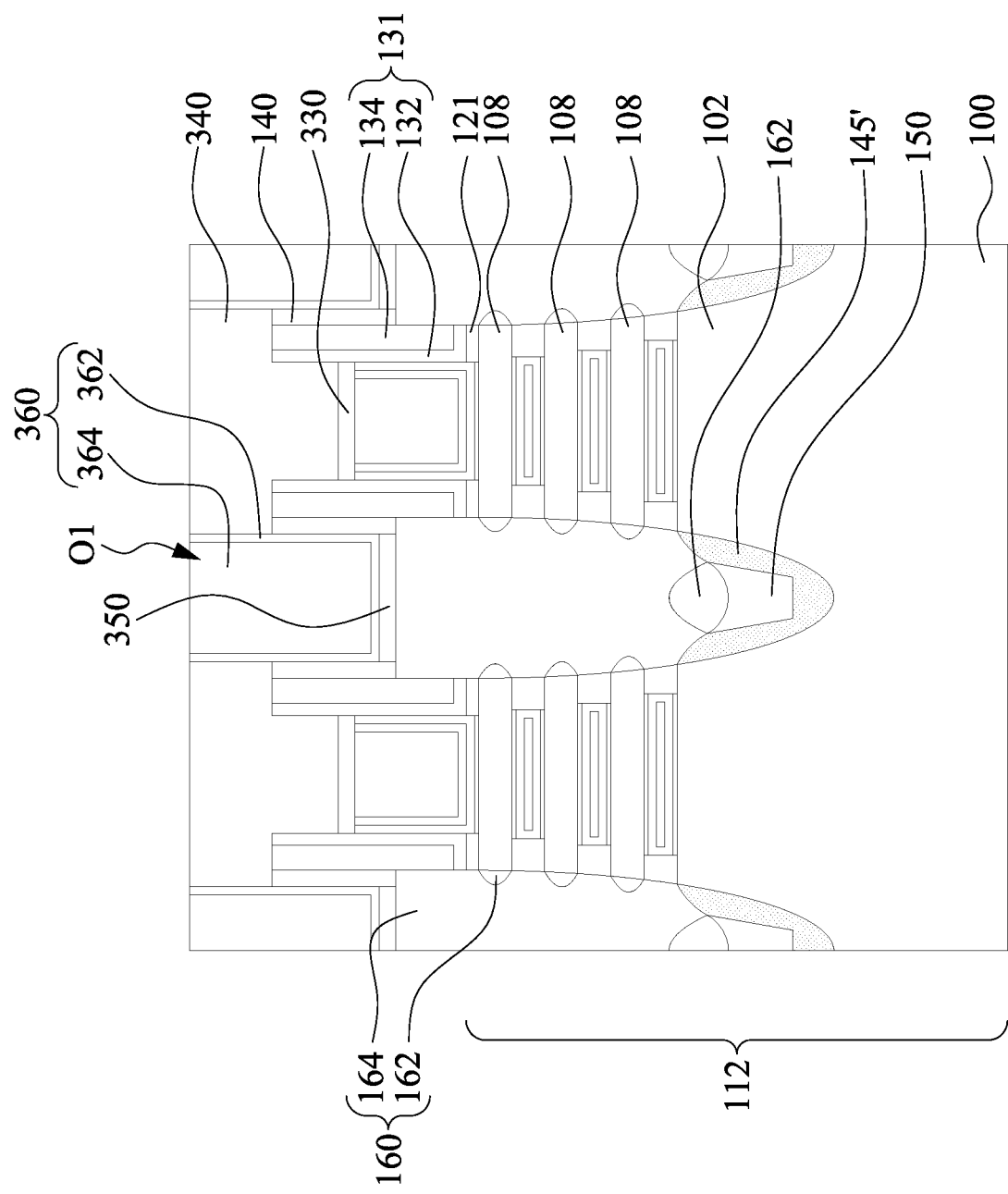
Figure 37C:
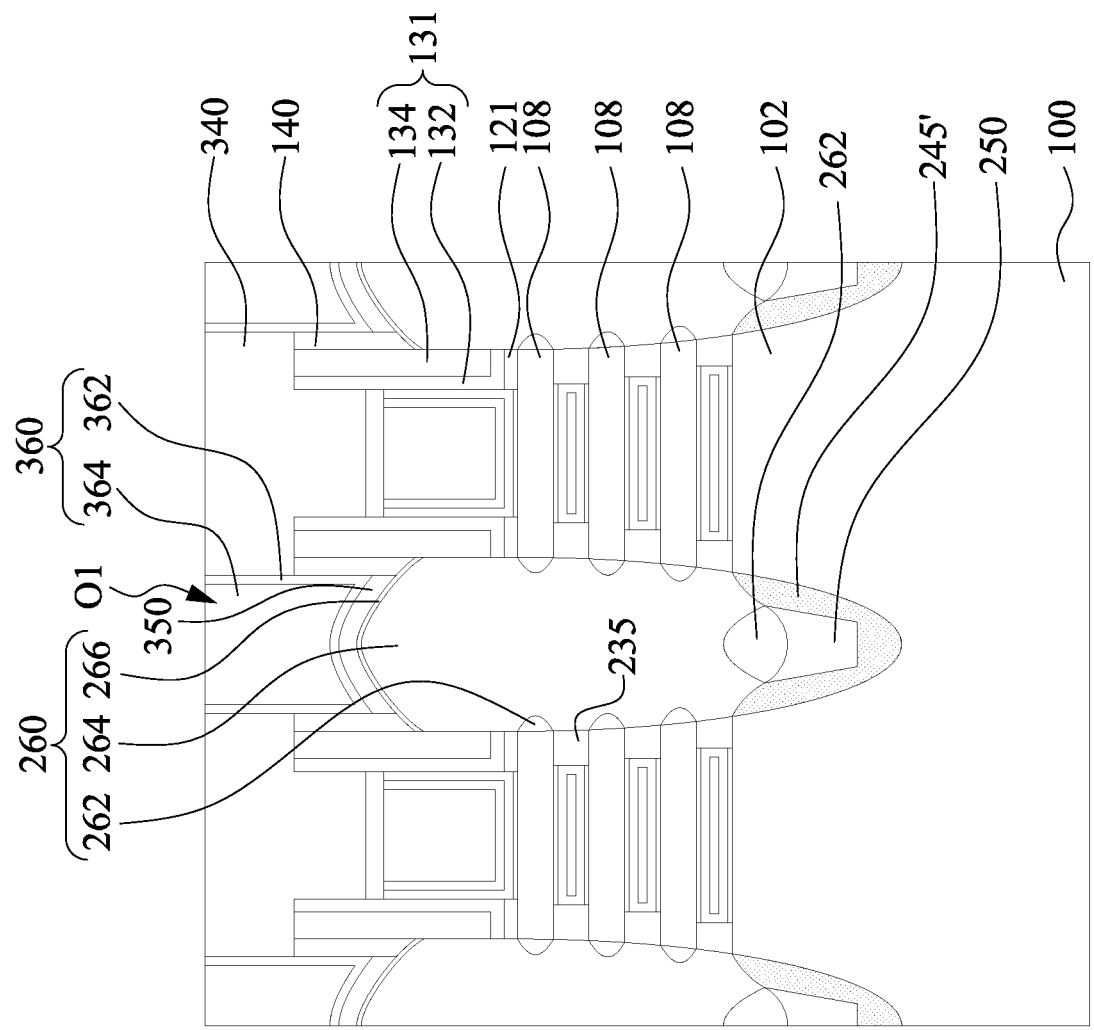
Figure 38A:
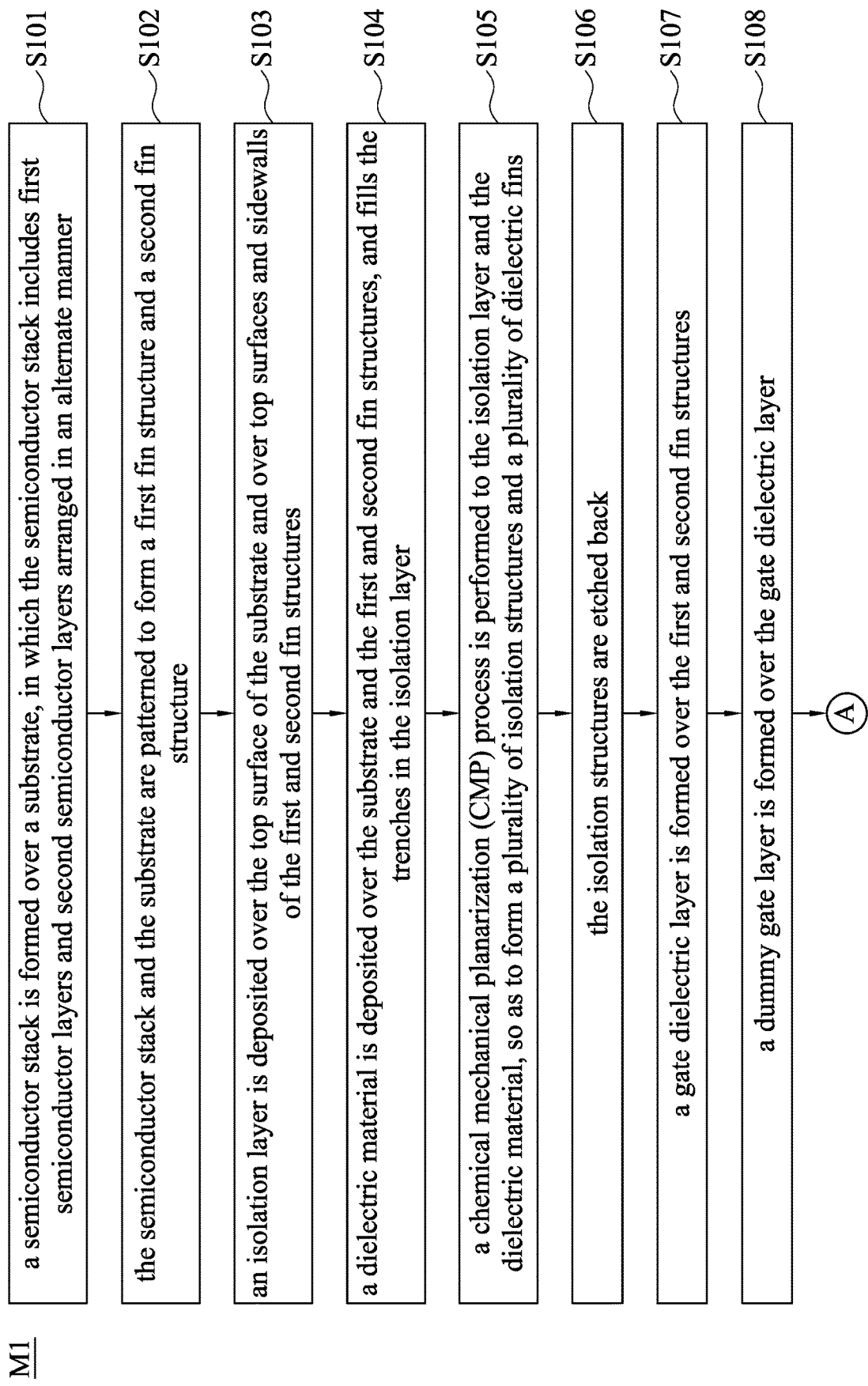
FIGS. 38A to 38E illustrate a method of manufacturing in accordance with some embodiments of the present disclosure.
Figure 38B:
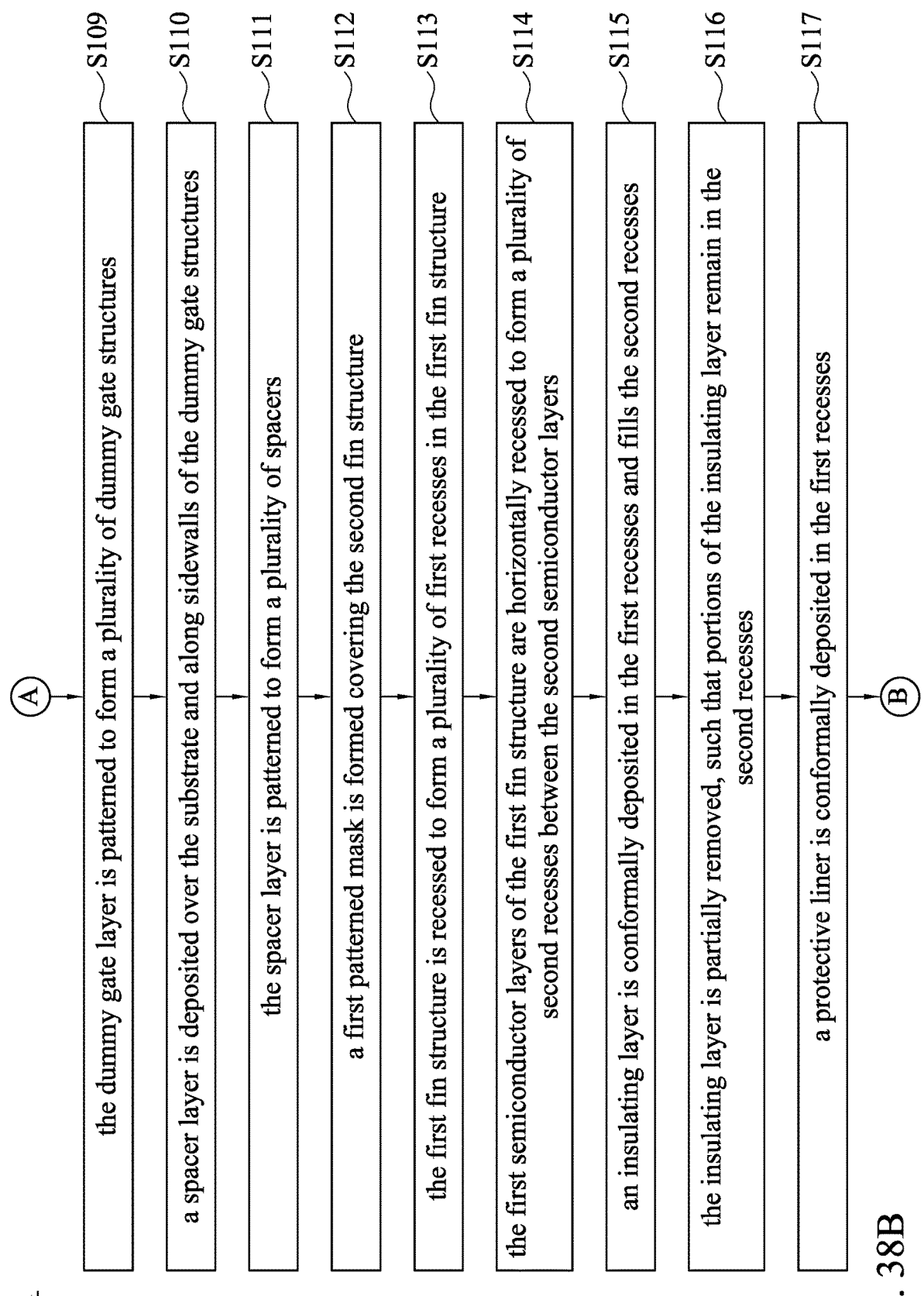
Figure 38C:
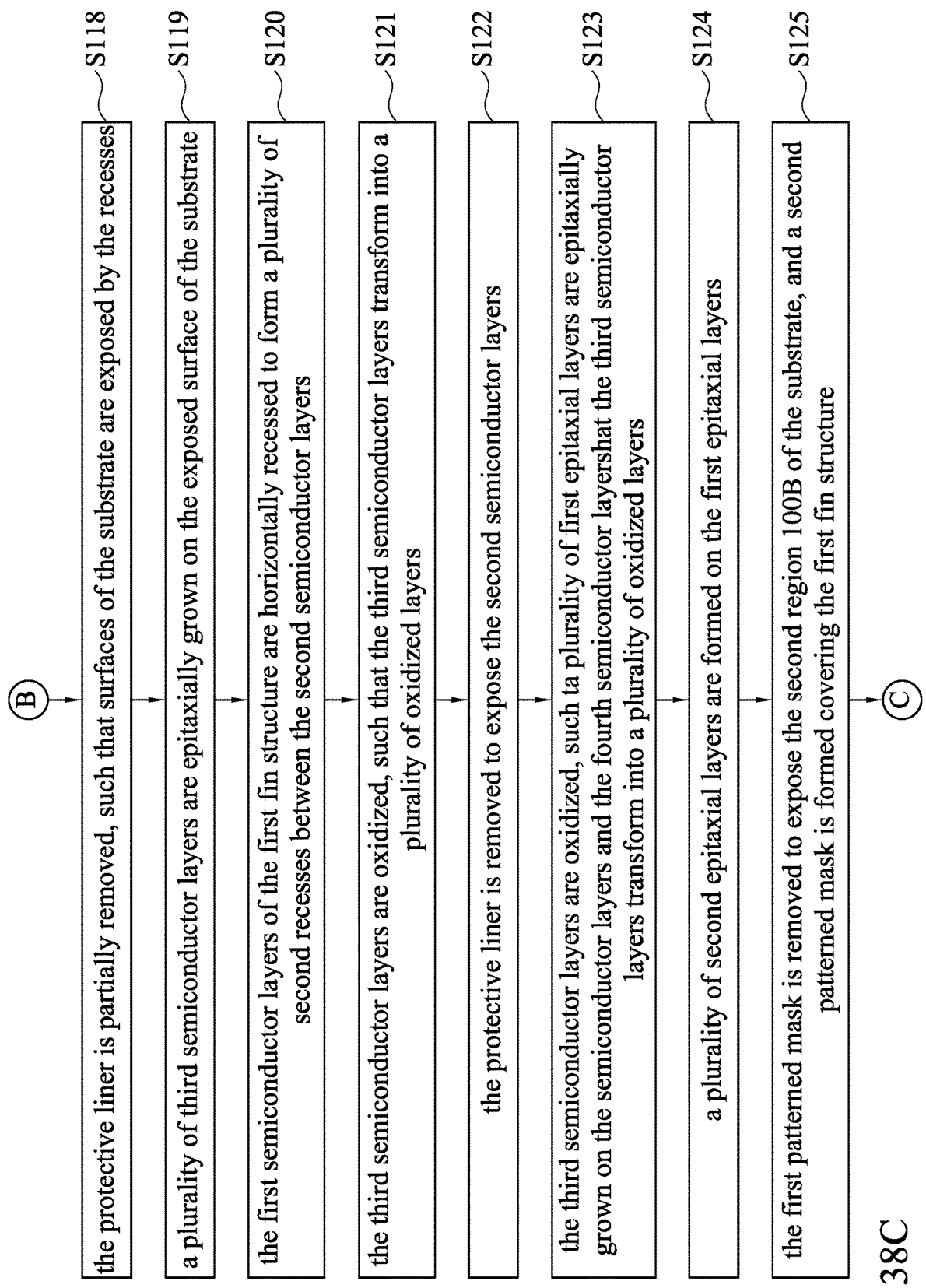
Figure 38D:
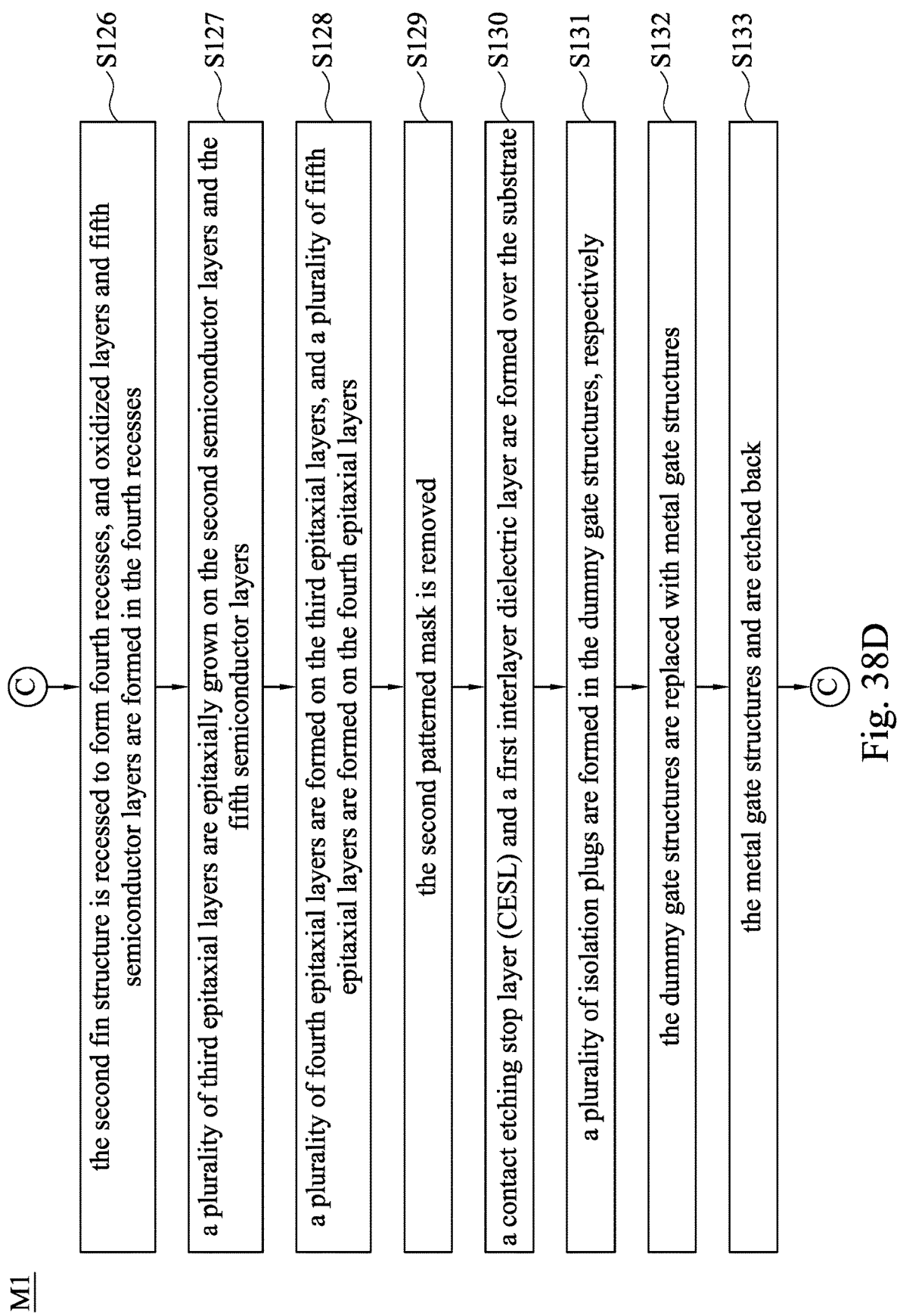
Figure 38E:
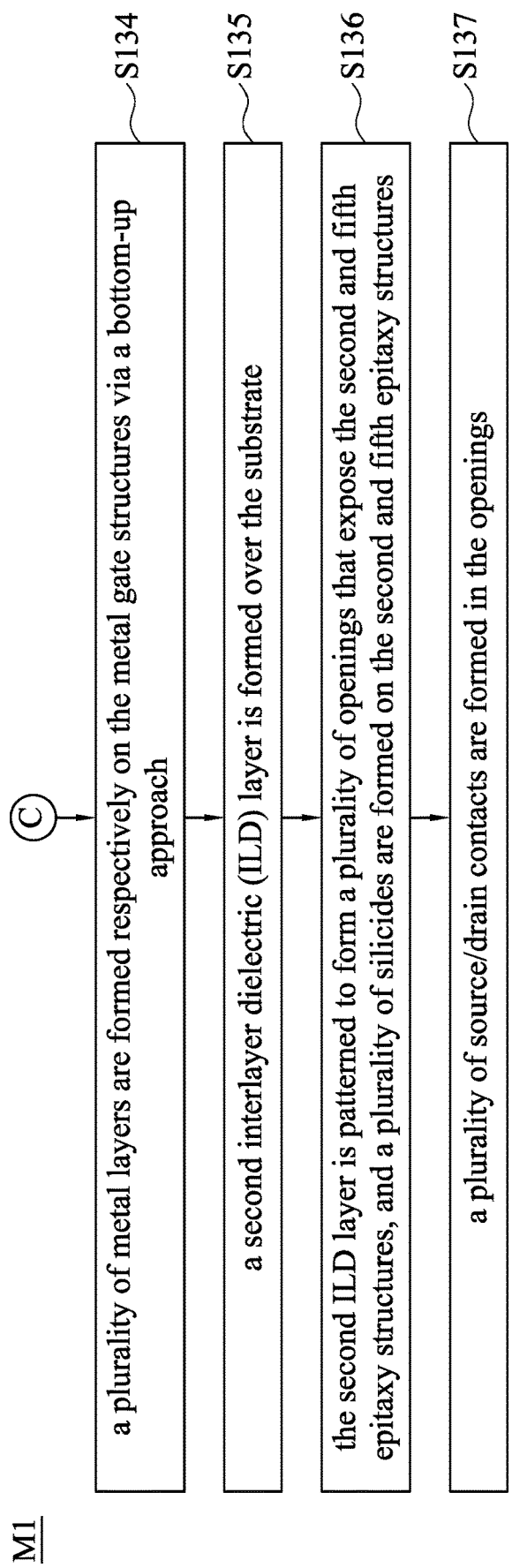

Reference is made to FIGS. 37A to 37C, in which FIG. 37B is a cross-sectional view along line B-B of FIG. 37A, and FIG. 37C is a cross-sectional view along line C-C of FIG. 37A. A plurality of source/drain contacts 360 are formed in the openings O1. In some embodiments, each of the source/drain contacts 360 includes a liner 362 and a plug 364. The liner 362 is between plug 364 and the underlying silicides 350. In some embodiments, the liner 362 assists with the deposition of plug 364 and helps to reduce diffusion of a material of plug 364 through the spacers 131. In some embodiments, the liner 362 includes titanium (Ti), titanium nitride (TiN), tantalum (Ta), tantalum nitride (TaN), or another suitable material. The Plug 364 includes a conductive material, such tungsten (W), copper (Cu), aluminum (Al), ruthenium (Ru), cobalt (Co), molybdenum (Mo), nickel (Ni), or other suitable conductive material.

FIGS. 38A to 38E illustrate a method M1 of forming a semiconductor device in accordance with some embodiments of the present disclosure. Although the method M1 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At block S101, a semiconductor stack is formed over a substrate, in which the semiconductor stack includes first semiconductor layers and second semiconductor layers arranged in an alternate manner. FIG. 1 illustrates a schematic view of some embodiments corresponding to act in block S101.

At block S102, the semiconductor stack and the substrate are patterned to form a first fin structure and a second fin structure. FIG. 2 illustrates a schematic view of some embodiments corresponding to act in block S101.

At block S103, an isolation layer is deposited over the top surface of the substrate and over top surfaces and sidewalls of the first and second fin structures. FIG. 3 illustrates a schematic view of some embodiments corresponding to act in block S103.

At block S104, a dielectric material is deposited over the substrate and the first and second fin structures, and fills the trenches in the isolation layer. FIG. 4 illustrates a schematic view of some embodiments corresponding to act in block S104.

At block S105, a chemical mechanical planarization (CMP) process is performed to the isolation layer and the dielectric material, so as to form a plurality of isolation structures and a plurality of dielectric fins. FIG. 5 illustrates a schematic view of some embodiments corresponding to act in block S105.

At block S106, the isolation structures are etched back. FIG. 6 illustrates a schematic view of some embodiments corresponding to act in block S106.

At block S107, a gate dielectric layer is formed over the first and second fin structures. FIG. 7 illustrates a schematic view of some embodiments corresponding to act in block S107.

At block S108, a dummy gate layer is formed over the gate dielectric layer. FIG. 8 illustrates a schematic view of some embodiments corresponding to act in block S108.

At block S109, the dummy gate layer is patterned to form a plurality of dummy gate structures. FIGS. 9A and 9B illustrate a schematic view and a cross-sectional view of some embodiments corresponding to act in block S109.

At block S110, a spacer layer is deposited over the substrate and along sidewalls of the dummy gate structures. FIGS. 10A and 10B illustrate a schematic view and a cross-sectional view of some embodiments corresponding to act in block S110.

At block S111, the spacer layer is patterned to form a plurality of spacers. FIGS. 11A and 11B illustrate a schematic view and a cross-sectional view of some embodiments corresponding to act in block S111.

At block S112, a first patterned mask is formed covering the second fin structure. FIGS. 12A, 12B, and 12C illustrate a schematic view and cross-sectional views of some embodiments corresponding to act in block S112.

At block S113, the first fin structure is recessed to form a plurality of first recesses in the first fin structure. FIGS. 13A and 13B illustrate a schematic view and a cross-sectional view of some embodiments corresponding to act in block S113.

At block S114, the first semiconductor layers of the first fin structure are horizontally recessed to form a plurality of second recesses between the second semiconductor layers. FIGS. 14A and 14B illustrate a schematic view and a cross-sectional view of some embodiments corresponding to act in block S114.

At block S115, an insulating layer is conformally deposited in the first recesses and fills the second recesses. FIGS. 15A and 15B illustrate a schematic view and a cross-sectional view of some embodiments corresponding to act in block S115.

At block S116, the insulating layer is partially removed, such that portions of the insulating layer remain in the second recesses. FIGS. 16A and 16B illustrate a schematic view and a cross-sectional view of some embodiments corresponding to act in block S116.

At block S117, a protective liner is conformally deposited in the first recesses. FIGS. 17A and 17B illustrate a schematic view and a cross-sectional view of some embodiments corresponding to act in block S117.

At block S118, the protective liner is partially removed, such that surfaces of the substrate are exposed by the recesses. FIGS. 18A and 18B illustrate a schematic view and a cross-sectional view of some embodiments corresponding to act in block S118.

At block S119, a plurality of third semiconductor layers are epitaxially grown on the exposed surface of the substrate. FIGS. 19A, 19B, and 19C illustrate a schematic view and cross-sectional views of some embodiments corresponding to act in block S119.

At block S120, a plurality of fourth semiconductor layers are epitaxially grown in third recesses of the semiconductor layers. FIGS. 20A, 20B, and 20C illustrate a schematic view and cross-sectional views of some embodiments corresponding to act in block S120.

At block S121, the third semiconductor layers are oxidized, such that the third semiconductor layers transform into a plurality of oxidized layers. FIGS. 21A and 21B illustrate a schematic view and a cross-sectional view of some embodiments corresponding to act in block S121.

At block S122, the protective liner is removed to expose the second semiconductor layers. FIGS. 22A and 22B illustrate a schematic view and a cross-sectional view of some embodiments corresponding to act in block S122.

At block S123, a plurality of first epitaxial layers are epitaxially grown on the semiconductor layers and the fourth semiconductor layers. FIGS. 23A and 23B illustrate a schematic view and a cross-sectional view of some embodiments corresponding to act in block S123.

At block S124, a plurality of second epitaxial layers are formed on the first epitaxial layers. FIGS. 24A, 24B, and 24C illustrate a schematic view and cross-sectional views of some embodiments corresponding to act in block S124.

At block S125, the first patterned mask is removed to expose the second region 100B of the substrate, and a second patterned mask is formed covering the first fin structure. FIG. 25 illustrates a schematic view of some embodiments corresponding to act in block S125.

At block S126, the second fin structure is recessed to form fourth recesses, and oxidized layers and fifth semiconductor layers are formed in the fourth recesses. FIGS. 26A and 26B illustrate a schematic view and a cross-sectional view of some embodiments corresponding to act in block S126.

At block S127, a plurality of third epitaxial layers are epitaxially grown on the second semiconductor layers and the fifth semiconductor layers. FIGS. 27A and 27B illustrate a schematic view and a cross-sectional view of some embodiments corresponding to act in block S127.

At block S128, a plurality of fourth epitaxial layers are formed on the third epitaxial layers, and a plurality of fifth epitaxial layers are formed on the fourth epitaxial layers. FIGS. 28A and 28B illustrate a schematic view and a cross-sectional view of some embodiments corresponding to act in block S128.

At block S129, the second patterned mask is removed. FIG. 29 illustrates a schematic view of some embodiments corresponding to act in block S129.

At block S130, a contact etching stop layer (CESL) and a first interlayer dielectric layer are formed over the substrate. FIG. 30 illustrates a schematic view of some embodiments corresponding to act in block S130.

At block S131, a plurality of isolation plugs are formed in the dummy gate structures, respectively. FIGS. 31A and 31B illustrate a schematic view and a cross-sectional view of some embodiments corresponding to act in block S131.

At block S132, the dummy gate structures are replaced with metal gate structures. FIGS. 32A, 32B, 32C, and 32D illustrate a schematic view and cross-sectional views of some embodiments corresponding to act in block S132.

At block S133, the metal gate structures and are etched back. FIG. 33 illustrates a schematic view of some embodiments corresponding to act in block S133.

At block S134, a plurality of metal layers are formed respectively on the metal gate structures via a bottom-up approach. FIG. 34 illustrates a schematic view of some embodiments corresponding to act in block S134.

At block S135, a second interlayer dielectric (ILD) layer is formed over the substrate. FIG. 35 illustrates a schematic view of some embodiments corresponding to act in block S135.

At block S136, the second ILD layer is patterned to form a plurality of openings that expose the second and fifth epitaxy structures, and a plurality of silicides are formed on the second and fifth epitaxy structures. FIGS. 36A, 36B, and 36C illustrate a schematic view and cross-sectional views of some embodiments corresponding to act in block S136.

At block S137, a plurality of source/drain contacts are formed in the openings. FIGS. 37A, 37B, and 37C illustrate a schematic view and cross-sectional views of some embodiments corresponding to act in block S137.

Based on the above discussion, it can be seen that the present disclosure offers advantages. It is understood, however, that other embodiments may offer additional advantages, and not all advantages are necessarily disclosed herein, and that no particular advantages is required for all embodiments. One advantage is that a first recess is formed deeper than a bottommost semiconductor layer of a semiconductor stack, which will result in relative straight sidewalls of the recess. Accordingly, during selectively etching first semiconductor layers of the semiconductor stack, the self-formed second recesses between two remaining second semiconductor layers may have uniform widths, which in turn will result in the inner spacers, which are formed in the recesses in later steps, have uniform widths. Another advantage is that a dielectric layer is formed in the bottom of the first recess, and the dielectric layer can act as an isolation layer to prevent punch-through effect between two adjacent epitaxy structures. Yet another advantage is that a semiconductor layer is formed in the dielectric layer and act as a seed layer for growing epitaxy structure, such that the epitaxy structure can start to grow from the bottom of the first recess, which will result in a void-free epitaxy structure, and improve the quality of the epitaxy structure.

In some embodiments of the present disclosure, a method includes forming a plurality of first semiconductor layers and a plurality of second semiconductor layers in an alternate manner over a substrate; patterning the first and second semiconductor layers and the substrate to form a fin structure, in which the fin structure includes a base portion protruding from the substrate and remaining portions of the first and second semiconductor layers; etching the fin structure to form a first recess extending through the remaining portions of the first and second semiconductor layers and into the base portion; epitaxially growing a first epitaxy layer in the first recess; epitaxially growing a second epitaxy layer over the first epitaxy layer; oxidizing the first epitaxy layer, wherein the second epitaxy layer remains unoxidized after the first epitaxy layer is oxidized; and after oxidizing the first epitaxy layer, forming a source/drain epitaxy structure on the second epitaxy layer.

In some embodiments of the present disclosure, a method includes etching a substrate to form a protrusion portion over a substrate; forming a gate structure crossing the protrusion portion; forming gate spacers on opposite sidewalls of the gate structure; etching portions of the protrusion portion exposed by the gate structure to form recesses on opposite sides of the gate structure; forming a protective liner covering outer sidewalls of the gate spacers, wherein surfaces of the recesses are exposed by the protective liner; growing a first epitaxy layer from surfaces of the surfaces of the recesses exposed by the protective liner; removing the protective liner; and after removing the protective liner, forming source/drain epitaxy structures over the first epitaxy layers, respectively.

In some embodiments of the present disclosure, a method includes forming a gate structure over the substrate; forming a dielectric layer in the substrate; forming a semiconductor layer over the isolation layer, the semiconductor layer comprising a top surface, sidewalls, and a bottom surface, wherein the dielectric layer covers the sidewalls and the bottom surface of the semiconductor layer, and the dielectric structure separates the semiconductor layer from the substrate; and forming a source/drain epitaxy structure over the isolation layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a plurality of first semiconductor layers and a plurality of second semiconductor layers in an alternate manner over a substrate;
   patterning the first and second semiconductor layers and the substrate to form a fin structure, wherein the fin structure comprises a base portion protruding from the substrate and remaining portions of the first and second semiconductor layers;
   etching the fin structure to form a first recess extending through the remaining portions of the first and second semiconductor layers and into the base portion;
   epitaxially growing a first epitaxy layer in the first recess;
   epitaxially growing a second epitaxy layer over the first epitaxy layer;
   oxidizing the first epitaxy layer, wherein the second epitaxy layer remains unoxidized after the first epitaxy layer is oxidized; and
   after oxidizing the first epitaxy layer, forming a source/drain epitaxy structure on the second epitaxy layer.

2. The method of claim 1, wherein the second epitaxy layer is epitaxially grown on only a partial region of the first epitaxy layer.

3. The method of claim 1, further comprising forming a protective liner to cover end surfaces of the second semiconductor layers prior to epitaxially growing the first epitaxy layer.

4. The method of claim 3, wherein forming the protective liner comprises:
   depositing a dielectric material conformal to the first recess; and
   etching the dielectric material to expose the base portion of the fin structure.

5. The method of claim 3, further comprising removing the protective liner to expose the end surfaces of the second semiconductor layers prior to forming the source/drain epitaxy structure.

6. The method of claim 1, wherein the first epitaxy layer and the second epitaxy layer are made of different materials.

7. The method of claim 1, wherein forming the source/drain epitaxy structure on the second epitaxy layer comprises:
   forming a first source/drain epitaxy layer, wherein the first source/drain epitaxy layer has a higher growing rate on the second epitaxy layer than on the oxidized first epitaxy layer; and
   forming a second source/drain epitaxy layer over the first source/drain epitaxy layer.

8. The method of claim 7, wherein the second source/drain epitaxy layer is in contact with the oxidized first epitaxy layer.

9. A method, comprising:
   etching a substrate to form a protrusion portion over the substrate;
   forming a gate structure crossing the protrusion portion;
   forming gate spacers on opposite sidewalls of the gate structure;
   etching portions of the protrusion portion exposed by the gate structure to form recesses on opposite sides of the gate structure;
   forming a protective liner covering outer sidewalls of the gate spacers, wherein surfaces of the recesses are exposed by the protective liner;
   growing first epitaxy layers from the surfaces of the recesses exposed by the protective liner;
   removing the protective liner; and
   after removing the protective liner, forming source/drain epitaxy structures over the first epitaxy layers, respectively.

10. The method of claim 9, further comprising:
    oxidizing the first epitaxy layers prior to removing the protective liner.

11. The method of claim 10, further comprising forming second epitaxy layers over the first epitaxy layers prior to oxidizing the first epitaxy layers.

12. The method of claim 11, wherein a germanium concentration of the first epitaxy layers is higher than a germanium concentration of the second epitaxy layers.

13. The method of claim 9, wherein forming the protective liner comprises:
    depositing a dielectric material conformal to the recesses and the gate spacers; and
    etching the dielectric material to expose the surfaces of the recesses.

14. The method of claim 9, further comprising forming semiconductor channel layers over the substrate, wherein the protective liner also covers outer sidewalls of the semiconductor channel layers.

15. A method, comprising:
    forming a gate structure over a substrate;
    forming a first semiconductor layer in the substrate;
    forming a second semiconductor layer in the substrate and over the first semiconductor layer;
    oxidizing the first semiconductor layer to transfer the first semiconductor layer into a dielectric layer, the second semiconductor layer comprising a top surface, sidewalls, and a bottom surface, wherein the dielectric layer covers the sidewalls and the bottom surface of the second semiconductor layer, and the dielectric layer separates the second semiconductor layer from the substrate; and
    forming a source/drain epitaxy structure over the dielectric layer and the second semiconductor layer.

16. The method of claim 15, further comprising forming semiconductor channel layers vertically stacked over the substrate, wherein the gate structure wraps around each of the semiconductor channel layers.

17. The method of claim 15, wherein the source/drain epitaxy structure is in contact with the dielectric layer.

18. The method of claim 15, wherein the source/drain epitaxy structure is in contact with the second semiconductor layer.

19. The method of claim 15, wherein a top surface of the second semiconductor layer is lower than a bottom surface of the gate structure in a cross-sectional view.

20. The method of claim 15, wherein forming the source/drain epitaxy structure is performed such that the source/drain epitaxy structure is epitaxially grown from the top surface of the second semiconductor layer.

* * * * *